United States Patent
Lee et al.

(10) Patent No.: US 11,685,154 B2
(45) Date of Patent: Jun. 27, 2023

(54) INKJET PRINTING DEVICE, DIPOLE ALIGNING METHOD, AND DISPLAY DEVICE MANUFACTURING METHOD

(71) Applicant: Samsung Display Co., LTD., Yongin-si (KR)

(72) Inventors: Byung Chui Lee, Hwaseong-si (KR); Heung Cheol Jeong, Hwaseong-si (KR); Myung Soo Huh, Suwon-si (KR); Min Soo Kim, Suwon-si (KR); Jae Ha Lim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 166 days.

(21) Appl. No.: 17/420,438

(22) PCT Filed: Mar. 13, 2019

(86) PCT No.: PCT/KR2019/002867
§ 371 (c)(1),
(2) Date: Jul. 2, 2021

(87) PCT Pub. No.: WO2020/141652
PCT Pub. Date: Jul. 9, 2020

(65) Prior Publication Data
US 2022/0080725 A1 Mar. 17, 2022

(30) Foreign Application Priority Data

Jan. 2, 2019 (KR) .................. 10-2019-0000203

(51) Int. Cl.
*B41J 2/045* (2006.01)
(52) U.S. Cl.
CPC ......... *B41J 2/04558* (2013.01); *B41J 2/0456* (2013.01); *B41J 2/04586* (2013.01)

(58) Field of Classification Search
CPC ... B41J 2/04558; B41J 2/0456; B41J 2/04586
See application file for complete search history.

(56) References Cited

U.S. PATENT DOCUMENTS

| | | | |
|---|---|---|---|
| 7,410,905 B2 | 8/2008 | Ushiyama et al. | |
| 7,968,474 B2 | 6/2011 | Martin et al. | |
| (Continued) | | | |

FOREIGN PATENT DOCUMENTS

| | | |
|---|---|---|
| CN | 1749811 | 3/2006 |
| CN | 105419482 | 3/2016 |
| (Continued) | | |

OTHER PUBLICATIONS

Chinese Office Action for Chinese Patent Application or Patent No. 201980087762.0 dated Jul. 15, 2022.
(Continued)

*Primary Examiner* — Thinh H Nguyen
(74) *Attorney, Agent, or Firm* — Kile Park Reed & Houtteman PLLC

(57) ABSTRACT

An inkjet printing device includes a stage part including a stage, an inkjet head part including at least one inkjet head that disposes an ink on the stage, the ink including dipoles and a solvent having the dipoles, a heat treatment device that removes the solvent, a first sensing part that measures a position of the ink disposed on the stage, a second sensing part that measures a position of the inkjet head, and a third sensing part that measures a position of each of the dipoles disposed on the stage. A dipole aligning method includes disposing an ink on a substrate, the ink including dipoles and a solvent having the dipoles, generating an electric field on the substrate and disposing the dipoles on the substrate by the electric field, removing the solvent, and measuring a position of each of the dipoles disposed on the substrate.

20 Claims, 34 Drawing Sheets

(56) References Cited

U.S. PATENT DOCUMENTS

| | | |
|---|---|---|
| 8,252,164 B2 | 8/2012 | Martin et al. |
| 9,572,810 B2 | 2/2017 | Lange et al. |
| 9,783,695 B2 | 10/2017 | Barbet et al. |
| 9,867,849 B2 | 1/2018 | Lange et al. |
| 10,174,249 B2 | 1/2019 | Kim et al. |
| 10,266,715 B2 | 4/2019 | Barbet et al. |
| 11,202,798 B2 | 12/2021 | Lange et al. |
| 2003/0108804 A1 | 6/2003 | Cheng et al. |
| 2004/0151978 A1 | 8/2004 | Huang |
| 2005/0146547 A1* | 7/2005 | Yeh ............... B41J 2/04558 347/19 |
| 2006/0138438 A1 | 6/2006 | Katagami |
| 2008/0272388 A1 | 11/2008 | Ushiyama et al. |
| 2012/0212750 A1 | 8/2012 | Engelhardt et al. |
| 2015/0138626 A1 | 5/2015 | Kwon et al. |
| 2018/0083230 A1* | 3/2018 | Harjee ............... H10K 71/191 |
| 2019/0198591 A1 | 6/2019 | Dai |
| 2022/0079978 A1 | 3/2022 | Lange et al. |

FOREIGN PATENT DOCUMENTS

| | | |
|---|---|---|
| CN | 105602227 | 5/2016 |
| CN | 107331788 | 11/2017 |
| CN | 107670044 | 2/2018 |
| JP | 2002-123101 | 4/2002 |
| JP | 2003-185829 | 7/2003 |
| JP | 2005-013984 | 1/2005 |
| JP | 4344270 | 10/2009 |
| JP | 2010-36548 | 2/2010 |
| JP | 2010-506744 | 3/2010 |
| KR | 10-2006-0034870 | 4/2006 |
| KR | 10-2012-0070451 | 6/2012 |
| KR | 10-1812334 | 1/2018 |
| WO | 2018-002648 | 1/2018 |

OTHER PUBLICATIONS

International Search Report, with English translation, corresponding to International Application No. PCT/KR201 9/002867 dated Sep. 27, 2019.

Written Opinion, with English translation, corresponding to International Application No. PCT/KR2019/002867, dated Sep. 27, 2019.

Extended European Search Report corresponding to European Application No./Patent No. 19907278.6 dated Sep. 9, 2022.

* cited by examiner

[FIG. 6]
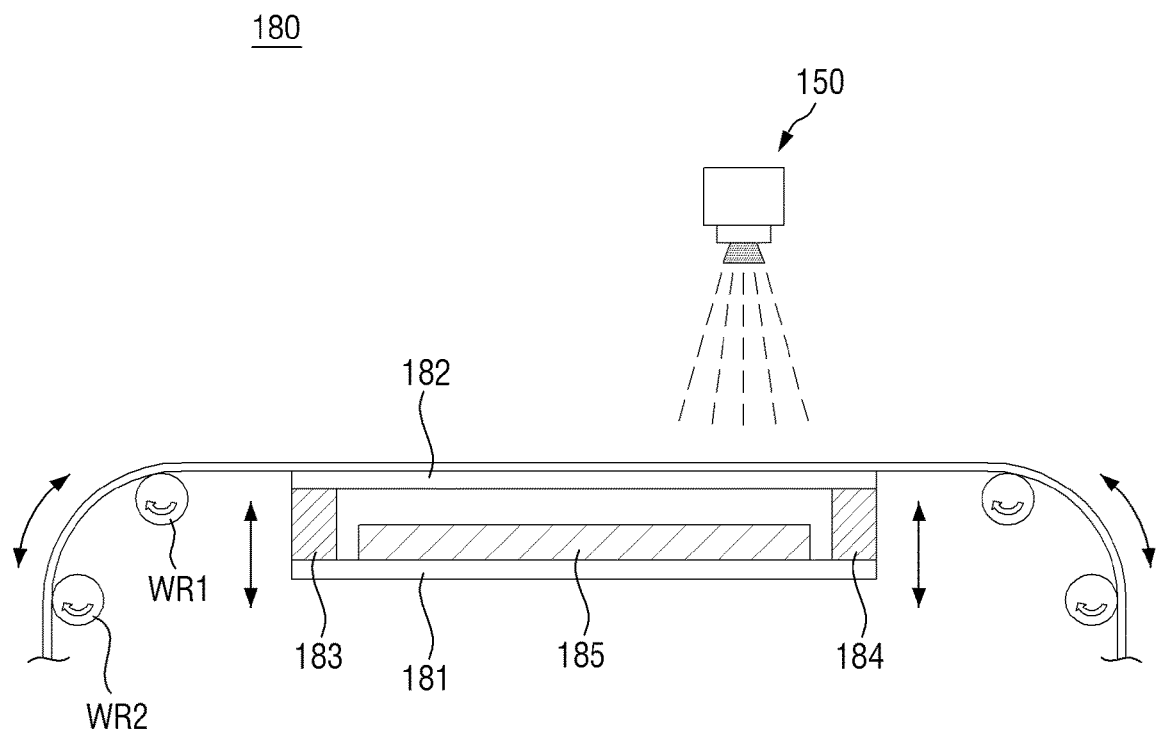

【FIG. 7】
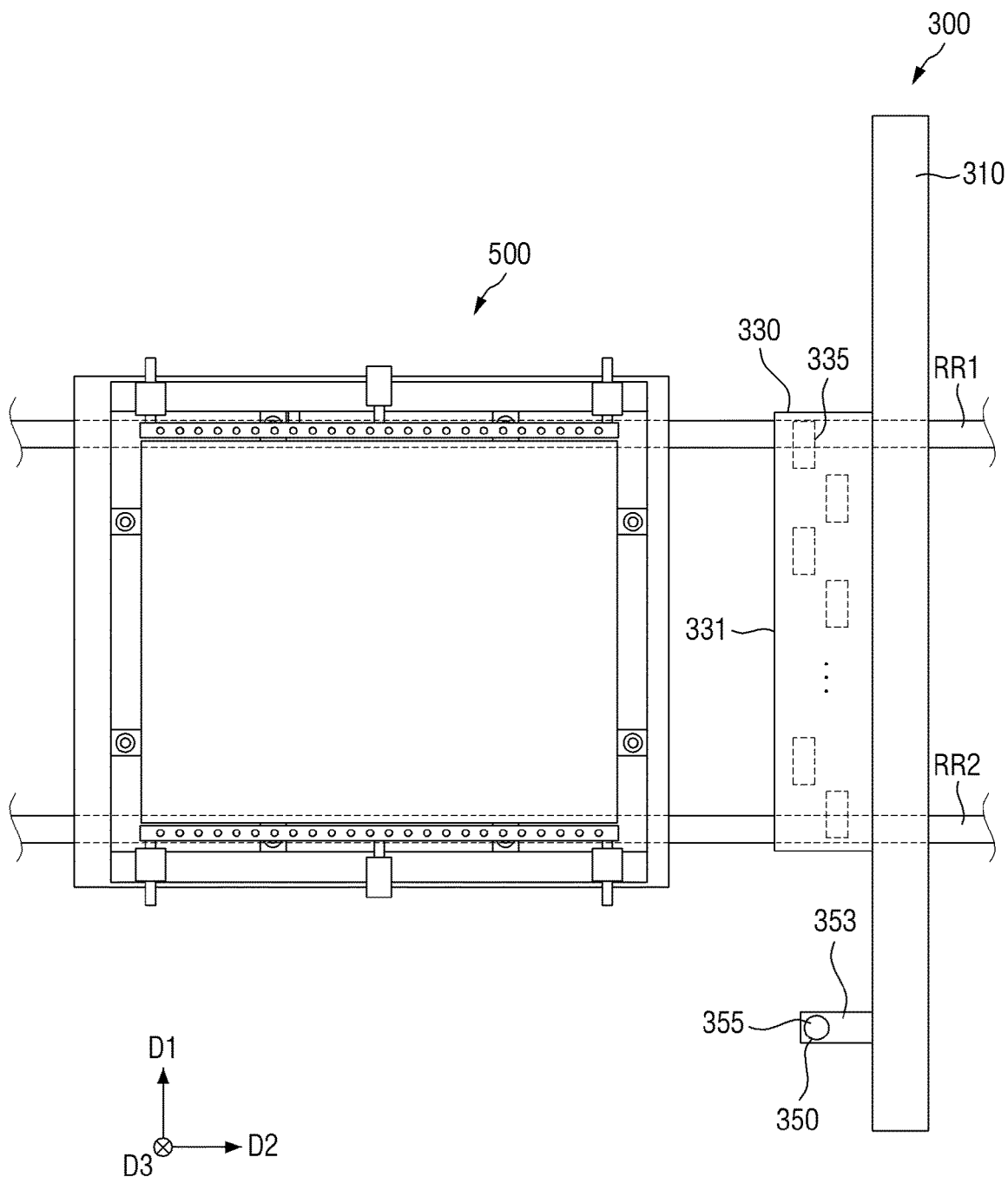

[FIG. 8]
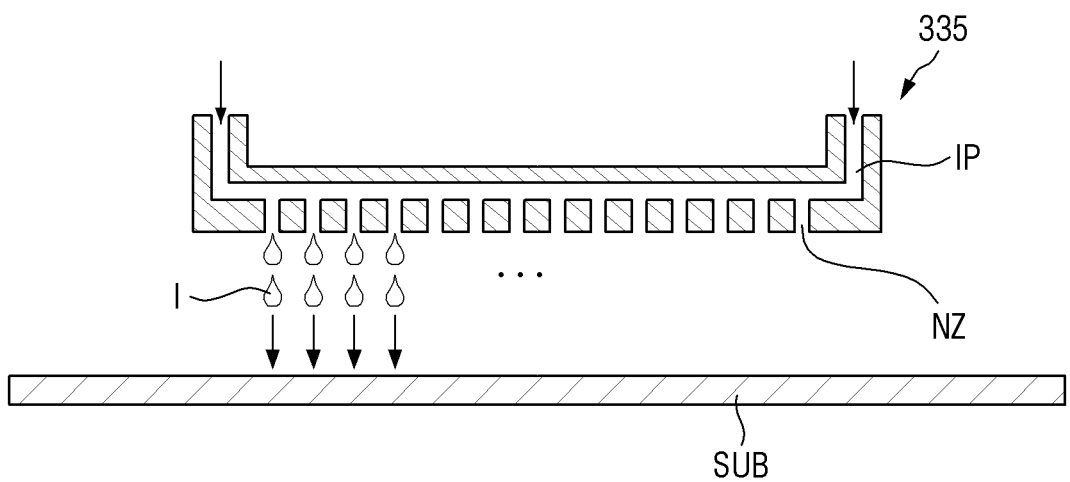

[FIG. 9]
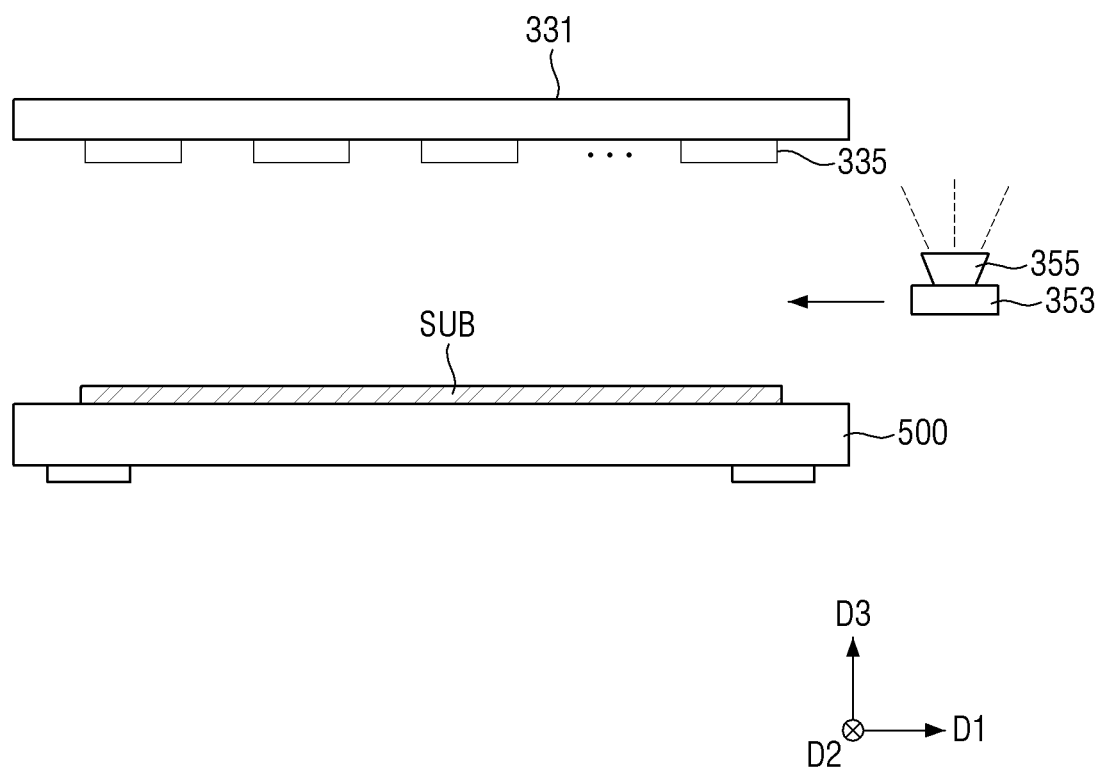

[FIG. 10]
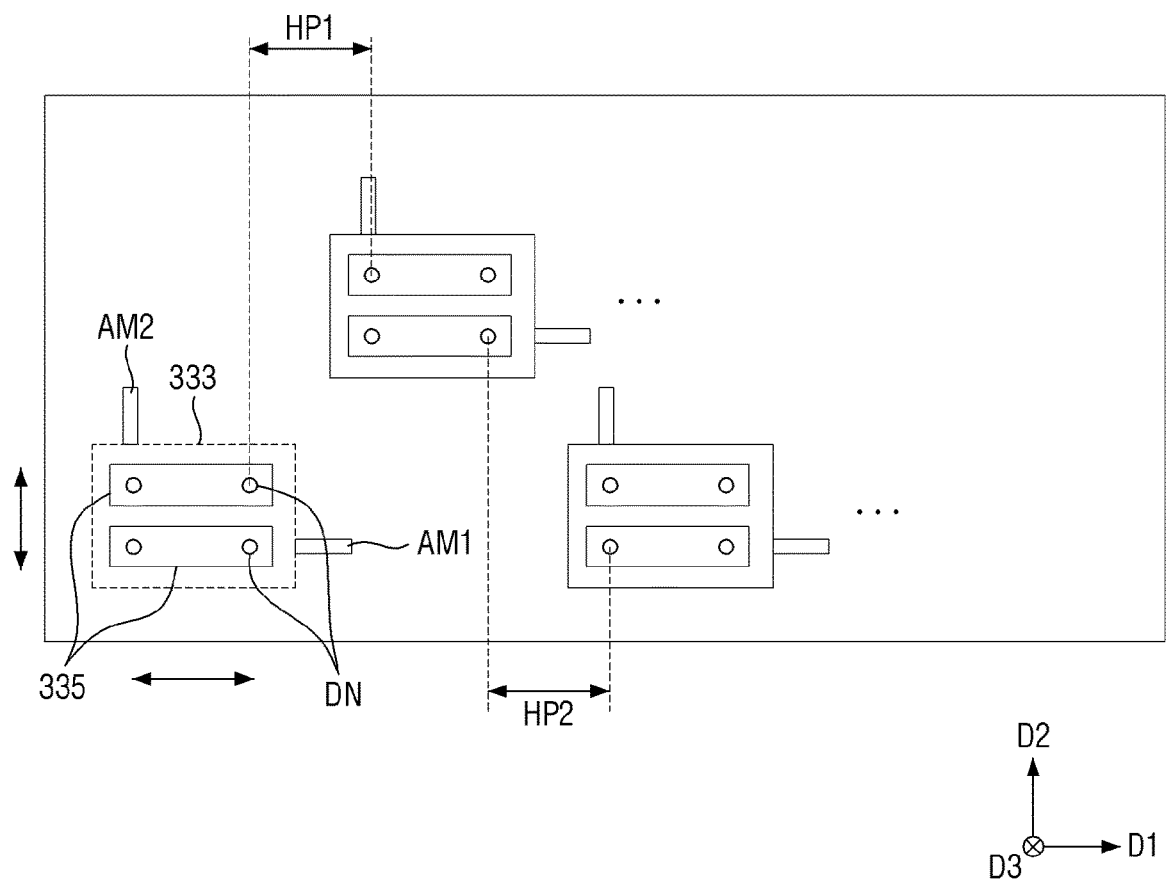

[FIG. 11]
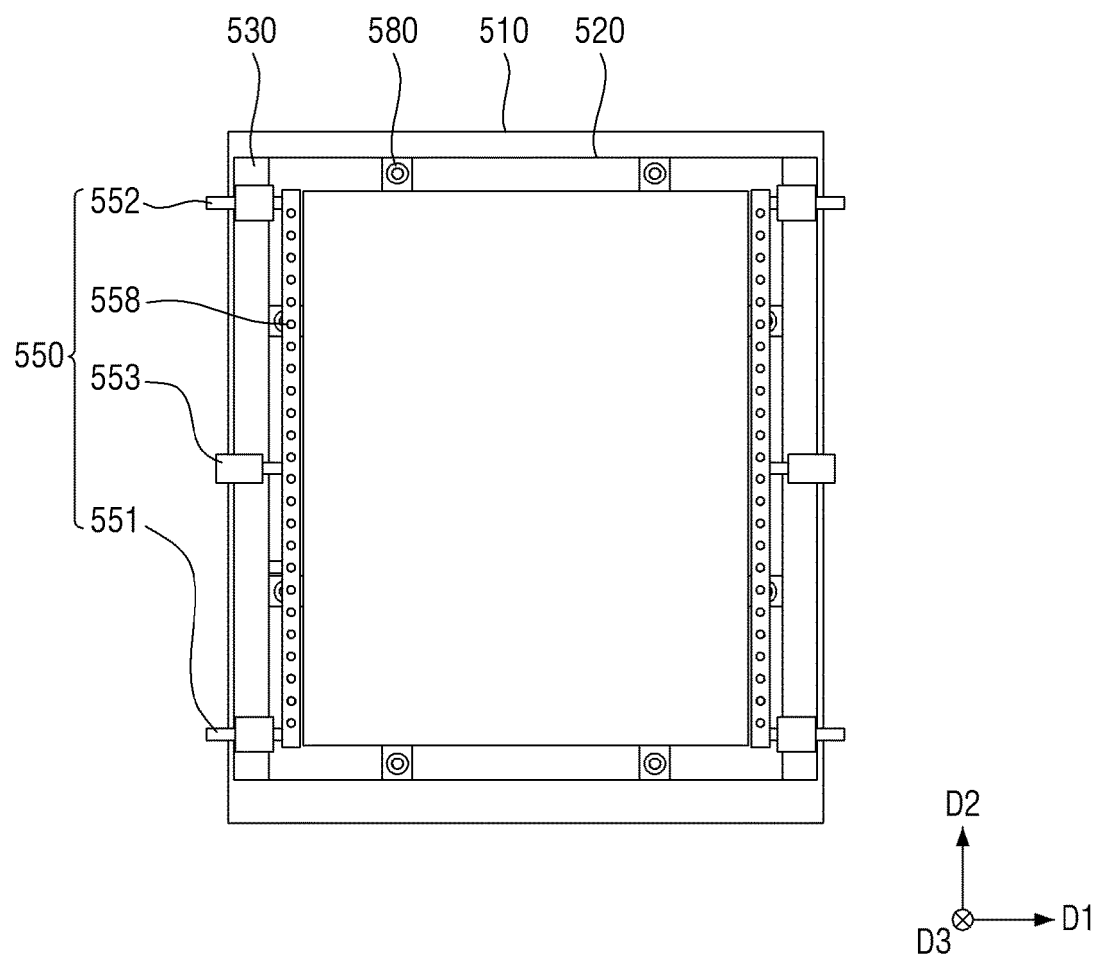

[FIG. 12]
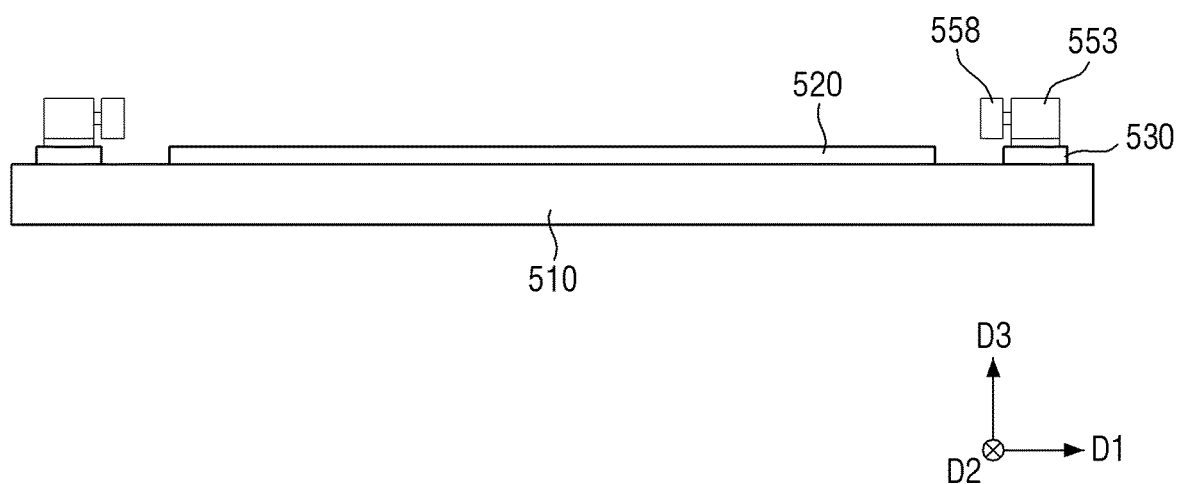

[FIG. 13]
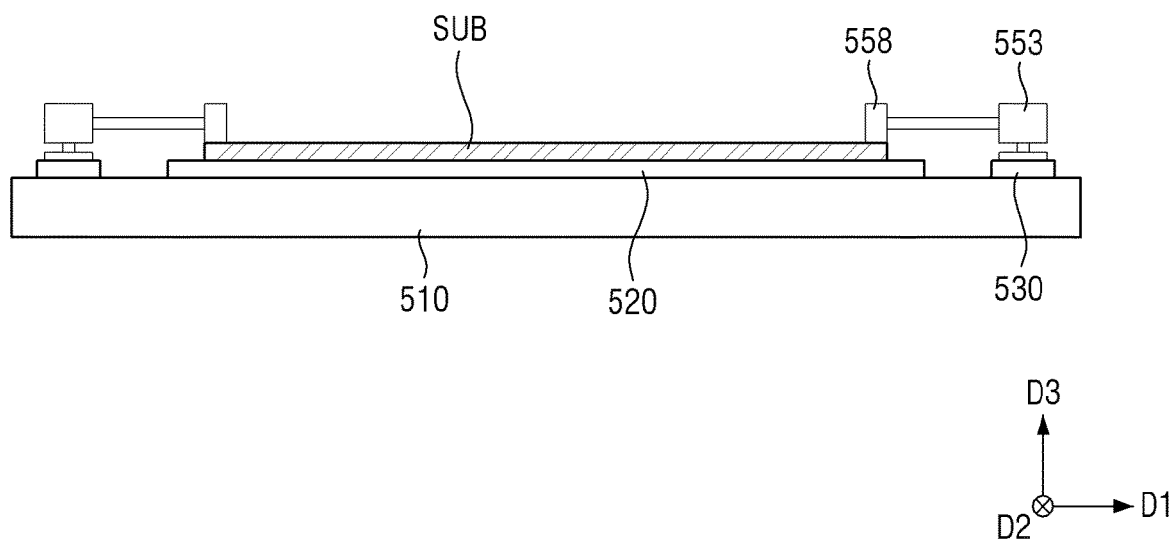

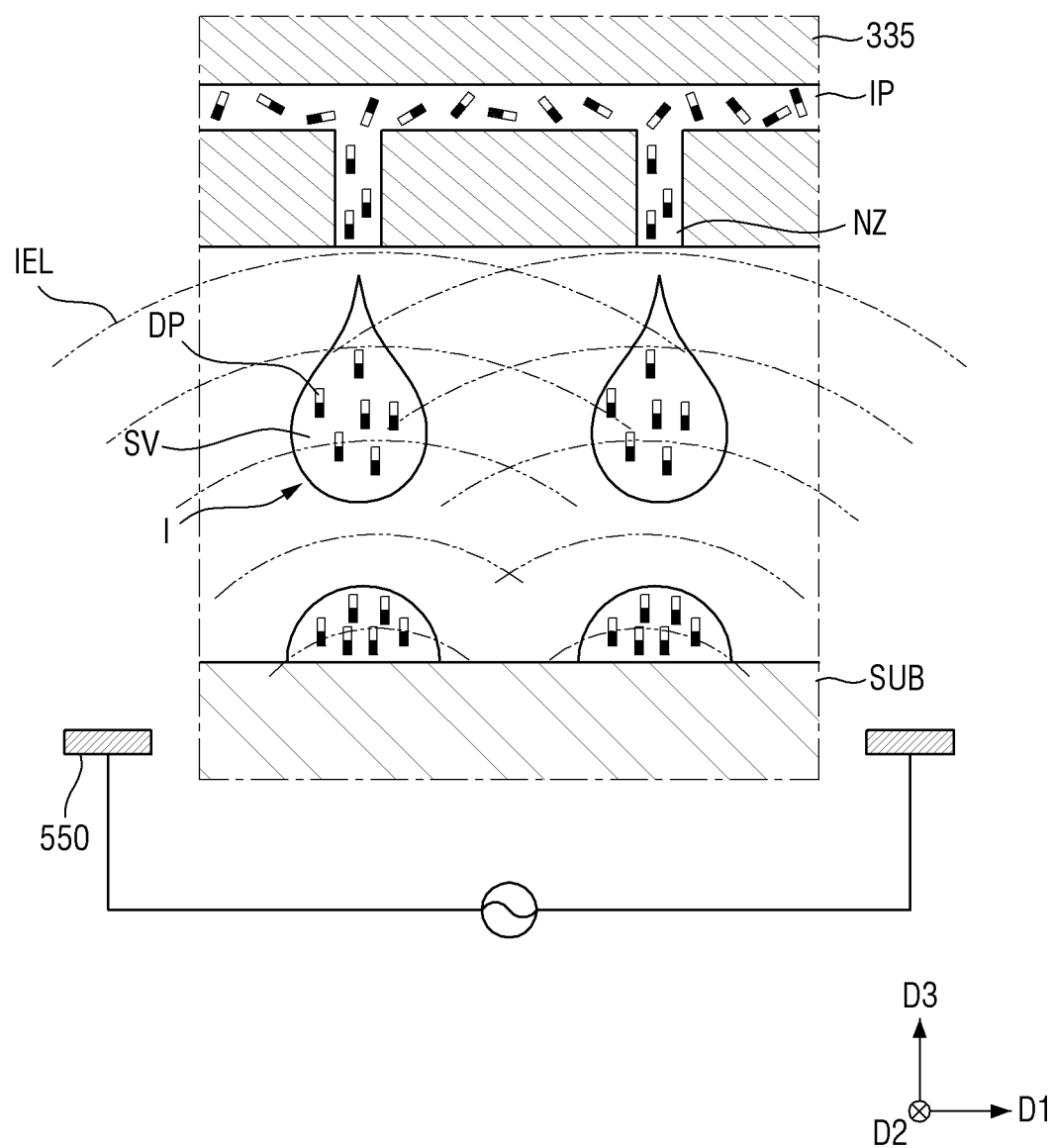
[FIG. 14]

[FIG. 15]
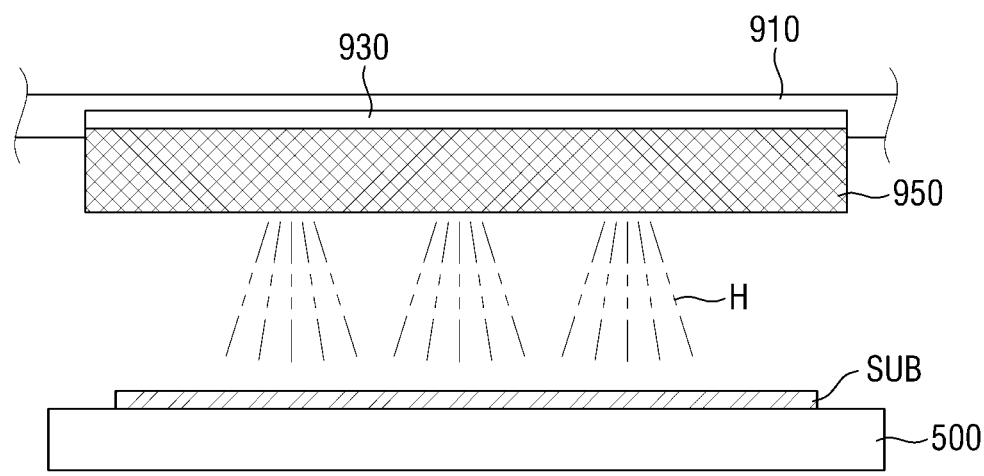
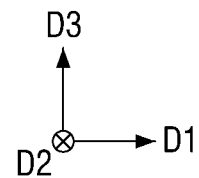

[FIG. 16]
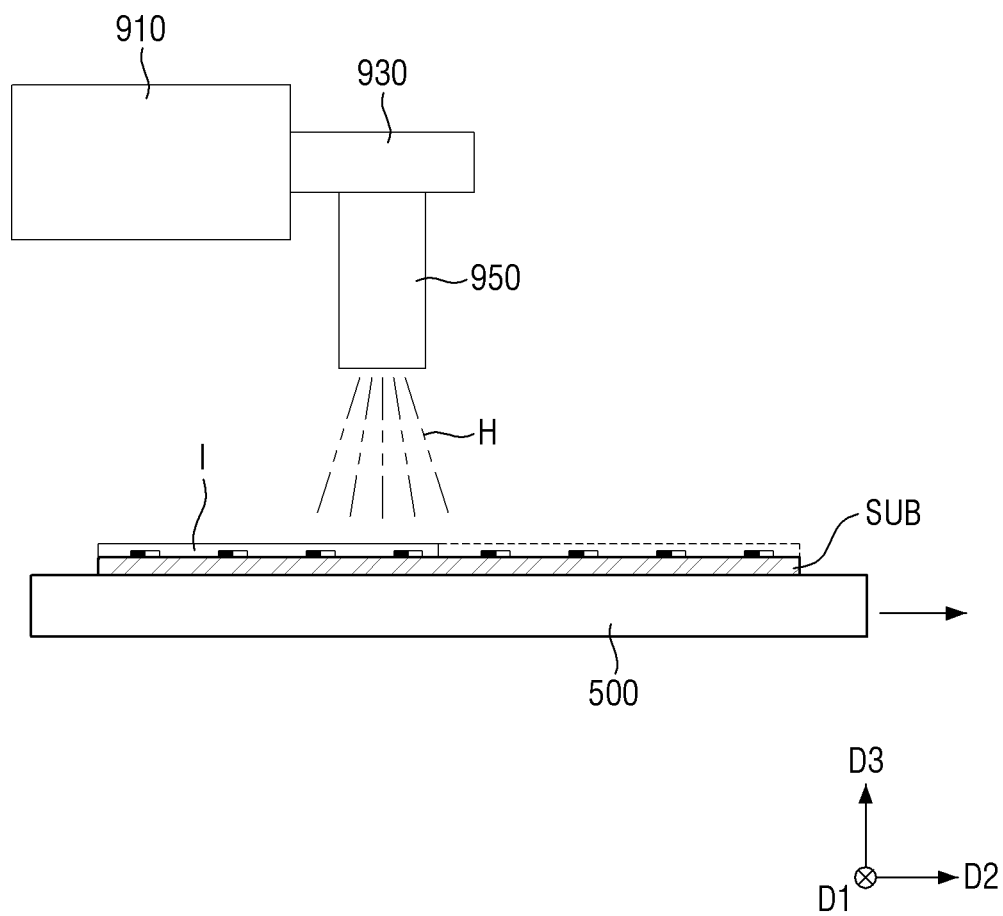

【FIG. 17】
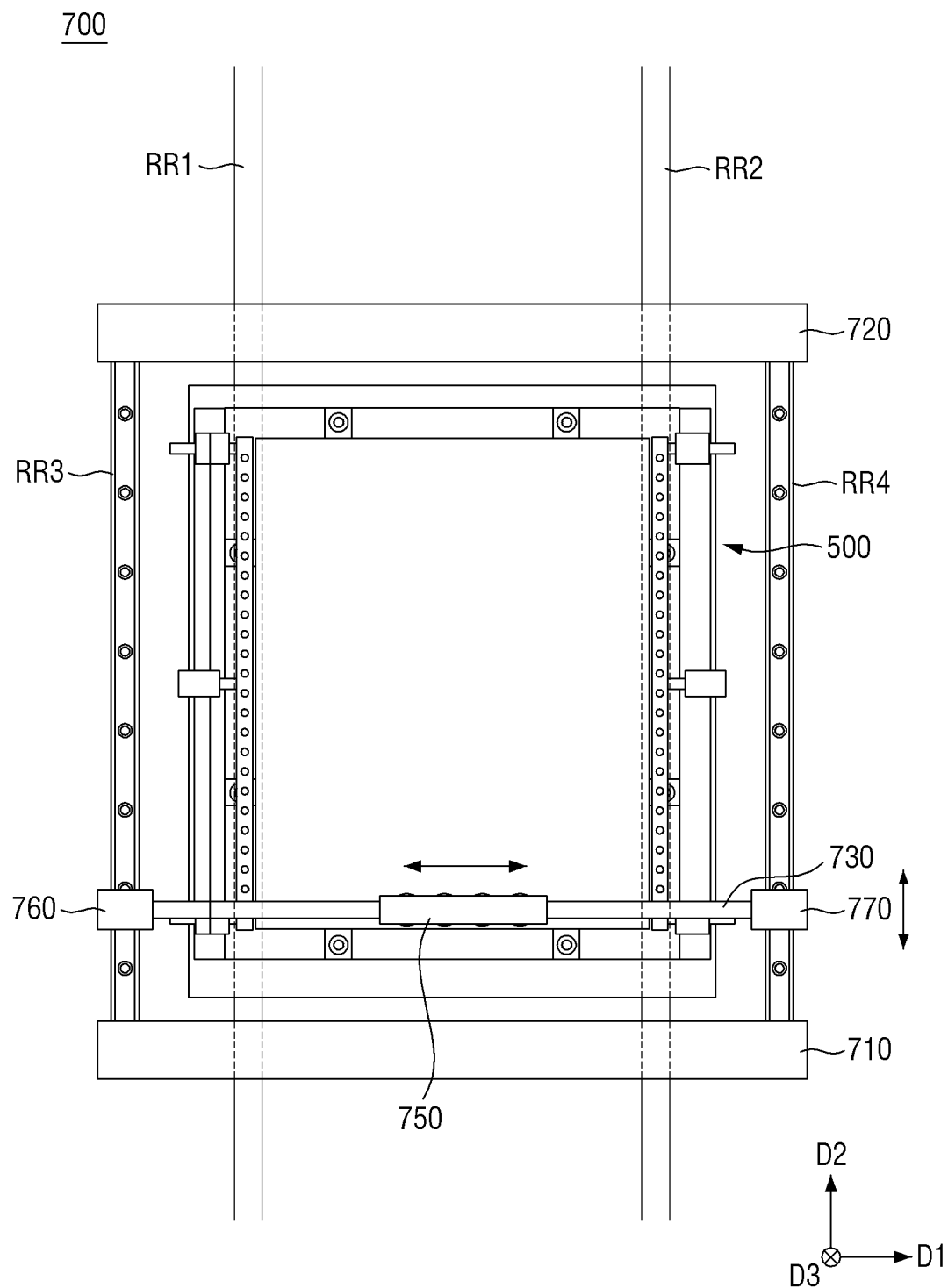

[FIG. 18]
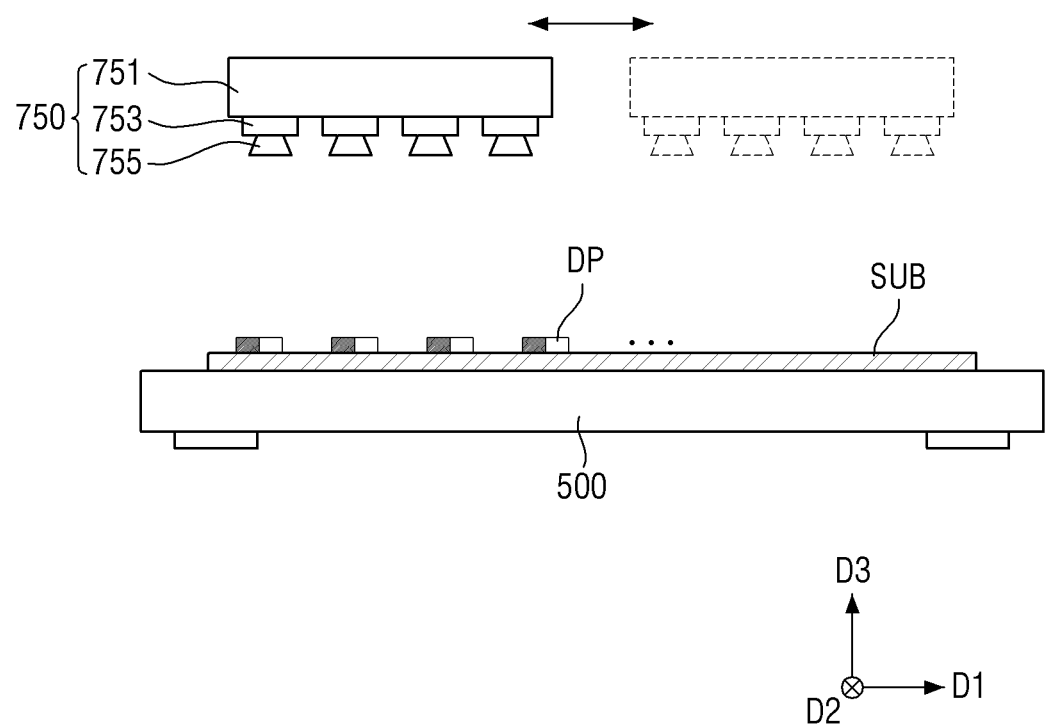

[FIG. 19]
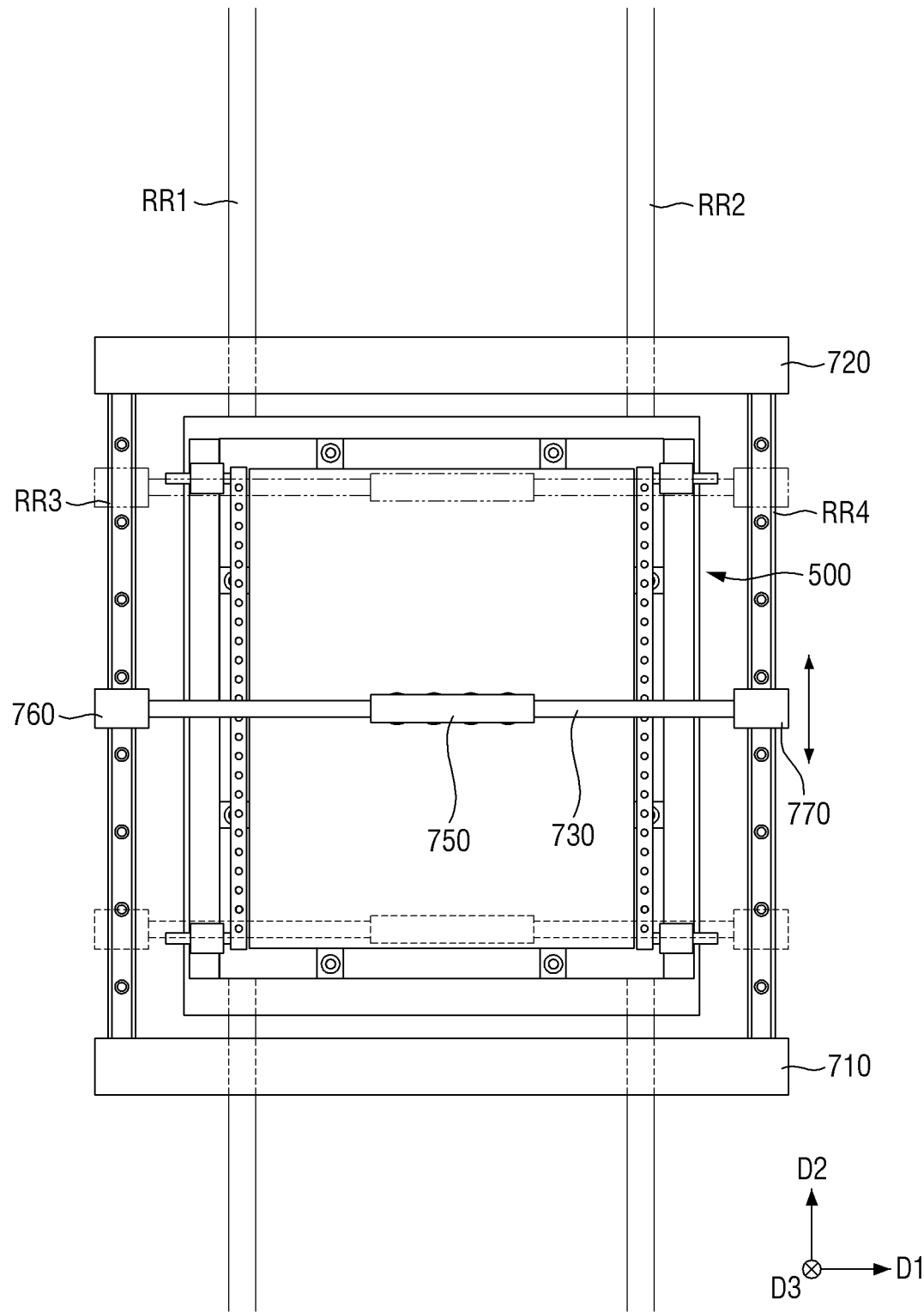

INKJET PRINTING DEVICE, DIPOLE ALIGNING METHOD, AND DISPLAY DEVICE MANUFACTURING METHOD

CROSS-REFERENCE TO RELATED APPLICATION(S)

This application is a national entry of International Application No. PCT/KR2019/002867, filed on Mar. 13, 2019, which claims under 35 U.S.C. 119(a) and 365(b) priority to and benefits of Korean Patent Application No. 10-2019-0000203, filed on Jan. 2, 2019 in the Korean Intellectual Property Office (KIPO), the entire contents of all of which are incorporated herein by reference.

BACKGROUND

1. Technical Field

The disclosure relates to an inkjet printing device, a dipole aligning method, and a display device manufacturing method.

2. Discussion of the Related Art

The importance of display devices is increasing with the development of multimedia. Accordingly, various types of display devices are in use, including, e.g., organic light-emitting display (OLED) devices and liquid crystal display (LCD) devices.

A display device is a device that may display an image and includes a display panel such as an OLED panel or an LCD panel. Among these, a display device may include light-emitting elements as a light-emitting display panel. For example, a light-emitting diode (LED) may include an organic LED that uses an organic material as a fluorescent material, an inorganic LED that uses an inorganic material as a fluorescent material, or the like.

An inorganic LED using an inorganic semiconductor as a fluorescent material has durability even in a high-temperature environment and may have an advantage of high efficiency of blue light as compared with an organic LED. Further, even with respect to a manufacturing process that has been pointed out as a limitation of the conventional inorganic LED element, a transfer method using a dielectrophoresis (DEP) method has been developed. Thus, continuous research has been carried out on the inorganic LED that may be superior in terms of durability and efficiency compared to the organic LED.

An inkjet printing device may be used to transfer an inorganic LED element using the DEP method or to form an organic layer included in a display device. The transfer of the inorganic LED element or the formation of the organic layer may also be performed by printing an arbitrary ink or solution by inkjet printing and performing a post-treatment process. In the inkjet printing device, an ink or solution may be supplied to an inkjet head, and the inkjet head may perform a process of spraying the ink or solution onto a substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is directed to providing an inkjet printing device capable of performing ink spraying, dipole alignment, and dipole alignment inspection in an integrated process.

The disclosure is also directed to providing an inkjet printing device capable of adjusting errors in the amount of ink, a dipole aligned state, and the like, which occur during a printing process, while performing the process.

It should be noted that aspects of the disclosure are not limited to the above-described aspects, and other aspects of the disclosure will be apparent to those skilled in the art from the following descriptions.

According to an embodiment of the present disclosure, an inkjet printing device may include a stage part including a stage, an inkjet head part including at least one inkjet head that disposes an ink on the stage, the ink including dipoles and a solvent in which the dipoles may be dispersed, a heat treatment device that removes the solvent disposed on the stage, a first sensing part that measures a position of the ink disposed on the stage, a second sensing part that measures a position of the inkjet head, and a third sensing part that measures a position of each of the dipoles disposed on the stage.

The inkjet head may include a first inkjet head and a second inkjet head that are spaced apart from each other, and the inkjet head part may include at least one head driving part that moves the first inkjet head and the second inkjet head.

The at least one head driving parts may include a first head driving part that moves the inkjet head in a first direction and a second head driving part that moves the inkjet head in a second direction perpendicular to the first direction.

The first sensing part may measure a position of a first ink disposed on the stage from the first inkjet head and a position of a second ink disposed on the stage from the second inkjet head.

The first sensing part may measure a diameter of each of the first ink and the second ink.

The third sensing part may measure an angle between a direction in which a dipole extends and the first direction.

The third sensing part may measure a number of dipoles which may be disposed in a unit area of the stage.

The inkjet head part, the third sensing part, and the heat treatment device may be arranged in a third direction, and the stage part may move in the third direction.

The inkjet heads may be spaced apart from each other in a fourth direction that may be perpendicular to the third direction, the first sensing part may include a first moving part that moves in the fourth direction, and the second sensing part may include a second moving part that moves in the fourth direction.

The third sensing part may include at least one third moving part that moves in the third direction and at least one fourth moving part that moves in the fourth direction.

The stage part may further include a probe part that generates an electric field on the stage.

According to an embodiment of the present disclosure, a dipole aligning method may include disposing an ink on a target substrate, the ink including dipoles and a solvent in which the dipoles are dispersed, generating an electric field on the target substrate and disposing the dipoles on the target substrate by the electric field, removing the solvent, and measuring a position of each of the dipoles disposed on the target substrate.

The ink may be disposed from an inkjet head, and the method may further comprise aligning a position of the ink disposed on the target substrate before disposing the ink.

The inkjet head may include a first head and a second head, and the aligning of the position of the disposed ink may include measuring a position of each of the ink disposed from the first head and the ink disposed from the second head, and aligning a position of each of the first head and the second head using the measured positions of the ink.

The target substrate may include a first electrode and a second electrode that extend in a first direction, and the measuring of the position of each of the dipoles may include measuring an orientation direction of a dipole, and measuring an angle between the orientation direction of the dipole and the first direction.

The measuring of the position of each of the dipoles may further include measuring a number of dipoles which may be disposed in a unit area of the target substrate.

The method may further comprise setting a reference value for the position of each of the dipoles disposed on the target substrate, and comparing the angle and the number of dipoles per unit area measured in the measuring of the position of each of the dipoles, with the reference value.

According to an embodiment of the present disclosure, a method of manufacturing a display device may include disposing an ink, which includes light-emitting elements and a solvent in which the light-emitting elements may be dispersed, on a target substrate on which a first electrode and a second electrode may be formed, disposing the light-emitting elements on the first electrode and the second electrode, removing the solvent disposed on the target substrate, and measuring a position of each of the light-emitting elements disposed on the first electrode and the second electrode.

The first electrode and the second electrode may extend in a first direction, and the measuring of the position of each of the light-emitting elements may include measuring an angle between a direction in which a light-emitting element extends and the first direction.

The target substrate may include a plurality of pixels, the first electrode and the second electrode may be provided for each of the plurality of pixels, and the measuring of the position of each of the light-emitting elements may include measuring a number of light-emitting elements disposed in each of the plurality of pixels.

Effects of the present disclosure are not limited to the embodiments set forth herein and more diverse effects are included in this specification.

An inkjet printing device according to an embodiment may include an inkjet head device, a heat treatment device, and an alignment inspection device, and thus can spray ink, which includes dipoles, and inspect alignment of the dipoles after drying the ink in one process. Accordingly, in case that a display device may be manufactured using the inkjet printing device, the alignment of the dipoles disposed on a target substrate can be improved.

Further, an inkjet printing device may include sensing parts and thus can detect ink sprayed from an inkjet head and alignment of dipoles disposed on a target substrate during an inkjet printing process. Accordingly, errors in the amount of sprayed ink and a dipole aligned state, which occur during a printing process, can be minimized.

Effects according to the embodiments are not limited by the above embodiments, and more various effects are included in the present specification.

BRIEF DESCRIPTION OF THE DRAWINGS

FIG. 6 is a schematic cross-sectional view of a sub-stage part according to an embodiment.

FIG. 7 is a schematic plan view of an inkjet head device according to an embodiment.

FIG. 8 is a schematic view illustrating a state in which the ink is discharged from an inkjet head according to an embodiment.

FIG. 9 is a schematic view illustrating a state in which a second sensing part of the inkjet head device inspects a position of the inkjet head according to an embodiment.

FIG. 10 is a schematic plan view of an inkjet head part according to an embodiment.

FIG. 11 is a schematic plan view of a stage part according to an embodiment.

FIGS. 12 and 13 are schematic views illustrating a state of a probe part according to an embodiment.

FIG. 14 is a schematic view illustrating a state in which an electric field is formed on a target substrate by the probe part according to an embodiment.

FIG. 15 is a schematic cross-sectional view of a heat treatment device according to an embodiment.

FIG. 16 is a schematic view illustrating an operation of the heat treatment device according to an embodiment.

FIG. 17 is a schematic plan view of an alignment inspection device according to an embodiment.

FIGS. 18 and 19 are schematic views illustrating an operation of a third sensing part of the alignment inspection device according to an embodiment.

DETAILED DESCRIPTION OF THE EMBODIMENT(S)

Figure 1:
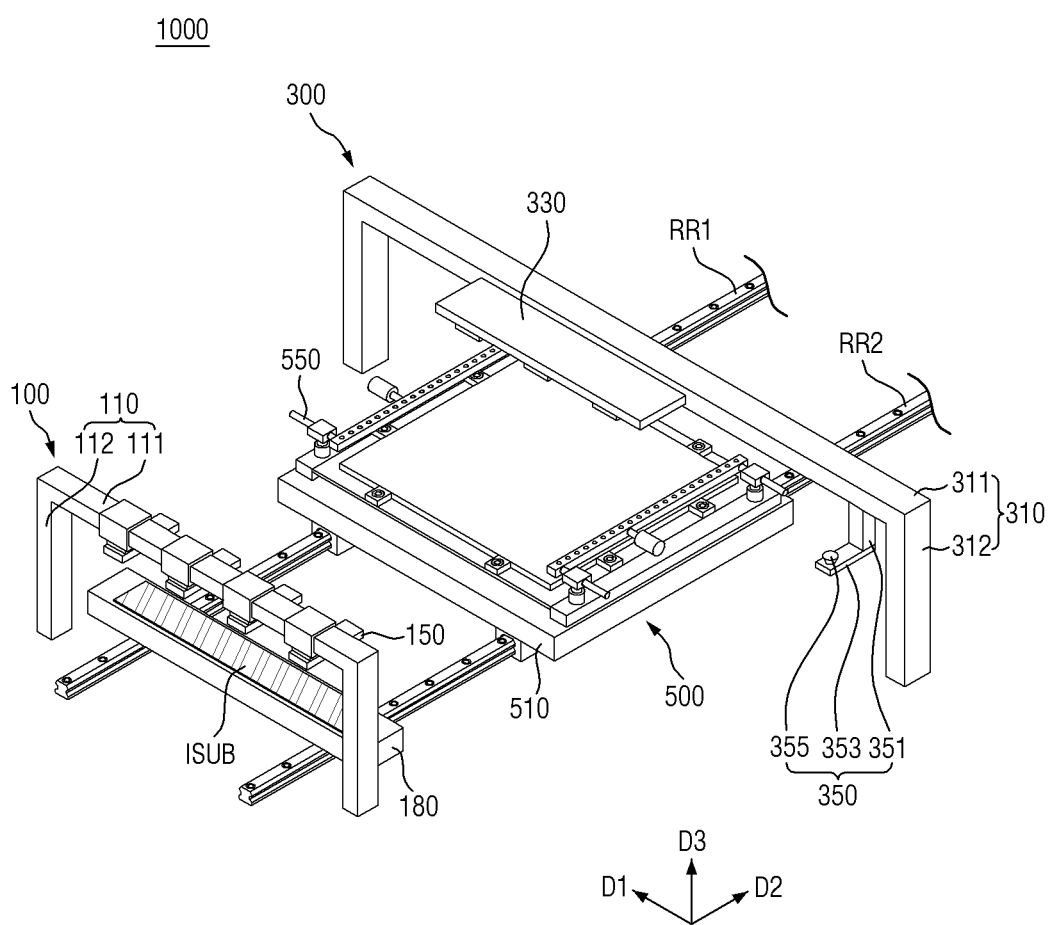
FIGS. 1 and 2 are schematic perspective views of an inkjet printing device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise. It will be understood that the terms "connected to" or "coupled to" may include a physical or electrical connection or coupling.

The term overlap may include layer, stack, face or facing, extending over, covering or partly covering or any other suitable term as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

It will be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

"About", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An inkjet printing device (1000, shown in FIG. 1) according to an embodiment may spray an ink (I, shown in FIG. 4) onto a target substrate, and may align particles, such as dipoles, dispersed in the ink I on the target substrate. Here, the inkjet printing device 1000 may include multiple inspection devices to spray the ink at a constant amount and maintain a substantially same amount of particles in the ink in each process. An inspection device may inspect the ink sprayed from the inkjet printing device 1000 and a state of the aligned particles and feedback the inspection result, thereby improving reliability of the inkjet printing device 1000.

The inkjet printing device 1000 according to an embodiment may include a discharge amount inspection device 100, an inkjet head device 300, a stage part 500, an alignment inspection device 700, and a heat treatment device 900.

Figure 2:
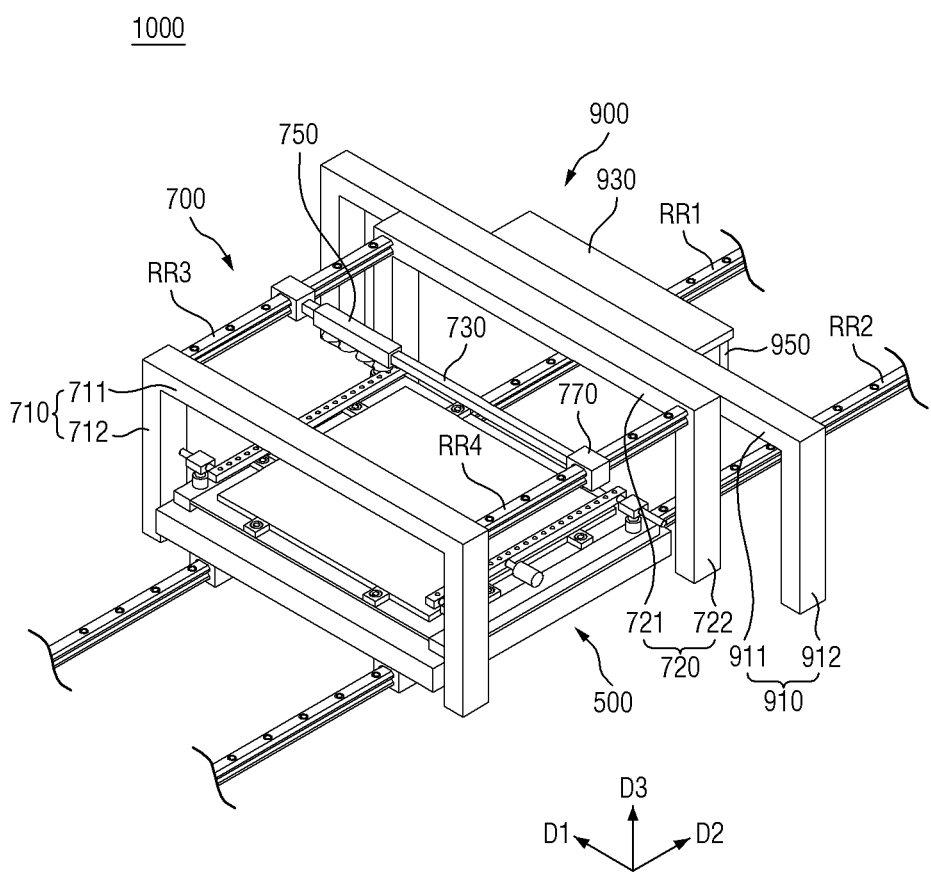

FIGS. 1 and 2 are schematic perspective views of an inkjet printing device according to an embodiment.

In the drawings, a first direction D1, a second direction D2, and a third direction D3 may be defined. The first direction D1 and the second direction D2 may be directions that may be coplanar and orthogonal to each other, and the third direction D3 may be a direction that may be perpendicular to each of the first direction D1 and the second direction D2.

FIGS. 1 and 2 are drawings for describing a configuration of an inkjet printing device 1000 according to an embodiment, and the structure and arrangement of the inkjet printing device 1000 are not limited to those illustrated in FIGS. 1 and 2. The inkjet printing device 1000 may include more members or have a structure different from those illustrated in FIGS. 1 and 2.

Referring to FIGS. 1 and 2, the inkjet printing device 1000 may include a discharge amount inspection device 100, an inkjet head device 300, a stage part 500, an alignment inspection device 700, and a heat treatment device 900. FIG. 1 illustrates the discharge amount inspection device 100, the inkjet head device 300, and stage part 500 of the inkjet printing device 1000, and FIG. 2 illustrates the stage part 500, the alignment inspection device 700, and the heat treatment device 900. FIG. 2 shows that the stage part 500 of FIG. 1 has been moved in position, and the inkjet printing device 1000 may include one stage part 500. However, embodiments are not limited thereto, and one or more stage parts 500 may be disposed in the inkjet printing device 1000.

Although shown separately in the drawings, the inkjet printing device 1000 may have a structure in which the discharge amount inspection device 100, the inkjet head device 300, the alignment inspection device 700, and the heat treatment device 900 may be sequentially arranged and connected along a same row. For example, the inkjet printing device 1000 may include a first rail RR1 and a second rail RR2 extending in one direction, for example, the second direction D2, and multiple devices may be arranged in the second direction D2 along the first and second rails RR1 and RR2. The first rail RR1 and the second rail RR2 of FIG. 1 may extend in the second direction D2 to be connected to the first rail RR1 and the second rail RR2 of FIG. 2, respectively, and the devices shown in FIGS. 1 and 2 may constitute one inkjet printing device 1000. Hereinafter, each device or component will be described in detail.

Figure 3:
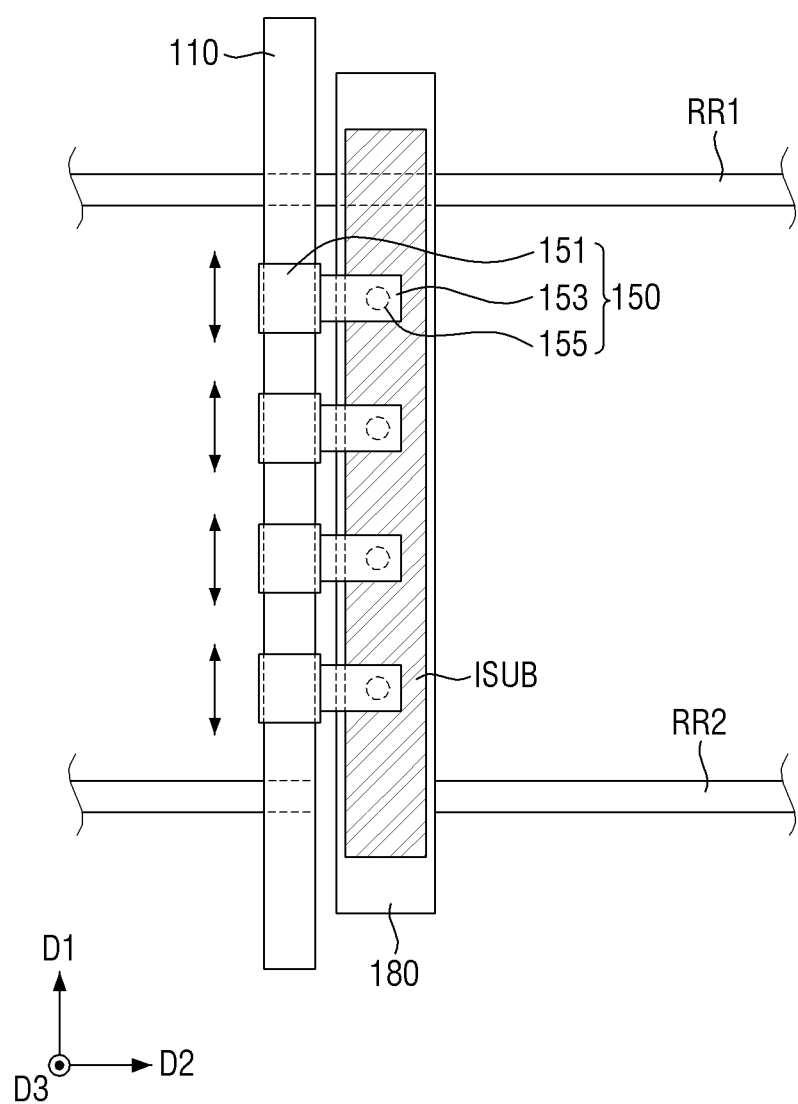
FIG. 3 is a schematic plan view of a discharge amount inspection device according to an embodiment.

FIG. 3 is a schematic plan view of the discharge amount inspection device according to an embodiment. FIG. 3 is a plan view of the discharge amount inspection device 100 when viewed in the third direction D3, for example, viewed from above.

Referring to FIGS. 1 and 3, the discharge amount inspection device 100 according to an embodiment may include a first base frame 110, a first sensing part 150, and a sub-stage part 180. The discharge amount inspection device 100 may include the first sensing part 150 and inspect the amount and dropped positions of droplets of the ink I sprayed from the inkjet printing device 1000.

In an embodiment, the ink I may include a solvent SV and dipoles DP contained in the solvent SV. In an embodiment, the ink I may be provided in the form of a solution or colloid.

For example, the solvent SV may include acetone, water, alcohol, toluene, propylene glycol (PG), propylene glycol methyl acetate (PGMA), or the like, or a combination thereof, but embodiments are not limited thereto. The dipoles DP may be included in a dispersed state in the solvent SV and may be supplied to the inkjet head device 300 so as to be discharged.

The first base frame 110 may include a first base part 111 extending in the first direction D1, and first supports 112 connected to both ends of the first base part 111 and extending in the third direction D3 to support the first base part 111. The shape of the first base frame 110 is not specifically limited. However, the first base frame 110 may include the first base part 111 extending in the first direction D1, and the first sensing part 150 of the discharge amount inspection device 100 may perform an operation of moving on the first base part 111 in the first direction D1.

The inkjet printing device 1000 according to an embodiment may include multiple base frames, for example, first to fifth base frames 110, 310, 710, 720, and 910, and the base frames 110, 310, 710, 720, and 910 may respectively include base parts 111, 311, 711, 721, and 911, extending in the first direction D1, and supports 112, 312, 712, 722, and 912, each of which may be disposed on both end portions of each of the base parts 111, 311, 711, 721, and 911 and support each of the base parts 111, 311, 711, 721, and 911. The shapes of the first to fifth base frames 110, 310, 710, 720, and 910 may be substantially similar, and extended lengths of the base parts may be partially different. However, embodiments are not limited thereto. Hereinafter, in the interest of brevity, a description is made with a detailed description of the base frame omitted.

A first sensing part 150 may be disposed on the first base part 111 of the first base frame 110. Multiple first sensing parts 150 may be provided, and FIG. 1 illustrates that four first sensing parts 150 may be disposed. However, embodiments are not limited thereto. The first sensing parts 150 may be spaced apart from the sub-stage part 180 and may detect a material disposed on the sub-stage part 180.

According to an embodiment, each of the first sensing parts 150 may include a first moving part 151 that may be connected to the first base frame 110 and movable in one direction, a first support 153 disposed on one surface of the first moving part 151, and a first sensor 155 disposed on the first support 153.

The first moving part 151 of the first sensing part 150 may be mounted on the first base part 111 of the first base frame 110, and as an example, the first moving part 151 may move in the first direction D1 in which the first base part 111 extends. Since the first moving part 151 moves in the first direction D1, the first sensor 155 of the first sensing part 150 may detect materials arranged along the first direction D1.

The first support 153 may be disposed to be connected to a lower surface of the first moving part 151 and may have a shape extending in the second direction D2. One end portion of the first support 153 may be connected to the first moving part 151, and the other end portion thereof in the second direction D2 may have a lower surface on which the first sensor 155 may be disposed. Accordingly, the first sensing part 150 may have a shape protruding from the first base frame 110 in the second direction D2. However, embodiments are not limited thereto.

The first sensor 155 may be disposed on the lower surface of the first support 153. The first sensor 155 may face the sub-stage part 180 and detect a material disposed on the sub-stage part 180. As an example, the first sensor 155 may be a high-resolution camera, but embodiments are not limited thereto. As described above, the first moving part 151 of the first sensing part 150 may move in the first direction D1 and reciprocate. As the first moving part 151 moves, the first sensor 155 may also move and detect diameters or positions of materials disposed on the sub-stage part 180 and errors occurring therebetween.

The sub-stage part 180 may be disposed on the first rail RR1 and the second rail RR2 below the first base frame 110. The sub-stage part 180 may move on the first rail RR1 and the second rail RR2 in the second direction D2, and may reciprocate between the inkjet head device 300 and the discharge amount inspection device 100. The sub-stage part 180 may have a shape having a width and extending in the first direction D1. A material that may be detected or inspected by the first sensing part 150 may be disposed on the sub-stage part 180. In the discharge amount inspection device 100, an inspection substrate ISUB may be prepared on the sub-stage part 180 and the ink I sprayed from the inkjet head device 300 may be inspected.

Figure 4:
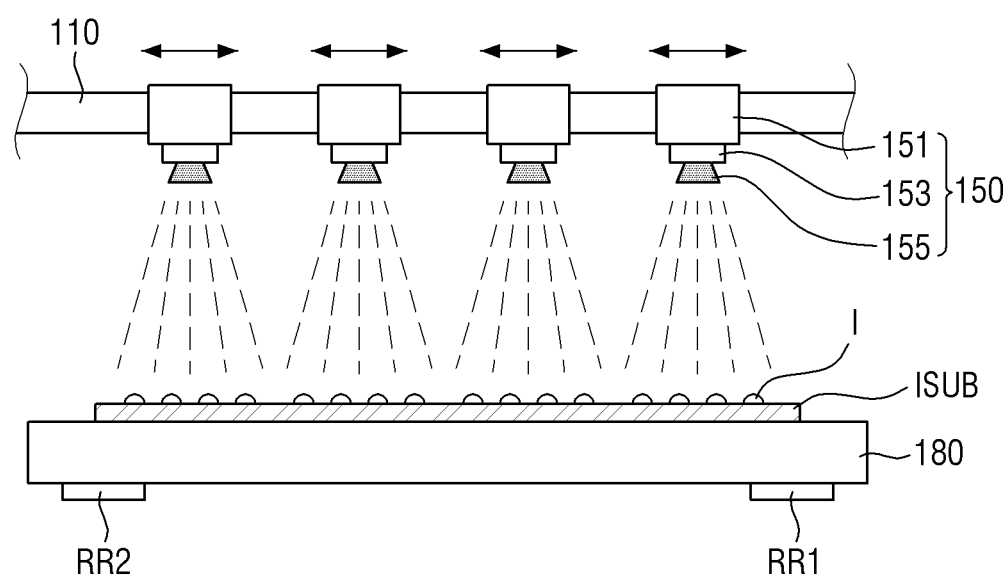
FIG. 4 is a schematic cross-sectional view of the discharge amount inspection device according to an embodiment.
Figure 5:
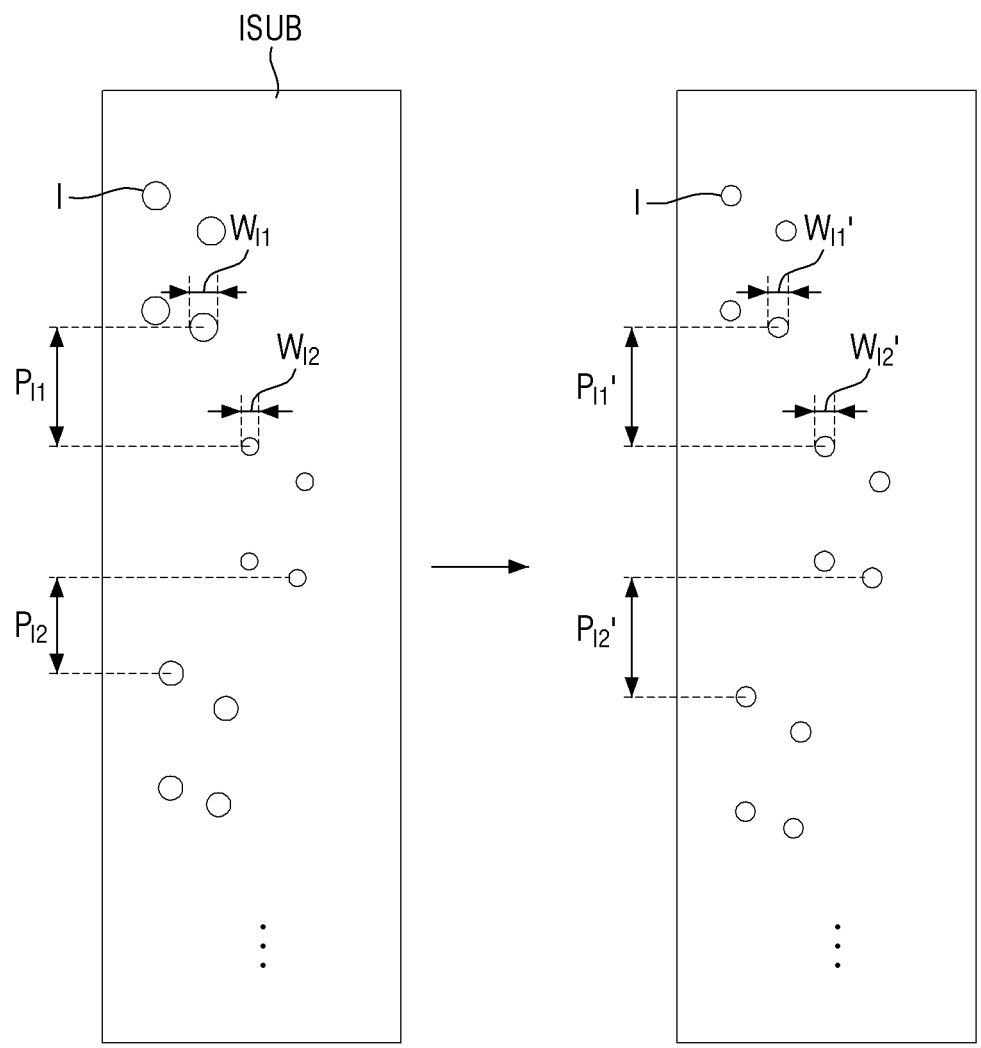
FIG. 5 is a schematic view illustrating ink that is sprayed onto an inspection substrate according to an embodiment.

FIG. 4 is a schematic cross-sectional view of the discharge amount inspection device according to an embodiment. FIG. 5 is a schematic view illustrating the ink that may be sprayed onto the inspection substrate according to an embodiment.

A description is made in detail with reference to FIGS. 4 and 5 where the inspection substrate ISUB may be prepared on the sub-stage part 180 of the discharge amount inspection device 100, the sub-stage part 180 moves in the second direction D2, and the ink I may be discharged from the inkjet head device 300. The discharged ink I may be sprayed onto the inspection substrate ISUB, and the sub-stage part 180 moves in the second direction D2 and may be located under the first base frame 110. A detailed description of the discharge of the ink I from the inkjet head device 300 will be given below.

The ink I sprayed onto the inspection substrate ISUB may be inspected by the first sensing part 150. At least one or more first sensing parts 150 may be disposed to inspect the ink I sprayed onto the inspection substrate ISUB. In an embodiment, a first sensing part 150 may inspect at least some of the ink I while moving in the first direction D1. It is illustrated in the drawing that each of the four first sensing parts 150 partially inspects the ink I sprayed onto the inspection substrate ISUB, but embodiments are not limited thereto. The number of first sensing parts 150 is not limited thereto, and may be more or less depending on the case.

According to an embodiment, the first sensing part 150 may detect a diameter and a sprayed position of the ink I sprayed onto the inspection substrate ISUB, and measure an error in the diameter and the sprayed position of each of multiple droplets of the ink I. As shown in FIGS. 4 and 5, the first sensing part 150 may measure droplet diameters WI1 and WI2 or droplet amount of the ink I sprayed onto the inspection substrate ISUB, and separation distances PI1 and PI2 between the droplets of the ink I. As will be described below, the ink I discharged from the inkjet head device 300 may need to be sprayed onto a target substrate SUB or the inspection substrate ISUB at a same rate and at a same position even in case that a process is repeated several times. Before driving the inkjet printing device 1000, the discharge amount inspection device 100 may adjust the diameters WI1 and WI2 and the separation distances PI1 and PI2 of the droplets of the ink I sprayed from the inkjet head device 300 to be close to a reference value.

Specifically, information on the diameters WI1 and WI2 and the separation distances PI1 and PI2 of the droplets of the ink I, which may be detected by the first sensing part 150, may be transmitted to the inkjet head device 300, and ink discharge members of the inkjet head device 300 may be aligned based on the transmitted information. As shown in FIG. 5, the diameters WI1 and WI2 and the separation distances PI1 and PI2 of the droplets of the ink I discharged from the inkjet head device 300 may not match each other. The first sensing part 150 may detect such an error and transmit the error to the inkjet head device 300, and the inkjet head device 300 may align the ink discharge members.

As described above, the ink I may include the dipoles DP, and the discharge amount inspection device 100 may measure the droplet diameters WI1 and WI2 of the sprayed ink I to adjust the number of dipoles DP dispersed in the ink I discharged once. In case that the droplet diameters WI1 and WI2 of the ink I are different from each other, reliability of a product manufactured by the inkjet printing device 1000 may be reduced. The number of dipoles DP in the ink I discharged once may be maintained by matching droplet diameters WI1' and WI2' of the ink I to each other.

As shown in the drawing, the inspection using the first sensing part 150 and the alignment process of the inkjet head device 300 may be repeated so that the diameters WI1' and WI2' and separation distances PIP and PI2' of the droplets of the ink I or the number of dipoles DP may be uniform for each ink I, or match or close to the reference value. The term "reference value" may be characteristics required for the ink I sprayed from the inkjet head device 300 in driving the inkjet printing device 1000. For example, the reference value may be the amount of the ink I sprayed from the inkjet head device 300, the separation distance between the droplets of the ink I, the number of dipoles DP included in the ink I, and the like, but embodiments are not limited thereto. More detailed descriptions will be given below.

In an embodiment, the inspection substrate ISUB may be an organic film, and the sub-stage part 180 may include at least one adsorption device that fixes the inspection substrate ISUB.

FIG. 6 is a schematic cross-sectional view of the sub-stage part according to an embodiment.

Referring to FIG. 6, the sub-stage part 180 according to an embodiment may include a lower substrate 181, an upper substrate 182 that may be spaced apart from and face the lower substrate 181, and multiple adsorption devices 183, 184, and 185 disposed between the lower substrate 181 and the upper substrate 182.

The sub-stage part 180 may include the lower substrate 181 and the upper substrate 182 extending in the first direction D1. The lower substrate 181 may support members of the sub-stage part 180. The upper substrate 182 may be spaced apart from the lower substrate 181, and the inspection substrate ISUB may be prepared on the upper substrate 182. In an embodiment, the inspection substrate ISUB may be glass, film, or the like, or a combination thereof, and the type thereof is not specifically limited. For example, the inspection substrate ISUB may be an organic film.

The adsorption devices 183, 184, and 185 may be disposed on the lower substrate 181. The adsorption devices may include a first adsorption device 183, a second adsorption device 184, and a third adsorption device 185. The first adsorption device 183 and the second adsorption device 184 may be disposed on both end portions of the lower substrate 181 in the first direction D1 and may extend in the second direction D2. The third adsorption device 185 may be disposed on an end portion of the lower substrate 181 in the second direction D2 and may extend in the first direction D1. For example, the adsorption devices 183, 184, and 185 may be disposed at peripheral portions of the lower substrate 181 and driven in the third direction D3. Accordingly, in case that the inspection substrate ISUB is prepared on the upper substrate 182, the adsorption devices 183, 184, and 185 may move in the third direction D3 and fix the inspection substrate ISUB. In an embodiment, the adsorption devices 183, 184, and 185 may each be a vacuum device, a clamp device, or the like. However, embodiments are not limited thereto.

In an embodiment, the sub-stage part 180 may further include rolls WR1 and WR2. The inspection substrate ISUB may be wound around the rolls WR1 and WR2 and prepared on the upper substrate 182, and in case that the inkjet printing device 1000 is driven, the inspection substrate ISUB may be removed as the rolls WR1 and WR2 rotate. However, embodiments are not limited thereto.

The inkjet head device 300 may spray an ink I onto the target substrate SUB in case that the inkjet printing device 1000 is driven. The inkjet head device 300 may include an inkjet head part 330 and a second sensing part 350, and the second sensing part 350 may inspect the aligned state of the ink discharge members included in the inkjet head part 330, the amount of the discharged ink I, and the like.

FIG. 7 is a schematic plan view of the inkjet head device according to an embodiment. FIG. 7 is a plan view of the inkjet head device 300 when viewed in the third direction D3, for example, viewed from above.

Referring to FIGS. 1 and 7, the inkjet head device 300 according to an embodiment may include a second base frame 310, the inkjet head part 330, and the second sensing part 350. The inkjet head device 300 may inspect the alignment of the ink discharge members included in the inkjet head part 330 and the amount of the discharged ink I using the second sensing part 350, and spray the ink I onto the target substrate SUB using the ink discharge members.

The second base frame 310 may include a second base part 311 extending in the first direction D1, and second supports 312 connected to both end portions of the second base part 311 and extending in the third direction D3 to support the second base part 311. A detailed description of the second base frame 310 may be similar as described above with reference to the first base frame 110.

The inkjet head part 330 may be disposed on the second base part 311 of the second base frame 310. Although not shown in the drawing, the inkjet head part 330 may be connected to a separate ink reservoir to receive the ink I and spray the ink I onto the target substrate SUB through an inkjet head 335 to be described later, but embodiments are not limited thereto.

According to an embodiment, the inkjet head part 330 may include a head base 331, multiple jigs 333 (see FIG. 10) disposed on a surface of the head base 331, and at least one inkjet head 335 disposed on the jig 333 and including multiple nozzles NZ (see FIG. 8).

The head base 331 of the inkjet head part 330 may be mounted on the second base part 311 of the second base frame 310, and as one example, the head base 331 may have a shape extending in the first direction D1. The head base 331 may be spaced apart from the stage part 500 by a distance. In an embodiment, the head base 331 may further include a moving member such that the second base part 311 of the second base frame 310 may move in an extending direction, that is, the first direction D1.

The jigs 333 may be disposed on a surface of the head base 331, for example, a lower surface of the head base 331 in the third direction D3, and at least one inkjet head 335 may be disposed on the jig 333. The jigs 333 may be disposed to be spaced apart from each other in a direction. The jigs 333 may be disposed in a direction to be arranged in one row or multiple rows. It is illustrated in the drawing that the jigs 333 may be arranged in two rows, and the jigs 333 of each row may be alternately arranged. However, embodiments are not limited thereto, and the jigs 333 may be arranged in more rows or may be arranged to overlap each other instead of being alternately arranged. The shape of the jig 333 is not particularly limited, but as an example, the jig 333 may have a quadrilateral shape.

In an embodiment, the jig 333 may include driving parts AM1 and AM2 movable in a direction and another direction, so that a position of each jig 333 and an interval between the jigs 333 may be adjusted. In order to adjust a dropping position of the ink I sprayed from the inkjet head 335 disposed in the jig 333, the jig 333 may include the head driving parts AM1 and AM2 to adjust the interval between the jigs 333. This will be described in detail below.

The inkjet head 335 may be disposed on the jig 333. At least one inkjet head 335, e.g., two inkjet heads 335, may form a single pack and may be disposed on a jig 333. For example, two inkjet heads 335 may be disposed on one jig 333. However, the number of inkjet heads 335 included in a single pack is not limited thereto, and for example, the number of inkjet heads 335 included in a single pack may be in a range of 1 to 5.

It is illustrated in the drawing that several numbers of jigs 333 and inkjet heads 335 may be disposed in the inkjet head part 330, but the number of jigs 333 and the number of inkjet heads 335 are not limited thereto. In an embodiment, the number of jigs 333 and the number of inkjet heads 335 may each be between about 128 and about 1800.

The inkjet head 335 includes the nozzles NZ and thus may receive the ink I from the head base 331 and spray the ink I onto the target substrate SUB. The nozzles NZ located on a bottom surface of the inkjet head 335 may be connected to an inner pipe IP of the inkjet head 335 to be transmitted to the inner pipe IP. The ink I may move from the head base 331 to the inkjet head 335 and flow along the inner pipe IP, and may be discharged through each of the nozzles NZ.

FIG. 8 is a schematic view illustrating a state in which the ink may be discharged from the inkjet head according to an embodiment.

Referring to FIG. 8, the inkjet head 335 may include the inner pipe IP through which the ink I may be transmitted and the nozzles NZ through which the ink I may be discharged, and the ink I may be discharged from the nozzle NZ and sprayed onto the target substrate SUB. The amount of the ink I sprayed through the nozzle NZ may be adjusted according to a voltage applied to each nozzle NZ. In an embodiment, the amount of the ink I discharged once from each nozzle NZ may be in a range of about 1 to about 50 pico-liters (pl), but embodiments are not limited thereto. Although not shown in the drawings, the ink I may include the dipoles DP, and the dipoles DP may be discharged together with the ink I from the nozzles NZ. The ink I sprayed onto the target substrate SUB may include the dipoles DP, the solvent SV may be volatilized by a subsequent process, and the dipoles DP may be landed or printed on the target substrate SUB.

The inkjet head 335 may include dummy nozzles DN (shown in FIG. 10) that may not be connected to the inner pipe IP and thus the ink I may not be discharged therethrough. The dummy nozzles DN may be located at an outermost side surface of a lower surface of the inkjet head 335. The second sensing part 350, which will be described below, may measure a position of each of the dummy nozzles DN of each inkjet head 335 to calculate a position of each inkjet head 335 or a separation distance between the inkjet heads 335.

According to an embodiment, the second sensing part 350 may include a second moving part 351 that may be disposed in the second base frame 310 and movable in a direction, a second support 353 that may be disposed on a surface of the second moving part 351, and a second sensor 355 disposed on the second support 353.

The second moving part 351 of the second sensing part 350 may be mounted on the second base part 311. Unlike in the first sensing part 150, in the second sensing part 350, the second moving part 351 may be mounted on a bottom surface of the second base part 311. The second moving part 351 may move in the first direction D1 in which the second base part 311 extends. As the second moving part 351 moves, the second sensing part 350 may move through a lower portion of the inkjet head part 330 mounted on the second base part 311. The second sensing part 350 may measure the position of the inkjet head 335 disposed on a bottom surface of the inkjet head part 330.

The second support 353 may be disposed to be connected to a lower surface of the second moving part 351 and may have a shape extending in the second direction D2. An end portion of the second support 353 may be connected to the second moving part 351, and another end portion thereof in the second direction D2 may have an upper surface on which the second sensor 355 may be disposed. For example, the second sensor 355 may be disposed to face the inkjet head 335. The second sensing part 350 may be disposed to protrude entirely from the second base frame 310 in the second direction D2. The second sensor 355 may be located in a region protruding from the second base frame 310 of the second sensing part 350 to inspect the position of the inkjet head 335.

The second sensor 355 may be disposed on an upper surface of the second support 353. The second sensor 355 may move through a lower surface of the inkjet head part 330 as the second moving part 351 moves, and may inspect the position or aligned state of the inkjet head 335. The second sensor 355 may monitor the amount of the ink I discharged from the inkjet head 335, spots or dried ink I generated on the inkjet head 335, or the like. The shape of the second sensor 355 is schematically illustrated in the drawings, and one sensing member is illustrated as being disposed. However, the second sensor 355 is not limited thereto, and the second sensor 355 may have various shapes to inspect alignment of the inkjet head 335. For example, since the inkjet heads 335 may be arranged in rows, the second sensor 355 may include multiple sensing members, and the sensing members may be arranged in the rows.

Further, in an embodiment, the second sensor 355 may move on the second support 353 in at least the first direction D1 or the second direction D2. In case that multiple inkjet heads 335 are disposed and arranged in two or more rows, the second sensor 355 may move in the first direction D1 or the second direction D2 and measure the position of each inkjet head 335 or the separation distance between the inkjet heads 335. However, embodiments are not limited thereto.

FIG. 9 is a schematic view illustrating a state in which the second sensing part of the inkjet head device inspects the position of the inkjet head according to an embodiment. FIG. 10 is a schematic plan view of the inkjet head part according to an embodiment. FIG. 10 is a plan view of the inkjet head part 330 when viewed in the third direction D3, for example, viewed from below.

An operation of the second sensing part 350 of the inkjet head device 300 is described with reference to FIGS. 9 and 10 where before the inkjet head 335 sprays the ink I onto the target substrate SUB or the inspection substrate ISUB, the second sensing part 350 may inspect the alignment of the inkjet head 335 of the inkjet head part 330 and the spots or the like generated on the inkjet head 335. As described above, the second sensing part 350 may include the second moving part 351 and move in the first direction D1. In case that the second moving part 351 moves in the first direction D1, the second support 353 and the second sensor 355 may move adjacent to the lower surface of the inkjet head part 330. The second sensor 355 disposed on the second support 353 to face upward may monitor the position of the inkjet head 335 or the separation distance between the inkjet heads 335, whether foreign substances such as spots may be formed on the inkjet head 335, the amount of the ink I discharged from the inkjet head 335, and the like on the lower surface of the inkjet head part 330.

In particular, the inkjet head part 330 may align the inkjet heads 335 through information such as the position of the inkjet head 335 and the separation distance between the inkjet heads 335, which may be measured using the second sensing part 350, and the dropped position, the droplet size, and the like of the ink I, which may be measured using the discharge amount inspection device 100.

Specifically, as shown in FIG. 10, the jig 333, on which the inkjet head 335 may be disposed, includes multiple head driving parts, for example, a first head driving part AM1 and a second head driving part AM2, and as the first and second head driving parts AM1 and AM2 operate, the position of each of the jig 333 and the inkjet head 335 or the separation distances between the jigs 333 and between the inkjet heads 335 may be adjusted.

The inkjet head 335 may include the dummy nozzles DN located at both side portions thereof, and the second sensing part 350 may measure an aligned state of the inkjet head 335 by detecting a position of the dummy nozzle DN. In case that the second sensing part 350 detects the position of the dummy nozzle DN, separation distances HP1 and HP2 between the inkjet heads 335 may be measured using positions at which the dummy nozzles DN of each inkjet head 335 may be disposed. The head driving parts AM1 and AM2 may be operated to align the jigs 333 and the inkjet heads 335 using the separation distances HP1 and HP2 between the inkjet heads 335 measured by the second sensing part 350 and the diameters WI1 and WI2 and the separation distances PI1 and PI2 of the droplets of the ink I measured by the first sensing part 150 of the discharge amount inspection device 100.

The first head driving part AM1 may be a driving part located in the first direction D1 of the jig 333 to align the position of the jig 333 in the first direction D1 or an X-axis direction, and the second head driving part AM2 may be a driving part located in the second direction D2 of the jig 333 to align the position of the jig 333 in the second direction D2 or a Y-axis direction. Upon receiving the information measured by the first sensing part 150 and the second sensing part 350, the inkjet head part 330 may operate the first head driving part AM1 and the second head driving part AM2 to align the jigs 333 and the inkjet heads 335. As an example, the second sensing part 350 may set the dummy nozzle DN of the inkjet head 335 disposed in a jig 333 located at a lower left side of the drawing as a starting point, and the first head driving part AM1 and the second head driving part AM2 may adjust the position and separation distance of the inkjet head 335 on the basis of the dummy nozzle DN of another inkjet head 335. Thus, the inkjet head device 300 may perform an operation of aligning the inkjet head 335 and the position, at which the ink I may be sprayed, before the ink I including the dipoles DP may be sprayed onto the target substrate SUB using the inkjet printing device 1000.

The second sensing part 350 may monitor the state of the inkjet head 335, the amount of the sprayed ink I, or the like. Although not shown in the drawing, the inkjet head device 300 may further include a cleaning part for cleaning the nozzles NZ of the inkjet head 335. The cleaning part may perform a process of cleaning the inkjet heads 335 during the process of the inkjet printing device 1000 on the basis of the information detected by the second sensing part 350. For example, in case that the second sensing part 350 detects spots generated on the inkjet head 335 or a phenomenon that the nozzle NZ is clogged, the cleaning part may perform the process of cleaning the nozzles NZ of the inkjet head 335. However, embodiments are not limited thereto.

The stage part 500 may move in the second direction D2 in the inkjet printing device 1000. In case that the target substrate SUB is prepared on the stage part 500, and the ink I is sprayed onto the target substrate SUB, the stage part 500 may form an electric field in the ink I. The dipoles DP in the ink I may be oriented in one direction by the electric field formed on the target substrate SUB.

FIG. 11 is a schematic plan view illustrating the stage part according to an embodiment.

Referring to FIGS. 1 and 11 again, the stage part 500 may include a stage 510, a sub stage 520, a probe support 530, a probe part 550, and an aligner 580.

The stage 510 may support members disposed in the stage part 500. The stage 510 may be disposed on the first rail RR1 and the second rail RR2, and may move in the second direction D2 in the inkjet printing device 1000 to reciprocate. Although not shown in the drawing, moving members may be disposed on a lower surface of the stage 510, and the moving members may be coupled to the first and second rails RR1 and RR2 to move the stage 510 in a direction. Each device may be driven according to the movement of the stage 510 during the process of the inkjet printing device 1000, and the stage 510 may move depending on a process sequence of the inkjet printing device 1000. Although the shape of the stage 510 is not particularly limited, for example, the stage 510 may have a quadrangular shape in which both sides extend in the first direction D1 and the second direction D2, as shown in the drawing.

The sub stage 520 may be disposed on the stage 510. The sub stage 520 may provide a space in which the target substrate SUB may be disposed. The probe support 530, the probe part 550, and the aligner 580 may be disposed on the sub stage 520. The shape of the sub stage 520 may be substantially similar to the stage 510, but an area of the sub stage 520 may be less than that of the stage 510. However, an overall planar shape of the sub stage 520 may vary depending on a planar shape of the target substrate SUB. For example, in case that the target substrate SUB has a rectangular shape in a plan view, the shape of the sub stage 520 may be a rectangular shape as illustrated in the drawing, and in case that the target substrate SUB has a circular shape in a plan view, the sub stage 520 may have a circular shape in a plan view.

At least one aligner 580 may be disposed on the sub stage 520. The aligner 580 may be disposed on each side of the sub stage 520, and a region formed by the aligners 580 may be a region in which the target substrate SUB may be disposed. It is illustrated in the drawing that two aligners 580 may be disposed to be spaced apart from each other on each side of the sub stage 520 and a total of eight aligners 580 may be disposed on the sub stage 520. However, embodiments are not limited thereto, and the number and arrangement of the aligners 580 may vary depending on the shape or type of the target substrate SUB.

The probe support 530 and the probe part 550 may be disposed on the sub stage 520. The probe support 530 may provide a space in which the probe part 550 may be disposed on the sub stage 520. Specifically, the probe support 530 may be disposed on at least one side of the sub stage 520, and may extend in a direction in which a side portion extends. As an example, as shown in the drawing, the probe supports 530 may be disposed on left and right sides of the sub stage 520 to extend in the second direction D2. However, embodiments are not limited thereto, and a larger number of probe supports 530 may be included, and in some cases, the probe supports 530 may also be disposed on upper and lower sides of the sub stage 520. For example, the structure of the probe support 530 may vary depending on the number of probe parts 550 included in the stage part 500, or the arrangement or structure of the probe parts 550.

The probe part 550 may be disposed on the probe support 530 to form an electric field on the target substrate SUB prepared in the sub stage 520. The probe part 550 may extend in one direction, for example, the second direction D2, like the probe support 530, and an extended length may cover the entire target substrate SUB. For example, the size and shape of each of the probe support 530 and the probe part 550 may vary depending on the target substrate SUB.

In an embodiment, the probe part 550 may include probe driving parts 553 disposed on the probe support 530, probe pads 558 connected to the probe driving parts 553 and contacting the target substrate SUB, and probe jigs 551 and 552 connected to the probe pads 558 to transmit electrical signals thereto.

Each of the probe driving parts 553 may be disposed on the probe support 530 to move the probe pad 558. In an embodiment, the probe driving part 553 may move the probe pad 558 in a horizontal direction and a vertical direction, for example, in the first direction D1, which may be the horizontal direction, and the third direction D3, which may be the vertical direction. The probe pad 558 may be connected to or separated from the target substrate SUB by the operation of the probe driving part 553. During the process of the inkjet printing device 1000, the probe driving part 553 may be driven to connect the probe pad 558 to the target substrate SUB in the operation of forming an electric field on the target substrate SUB, and the probe driving part 553 may be driven again to separate the probe pad 558 from the target substrate SUB in the other operations. This will be described in detail below with reference to other drawings.

The probe pad 558 may form an electric field on the target substrate SUB using an electrical signal transmitted from the probe jigs 551 and 552. The probe pad 558 may be connected to the target substrate SUB to transmit the electrical signal thereto to form the electric field on the target substrate SUB. As an example, the probe pad 558 may be in contact with an electrode, a power pad, or the like of the target substrate SUB, and the electrical signal from the probe jigs 551 and 552 may be transmitted to the electrode or the power pad. The electrical signal transmitted to the target substrate SUB may form an electric field on the target substrate SUB.

However, embodiments are not limited thereto, and the probe pad 558 may be a member that forms an electric field using an electrical signal transmitted from the probe jigs 551 and 552. For example, in case that the electric field is formed by receiving the electrical signal from the probe pad 558, the probe pad 558 may not be connected to the target substrate SUB.

The shape of the probe pad 558 is not particularly limited, but in an embodiment, the probe pad 558 may have a shape extending in a direction to cover the entire target substrate SUB.

The probe jigs 551 and 552 may be connected to the probe pad 558 and may be connected to a separate voltage applying device. The probe jigs 551 and 552 may transmit an electrical signal transmitted from the voltage applying device to the probe pad 558 to form the electric field on the target substrate SUB. The electrical signal transmitted to the probe jigs 551 and 552 may be a voltage for forming an electric field, for example, an AC voltage.

The probe part 550 may include probe jigs 551 and 552, and the number of probe jigs 551 and 552 is not specifically limited. It is illustrated in the drawing that two probe jigs 551 and 552 may be disposed, but the probe part 550 may include a larger number of probe jigs 551 and 552 to form an electric field having a higher density on the target substrate SUB.

The probe part 550 according to an embodiment is not limited thereto. It is illustrated in the drawing that the probe part 550 is disposed on the probe support 530, that is, the stage part 500, but in some cases, the probe part 550 may also be disposed as a separate device. The structure or arrangement of the stage part 500 is not limited as long as an electric field can be formed on the target substrate SUB by including a device capable of forming the electric field.

FIGS. 12 and 13 are schematic views illustrating a state of the probe part according to an embodiment.

As described above, the probe driving part 553 of the probe part 550 may operate according to the process operation of the inkjet printing device 1000. Referring to FIGS. 12 and 13, in a first state in which the target substrate SUB may not be prepared on the stage part 500, the probe part 550 may be disposed on the probe support 530 to be spaced apart from the sub stage 520. The probe driving part 553 of the probe part 550 may be driven in the first direction D1, which may be a horizontal direction, and the third direction D3, which may be a vertical direction, to separate the probe pad 558 from the sub stage 520.

In a second state in which the target substrate SUB may be prepared on the stage part 500 and the electric field may be formed on the target substrate SUB, the probe driving part 553 of the probe part 550 may be driven to connect the probe pad 558 to the target substrate SUB. The probe pad 558 may come into contact with the target substrate SUB by driving the probe driving part 553 in the first direction D1, which may be a horizontal direction, and the third direction D3, which may be a vertical direction. The probe jigs 551 and 552 of the probe part 550 may transmit an electrical signal to the probe pad 558, and the electric field may be formed on the target substrate SUB.

It is illustrated in the drawing that one probe part 550 is disposed on each of both sides of the stage part 500 and the two probe parts 550 may be simultaneously connected to the target substrate SUB. However, embodiments are not limited thereto, and the probe parts 550 may be separately driven. For example, in case that the target substrate SUB is prepared on the sub stage 520 and the ink I is sprayed onto the target substrate SUB, first, an arbitrary first probe part 550 may form an electric field on the target substrate SUB, and a second probe part 550 may not be connected to the target substrate SUB. Thereafter, the first probe part 550 may be separated from the target substrate SUB and the second probe part 550 may be connected to the target substrate SUB to form an electric field. For example, the probe parts 550 may be simultaneously driven to form an electric field, or may be sequentially driven to form an electric field.

FIG. 14 is a schematic view illustrating a state in which the electric field may be formed on the target substrate by the probe part according to an embodiment.

As described above, the electric field may be formed on the target substrate SUB, and the ink I sprayed onto the target substrate SUB may include the dipoles DP. The dipoles DP may be oriented in one direction by the electric field formed on the target substrate SUB.

Each of the dipoles DP may be an object having an end portion having a first polarity and another end portion having a second polarity different from the first polarity. For example, an end portion of the dipole DP may have a positive polarity and another end portion of the dipole DP may have a negative polarity. The dipole DP having different polarities at end portions may receive electric forces (attractive force and repulsive force) in case placed in an electric field, so that an orientation direction may be controlled.

Referring to FIG. 14, the ink I including the dipoles DP may be discharged from the nozzle NZ of the inkjet head 335. The ink I discharged from the nozzle NZ may be sprayed toward the target substrate SUB, and the ink I may be supplied on the target substrate SUB. Here, in case that an electric field IEL is formed on the target substrate SUB, the dipoles DP each having a first polarity and a second polarity may be subjected to an electrical force until the ink I is supplied to the target substrate SUB from the nozzle NZ. The dipoles DP may be oriented by the electrical force, and as an example, an orientation direction of the dipole DP may be toward the electric field IEL.

It is illustrated in the drawing that the electric field IEL is formed in the probe part 550 in case that the ink I is sprayed from the nozzle NZ. Accordingly, the dipoles DP may be forced by the electric field IEL until the dipoles DP may be discharged from the nozzle NZ and reach the target substrate SUB. However, embodiments are not limited thereto, and in some cases, the probe part 550 may form the electric field IEL after the ink I may be sprayed onto the target substrate SUB. In this case, the dipoles DP may be sprayed onto the target substrate SUB with random arrangement directions, and may be arranged in one direction in the sprayed ink I by the electric field IEL.

It is illustrated in the drawing that the probe part 550 forms the electric field IEL on the target substrate SUB simultaneously when the ink I is sprayed onto the target substrate SUB. However, embodiments are not limited thereto, and the probe part 550 may also form the electric field IEL after the stage part 500 moves to the heat treatment device 900 in a process described below. For example, the probe part 550 may form the electric field IEL at the time when the ink I may be sprayed or the solvent SV of the ink I may be removed.

Further, although not shown in the drawings, an electric field generating member may be further disposed on the sub stage 520. The electric field generating member may form an electric field above (i.e., the third direction D3), or on the target substrate SUB like the probe part 550 to be described below. In an embodiment, an antenna part, an electric field forming device including multiple electrodes, or the like may be applied to the electric field generating member.

In the inkjet printing device 1000 according to an embodiment, after the ink I may be sprayed onto the target substrate SUB and the dipoles DP may be aligned, a process of volatilizing the solvent SV of the ink I and inspecting an aligned state of the dipoles DP on the target substrate SUB may be performed. For example, the stage part 500 may move to the alignment inspection device 700 after first passing through the heat treatment device 900 shown in FIG. 2. Hereinafter, the heat treatment device 900 and the alignment inspection device 700 will be described in detail.

FIG. 15 is a schematic cross-sectional view of a heat treatment device according to an embodiment. FIG. 15 is a view of the heat treatment device 900 when viewed in the second direction D2, for example, viewed from the front.

Referring to FIGS. 2 and 15, the heat treatment device 900 according to an embodiment may include a fifth base frame 910 and a heat treatment part 950. The heat treatment part 950 may be disposed on a lower surface of a base member 930 mounted on a fifth base part 911 of the fifth base frame 910. The heat treatment device 900 may remove the solvent SV of the ink I sprayed onto the target substrate SUB by emitting heat or infrared light using the heat treatment part 950. The dipoles DP may be disposed on the target substrate SUB, which has passed through the heat treatment device 900.

The base member 930 may be disposed on the fifth base part 911 of the fifth base frame 910. The base member 930 may have a shape extending in the first direction D1 and may provide a space in which the heat treatment part 950 may be disposed. The base member 930 may cover a side of the target substrate SUB, for example, a side extending in the first direction D1. For example, a length of the base member 930 extending in the first direction D1 may be longer than at least one side of the target substrate SUB extending in the first direction D1. Accordingly, the heat treatment part 950 disposed on the lower surface of the base member 930 may have a shape extending in the first direction D1 and entirely cover a side of the target substrate SUB.

The heat treatment part 950 may be disposed on the lower surface of the base member 930 and may be spaced apart from the target substrate SUB by a distance. The heat treatment part 950 may be spaced apart from the target substrate SUB by a distance at which other members disposed on the target substrate SUB may not be damaged by the emitted heat or infrared light. A separation distance between the heat treatment part 950 and the target substrate SUB may vary depending on a length of the heat treatment part 950 or the base member 930 measured in the third direction D3. The type of the heat treatment part 950 is not particularly limited, but as an example, the heat treatment part 950 may be an IR emitting device. As an example, a shielding device may be further disposed on a lower surface of the heat treatment part 950. The shielding device may partially block the heat or infrared light emitted from the heat treatment part 950 so that the target substrate SUB may not be damaged.

The heat treatment part 950 may extend in the first direction D1 like the base member 930. The extended length of the heat treatment part 950 in the first direction D1 may be greater than at least an extended length of the target substrate SUB in the first direction D1. In case that the stage part 500 moves in the second direction D2 from the lower surface of the heat treatment device 900, the heat treatment part 950 may emit the heat or infrared light while covering a region of the target substrate SUB extending in the first direction D1.

According to an embodiment, the heat treatment device 900 may emit the heat or infrared light to a region overlapping the heat treatment part 950, and the solvent SV of the ink I located in the region overlapping the heat treatment part 950 may be removed. For example, as the stage part 500 moves in a direction, for example, the second direction D2, the solvent SV on the target substrate SUB may be sequentially removed along the direction.

FIG. 16 is a schematic view illustrating an operation of the heat treatment device according to an embodiment.

Referring to FIG. 16, the heat treatment device 900 may emit heat H to the region overlapping the heat treatment part 950 below the lower surface of the heat treatment device 900. As shown in the drawing, the heat H may be emitted only in the region at which the heat treatment part 950 overlaps on the target substrate SUB. Since the heat treatment part 950 extends in the first direction D1, the heat H may be simultaneously emitted to the ink I sprayed in the first direction D1 among the ink I sprayed onto the target substrate SUB. On the other hand, the heat H may be sequentially emitted to the ink I sprayed in the second direction D2 as the stage part 500 passes through the heat treatment part 950. In case that the stage part 500 moves in the second direction D2 and passes through the heat treatment device 900, the solvent SV of the ink I sprayed onto the target substrate SUB may be sequentially removed as the stage part 500 moves. As shown in the drawing, the heat H may be emitted to the solvent SV on the target substrate SUB in the region overlapping the heat treatment part 950, and the solvent SV may be removed (a region with a dotted line) in a region that has passed the heat treatment part 950 so that only the dipoles DP may be present.

Although not shown in the drawing, the stage part 500 may further include a control device that detects a temperature of an upper portion of the target substrate SUB and adjust the temperature. In case that the temperature of the target substrate SUB rises above a level because of the heat or infrared light emitted from the heat treatment part 950, the target substrate SUB may be cooled by the control device.

In case that the stage part 500 passes through the heat treatment part 950, and the solvent SV may be removed and the dipoles DP remain on the target substrate SUB, the stage part 500 may move to the alignment inspection device 700. The alignment inspection device 700 may inspect the orientation direction of the dipole DP, the number of dipoles DP per unit area, and the like by measuring the position of each of the dipoles DP present on the target substrate SUB.

FIG. 17 is a schematic plan view of the alignment inspection device according to an embodiment. FIG. 17 is a plan view of the alignment inspection device 700 when viewed from in third direction D3, for example, viewed from above, and the stage part 500 is also illustrated.

Referring to FIGS. 2 and 17, the alignment inspection device 700 may include a third base frame 710, a fourth base frame 720, a third rail RR3 and a fourth rail RR4 connecting the third and fourth base frames 710 and 720, and a third sensing part 750.

The third base frame 710 and the fourth base frame 720 may respectively include a third base part 711 and a fourth base part 721, and a third support 712 and a fourth support 722 that support the third base part 711 and the fourth base part 721. The third base frame 710 and the fourth base frame 720 may be spaced apart from each other in the second direction D2, and the third rail RR3 and the fourth rail RR4 may be disposed between the third base frame 710 and the fourth base frame 720. The third rail RR3 and the fourth rail RR4 may be disposed between the third base part 711 and the fourth base part 721 to connect the third base part 711 and the fourth base part 721. The third rail RR3 and the fourth rail RR4 may each have both end portions connected to the third base part 711 and the fourth base part 721 or to the third support 712 and the fourth support 722, and may be spaced apart from each other in the first direction D1. The third and fourth rails RR3 and RR4 may extend in the second direction D2 like the first rail RR1 and the second rail RR2, and the third sensing part 750 mounted on the third and fourth rails RR3 and RR4 may move in the second direction D2. An extended length of each of the third rail RR3 and the fourth rail RR4, that is, a separation distance between the third base frame 710 and the fourth base frame 720 is not particularly limited. As an example, an area of a region formed by the third rail RR3 and the fourth rail RR4, which may be spaced apart from each other and extend, may cover the entire stage part 500. However, embodiments are not limited thereto.

The third sensing part 750 may be mounted on a third support 730. A third moving part 760 and a fourth moving part 770 may be mounted on the third rail RR3 and the fourth rail RR4, respectively, and the third and fourth moving parts 760 and 770 may be connected to both end portions of the third support 730. The third support 730 may have a shape extending in the first direction D1 in which the third rail RR3 and the fourth rail RR4 may be spaced apart from each other.

The third and fourth moving parts 760 and 770 may be mounted on the third and fourth rails RR3 and RR4 and move in the second direction D2. In case that the third and fourth moving parts 760 and 770 move, the third sensing part 750 mounted on the third support 730, and the third support 730 may also move. For example, according to an embodiment, the third sensing part 750 may move in the second direction D2 and may inspect the position or alignment of the dipoles DP, which may be disposed on the stage part 500, along the second direction D2.

The third sensing part 750 may include a fifth moving part 751 mounted on the third support 730, a fifth support 753 disposed on a lower surface of the fifth moving part 751, and a third sensor 755 disposed on the fifth support 753.

The fifth moving part 751 of the third sensing part 750 may be mounted on the third support 730 and may move in the first direction D1 in which the third support 730 extends. The fifth support 753 may be disposed on the lower surface of the fifth moving part 751, and at least one third sensor 755 may be disposed on a bottom surface of the fifth support 753. It is illustrated in the drawing that four third sensors 755 may be disposed to be spaced apart from each other on the lower surface of one fifth support 753. However, embodiments are not limited thereto, and the number of third sensors 755 may be greater than the above-described number, and in some cases, multiple fifth supports 753 may be provided, and only one third sensor 755 may be disposed on one fifth support 753.

The third sensor 755 may be disposed on the lower surface of the fifth support 753 and may face the target substrate SUB of the stage part 500. In an embodiment, the third sensor 755 may measure the position of the dipole DP disposed on the target substrate SUB. In case that the ink I is sprayed onto the target substrate SUB and the solvent SV is removed, only the dipoles DP may be disposed on the target substrate SUB. The alignment inspection device 700 includes the third sensing part 750, and may measure the position of the dipole DP disposed on the target substrate SUB and the orientation direction and alignment of the dipole DP, the number of dipoles DP per unit area, or the like.

Specifically, the third sensing part 750 may measure the position of the dipole DP in the first direction D1 on the stage part 500 as the fifth moving part 751 moves in the first direction D1 on the third support 730. Further, as the third and fourth moving parts 760 and 770 move in the second direction D2, the third sensing part 750 may also measure the position of the dipole DP in the second direction D2 on the stage part 500.

FIGS. 18 and 19 are schematic views illustrating an operation of the third sensing part of the alignment inspection device according to an embodiment. FIG. 18 illustrates a state in which the third sensing part 750 inspects the dipole DP while moving in the first direction D1, and FIG. 19 illustrates a state in which the third sensing part 750 inspects the dipole DP while moving in the second direction D2.

Referring to FIGS. 18 and 19, the fifth moving part 751 mounted on the third support 730 may reciprocate in the first direction D1. The third sensor 755 of the third sensing part 750 may measure the position of the dipole DP disposed on the target substrate SUB along the first direction D1. In particular, since the different inkjet heads 335 may be disposed to be spaced apart from each other in the first direction D1 in the inkjet head device 300, the third sensing part 750 may measure the position of each of the dipoles DP, which may be sprayed from the different inkjet heads 335, in the first direction D1.

The third and fourth moving parts 760 and 770 mounted on the third rail RR3 and the fourth rail RR4 may reciprocate in the second direction D2. The third sensor of the third sensing part 750 may measure the position of each of the dipoles DP disposed on the target substrate SUB along the second direction D2. In case that the ink I is sprayed from the inkjet head device 300, the ink I is sequentially sprayed onto the target substrate SUB in the second direction D2 as the stage part 500 moves in the second direction D2. In the ink I sprayed from one inkjet head 335, the degree of dispersion of the dipoles DP may vary depending on a process time. For example, even in case that the ink I may be sprayed onto the target substrate SUB from the same inkjet head 335, a deviation may occur in the sprayed ink I in the second direction D2 on the target substrate SUB. Unlike in FIG. 18, in FIG. 19, the third sensing part 750 may measure a deviation of the dipoles DP, which may be sprayed from the same inkjet head 335, according to the position of the target substrate SUB by measuring the position of each of the dipoles DP along the second direction D2 on the target substrate SUB.

As described above, the third sensing part 750 may measure the position of the dipole DP, and according to an embodiment, the third sensing part 750 may measure the orientation direction of the dipole DP, which may be disposed on the target substrate SUB, and an acute angle between the orientation direction and one direction, for example, the first direction D1 or the second direction D2. The dipole DP may have a shape extending in one direction, and thus the orientation direction of the dipole DP may be determined according to the extending direction in case that the dipole DP is disposed on the target substrate SUB. As described above, in case that the ink I including the dipoles DP is sprayed onto the target substrate SUB and the electric field may be formed in the probe part 550 of the stage part 500, the dipoles DP may be oriented in one direction by the electric field. The alignment inspection device 700 may measure the orientation direction of the dipole DP disposed on the target substrate SUB or calculate the difference in the orientation direction between the different dipoles DP. In an embodiment, the target substrate SUB may include an electrode extending in the first direction D1, and the third sensing part 750 may measure an acute angle between the orientation direction of the dipole DP disposed on the electrode and the first direction D1 in which the electrode extends. The alignment inspection device 700 may compare the acute angle measured from the dipole DP disposed on the target substrate SUB with the reference value to inspect the alignment of the dipole DP.

According to an embodiment, the third sensing part 750 may measure the number of dipoles DP disposed per unit area of the target substrate SUB. The dipoles DP sprayed from the inkjet head 335 need to be uniform in the number per unit area, as well as, the sprayed position and the orientation direction of the dipole DP on the target substrate SUB. The ink I sprayed from the inkjet head 335 may include the solvent SV and the dipoles DP dispersed in the solvent SV, and the degree of dispersion of the dipoles DP within the ink I may vary depending on the process time. According to an embodiment, the alignment inspection device 700 may measure the number of dipoles DP per unit area on the target substrate SUB, thereby uniformly maintaining the number of dipoles DP disposed on the target substrate SUB. A more detailed description thereof will be given below.

In another embodiment, in case that a larger number of target substrates SUB are prepared on the stage part 500, the alignment inspection device 700 may move.

Figure 20:
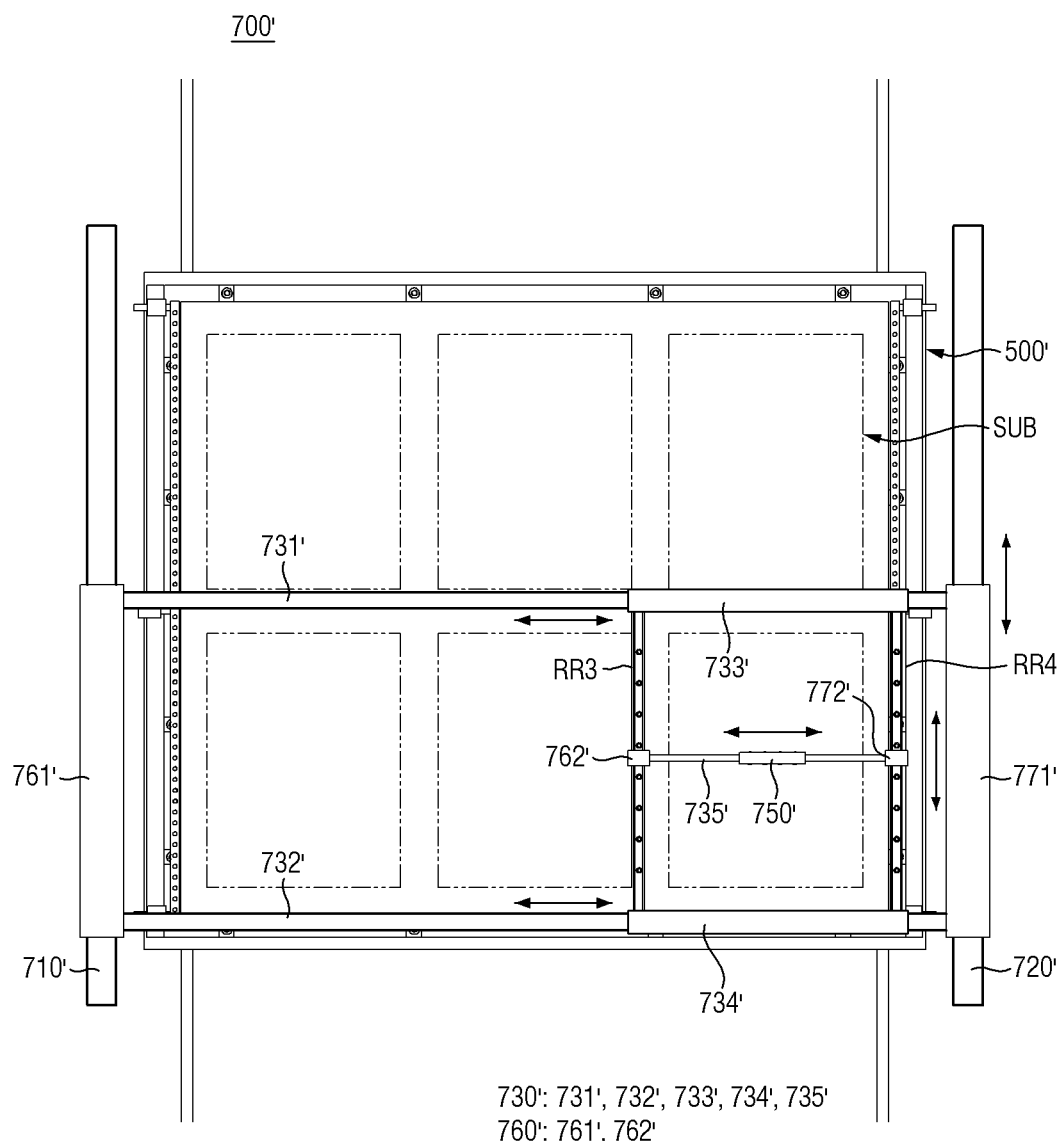
FIG. 20 is a schematic plan view illustrating an alignment inspection device according to another embodiment.

FIG. 20 is a schematic plan view illustrating an alignment inspection device according to another embodiment. FIG. 20 is a plan view of an alignment inspection device 700' viewed from the top.

Referring to FIG. 20, the alignment inspection device 700' according to another embodiment may include a larger number of moving parts 760' and 770' and supports 730'. In case that a stage part 500' has a larger area, and dipoles DP may be disposed on a larger number of target substrates SUB as compared to FIGS. 1 and 2, the alignment inspection device 700' may move to cover a wider area and measure a position of each of the dipoles DP.

In an embodiment, in case that the target substrates SUB are prepared on the stage part 500', the alignment inspection device 700' may cover the stage part 500' having a larger area by including a larger number of moving parts and supports.

Specifically, the alignment inspection device 700' of FIG. 20 may include a third base frame 710' and a fourth base frame 720' extending in a second direction D2, a third-first moving part 761' disposed on the third base frame 710', and a fourth-first moving part 771' disposed on the fourth base frame 720'.

The third-first moving part 761' and the fourth-first moving part 771' may be mounted on the third base frame 710' and the fourth base frame 720', respectively, and may move in the second direction D2. The third-first moving part 761' and the fourth-first moving part 771' may be spaced apart from each other in a first direction D1, and a third sensing part 750', which will be described below, may be located therebetween. As shown in the drawing, as the third-first moving part 761' and the fourth-first moving part 771' move, the third sensing part 750' may move in the second direction D2 and the alignment inspection device 700' may cover the stage part 500' in the second direction D2.

A third-first support 731' and a third-second support 732' may be connected between the third-first moving part 761' and the fourth-first moving part 771'. The third-first support 731' and the third-second support 732' may be disposed to extend in the first direction D1 and to be spaced apart from each other in the second direction D2. The third sensing part 750' may be disposed between the third-first support 731' and the third-second support 732' and thus may move in the first direction D1 and the second direction D2. Different moving parts or supports may be mounted on the third-first support 731' and the third-second support 732' to provide a path in which the third-first support 731' and the third-second support 732' move in the first direction D1.

A third-third support 733' and a third-fourth support 734' may be mounted on the third-first support 731' and the third-second support 732', respectively. The third-third support 733' and the third-fourth support 734' extend in the first direction D1 and may move on the third-first support 731' and the third-second support 732', respectively. The third rail RR3 and the fourth rail RR4 may be connected between the third-third support 733' and the third-fourth support 734', and the third sensing part 750' may move in the second direction D2 between third rail RR3 and the fourth rail RR4. Unlike in the alignment inspection device 700 of FIG. 17, in the alignment inspection device 700' of FIG. 20, members to which the third rail RR3 and the fourth rail RR4 may be connected, such as the third-third support 733' and the third-fourth support 734', may move in the first direction D1. The third-third support 733' and the third-fourth support 734' may also move in the second direction D2 by the movement of the third-first support 731' and the third-second support 732' to which the third-third support 733' and the third-fourth support 734' may be connected.

A third-second moving part 762' and a fourth-second moving part 772' may be mounted on the third rail RR3 and the fourth rail RR4, respectively, and a third-fifth support 735' may be connected between the third-second moving part 762' and the fourth-second moving part 772'. The third sensing part 750' may be disposed on the third-fifth support 735' and may move in the first direction D1. For example, the third-second moving part 762', the fourth-second moving part 772', and the third-fifth support 735' of FIG. 20 may correspond to the third moving part 760, the fourth moving part 770, and the third support 730, respectively.

The alignment inspection device 700' of FIG. 20 may include a larger number of moving parts and supports as compared with the alignment inspection device 700 of FIG. 17, so that the third rail RR3 and the fourth rail RR4, on which the third sensing part 750 mounted, may move in the first direction D1 and the second direction D2. As shown in the drawing, the third-second moving part 762', the fourth-second moving part 772', and the third sensing part 750' may move on one target substrate SUB, thereby measuring the position of the dipole DP. Thereafter, the third-third support 733' and the third-fourth support 734' move in the first direction D1 and thus the third sensing part 750' may be located on another target substrate SUB, and the third-second moving part 762', the fourth-second moving part 772', and the third sensing part 750' move and measure the position of the dipole DP. Accordingly, the target substrates SUB of a first row, which may be arranged in the first direction D1, may be inspected on the stage part 500'.

The third-first moving part 761' and the fourth-first moving part 771' may move in the second direction D2 and thus the third sensing part 750' may be located on the target substrates SUB in a second row. Thereafter, the third sensing part 750' may move and inspect the target substrates SUB arranged in the first direction D1 in a similar manner as described above. Since the movement of the third sensing part 750', the method of measuring the position of the dipole DP, and the like may be similar as described above, detailed descriptions thereof will be omitted.

As described above, the inkjet head device 300 may further include a separate ink supply device 400.

Figure 21:
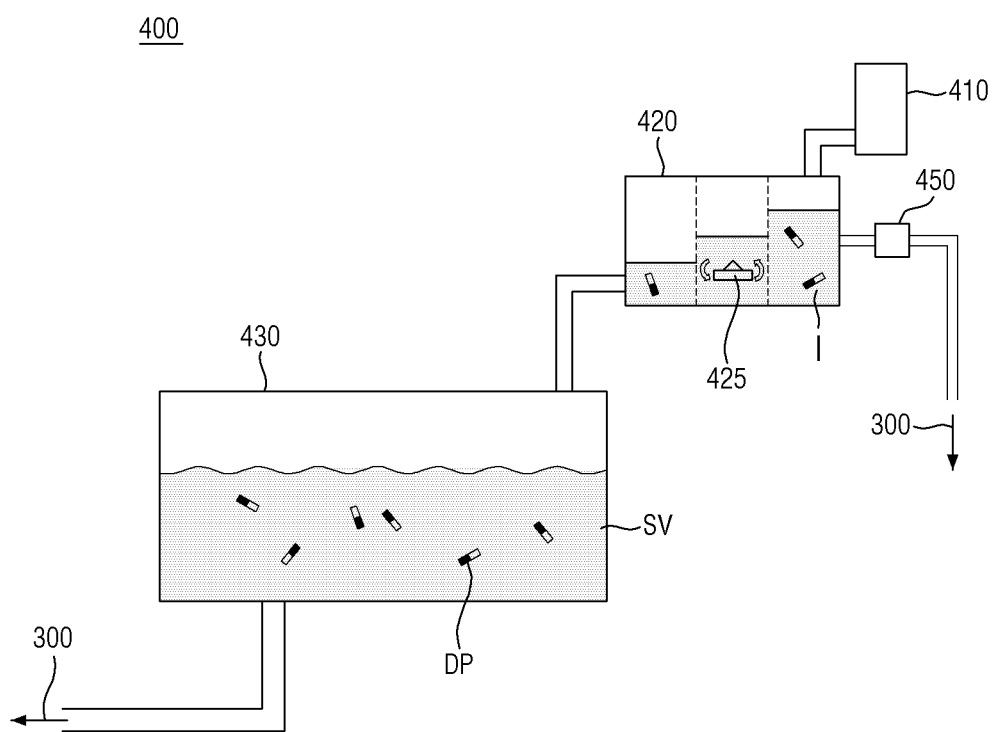
FIG. 21 is a schematic view illustrating an ink supply device according to an embodiment.

FIG. 21 is a schematic view illustrating an ink supply device according to an embodiment.

The ink supply device 400 may serve to supply manufactured ink I to the inkjet head device 300. In case that the ink I is manufactured in a state in which the dipoles DP may be dispersed in the ink I, the manufactured ink I may be stored or transported and supplied to the inkjet head device 300 of the inkjet printing device 1000. As shown in the drawing, the ink supply device 400 may be connected to the inkjet head device 300.

Referring to FIG. 21, the ink supply device 400 may include an ink tank 410, an ink stirrer 420, an ink reservoir 430, and a circulation pump 450.

The ink tank 410 may serve to store the manufactured ink I and supply the ink I to the ink stirrer 420. The shape of the ink tank 410 is not particularly limited, and in an embodiment, the ink tank 410 may be an ink cartridge, an ink vessel, or the like. Although not shown in the drawings, the ink tank 410 may further include a pneumatic pressure forming device that transmits a pressure for supplying the ink I to the ink stirrer 420.

The ink stirrer 420 may serve to stir the ink I supplied from the ink tank 410, disperse the dipoles DP again, and transmit the ink I to the ink reservoir 430. The dipoles DP may be precipitated or settled in the manufactured ink I as time elapses by including a material having a relatively large specific gravity. The ink stirrer 420 may stir the ink I so that the dipoles DP precipitated in the ink I may be dispersed again before the ink I may be supplied to the ink reservoir 430.

In an embodiment, the ink stirrer 420 may include a stirring device 425 to disperse the dipoles DP in the ink I. The type of the stirring device 425 is not particularly limited. As an example, the stirring device 425 may be a magnetic stirrer, a propeller stirrer, or the like. The magnetic stirrer is illustrated in the drawing, and the stirring device 425 may disperse the dipoles DP in the ink I supplied from the ink tank 410 again.

The ink reservoir 430 may supply the ink I supplied from the ink stirrer 420 to the inkjet head device 300. The ink reservoir 430 may perform substantially the same function as the ink tank 410 and may receive the ink I through the ink stirrer 420, which may stir the manufactured ink I. Accordingly, the ink reservoir 430 may supply the ink I including the dipoles DP having a relatively high degree of dispersion to the inkjet head device 300. The inkjet head device 300 may control the number or degree of dispersion of the dipoles DP included in the ink I discharged once from the inkjet head 335 by receiving the ink I through the ink reservoir 430 instead of receiving the ink I directly from the ink tank 410. For example, the quality of the ink I according to the process of the inkjet printing device 1000 may be uniformly maintained.

An end of the circulation pump 450 may be connected to the inkjet head device 300 and another end thereof may be connected to the ink stirrer 420 to circulate the ink I in the inkjet printing device 1000. During the process of the inkjet printing device 1000, in case that the number of dipoles DP sprayed onto the target substrate SUB, which may be measured by the alignment inspection device 700, may be less than the reference value, the circulation pump 450 may be driven to transmit the ink I of the inkjet head device 300 to the ink stirrer 420. The circulation pump 450 may receive information on the alignment and number of dipoles DP, which may be measured by the alignment inspection device 700, and circulate the ink I in the ink stirrer 420, the ink reservoir 430, and the inkjet head device 300 to maintain the quality of the ink I supplied to the inkjet head device 300. Accordingly, the information provided from the alignment inspection device 700 may be fed back so that the ink I may be supplied to the inkjet head device 300.

The inkjet printing device 1000 may receive feedback on information measured by each device, a detected change amount, or the like, and thus may spray the same amount or quality of ink I on the target substrate SUB even in case that the process is repeated several times. Thus, in case that a display device may be manufactured using the inkjet printing device 1000 according to an embodiment, by performing a process of processing the information collected through the sensing parts described above, the quality of the ink I sprayed from the inkjet head device 300 may be maintained. Accordingly, the inkjet printing device 1000 may improve the alignment of the dipole DP disposed on the target substrate SUB and adjust the number of dipoles DP per unit area to be constant. Hereinafter, a method of aligning the dipoles DP using the inkjet printing device 1000 according to an embodiment will be described in detail.

Figure 22:
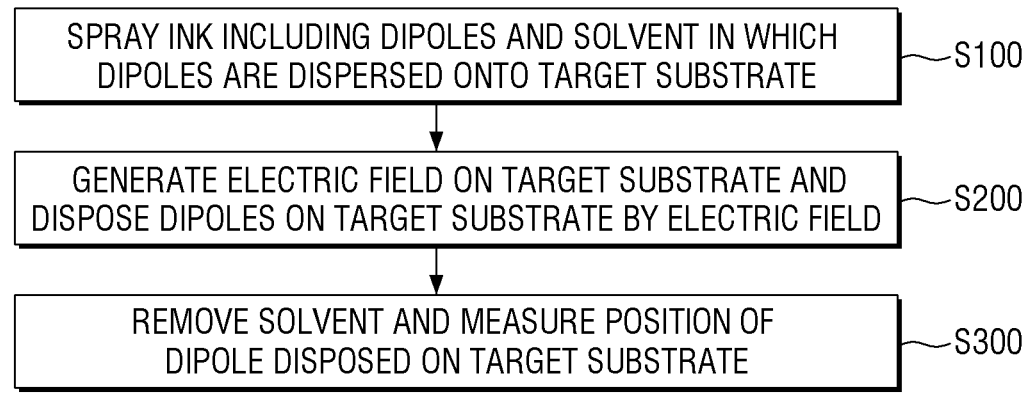
FIG. 22 is a schematic flowchart illustrating a dipole aligning method using the inkjet printing device according to an embodiment.

FIG. 22 is a schematic flowchart illustrating a dipole aligning method using an inkjet printing device according to an embodiment. FIGS. 23 to 29 are schematic views illustrating the dipole aligning method of FIG. 22.

Referring to FIGS. 1, 2, and 22 to 29, a method of aligning dipoles DP according to an embodiment may include spraying an ink I including a solvent SV in which the dipoles DP may be dispersed on a target substrate SUB (S100), generating an electric field on the target substrate SUB and disposing the dipoles DP on the target substrate SUB by the electric field (S200), and removing the solvent SV and measuring a position of each of the dipoles DP disposed on the target substrate SUB (S300).

The method of aligning the dipoles DP according to an embodiment may use the inkjet printing device 1000 described above with reference to FIGS. 1 and 2, and by disposing the dipoles DP on the target substrate SUB and measuring the position of each of the dipoles DP, a position of the inkjet head 335 that sprays the dipoles DP or the number of dipoles DP dispersed in the ink I may be adjusted.

Before spraying the ink I onto the target substrate SUB, the process of setting the inkjet printing device 1000 may be performed. The operation of setting the inkjet printing device 1000 may be an operation of tuning the inkjet printing device 1000 according to a target process. In order to perform the tuning precisely, an inkjet printing test may be performed on the above-described inspection substrate ISUB, and a reference value of the inkjet printing device 1000 may be adjusted according to the test result.

Here, the "reference value" may be determined according to a test process performed on the inspection substrate ISUB, and may be a reference for an error or deviation measured by a second sensing part 350 and a third sensing part 750 in the following operations. The second sensing part 350 and the third sensing part 750 may calculate a deviation by comparing the information measured during the process of the inkjet printing device 1000 with the reference value, and may feedback the calculated deviation to minimize the deviation. Examples of the reference value may include the amount of the ink I discharged from the inkjet head 335, a dropped position of the sprayed ink I, the alignment of the dipole DP sprayed onto the target substrate SUB, the number of dipoles DP per unit area, and the like, but embodiments are not limited thereto.

The operation of setting the inkjet printing device 1000 is described in more detail. First, the inspection substrate ISUB may be prepared. The inspection substrate ISUB may have the same structure as the target substrate SUB, but a substrate such as a glass substrate, a film, or the like may be used as the inspection substrate ISUB.

Although not shown in the drawing, an upper surface of the inspection substrate ISUB may be water-repellent treated. The water-repellent treatment may be performed by fluorine coating, plasma surface treatment, or the like.

Figure 23:
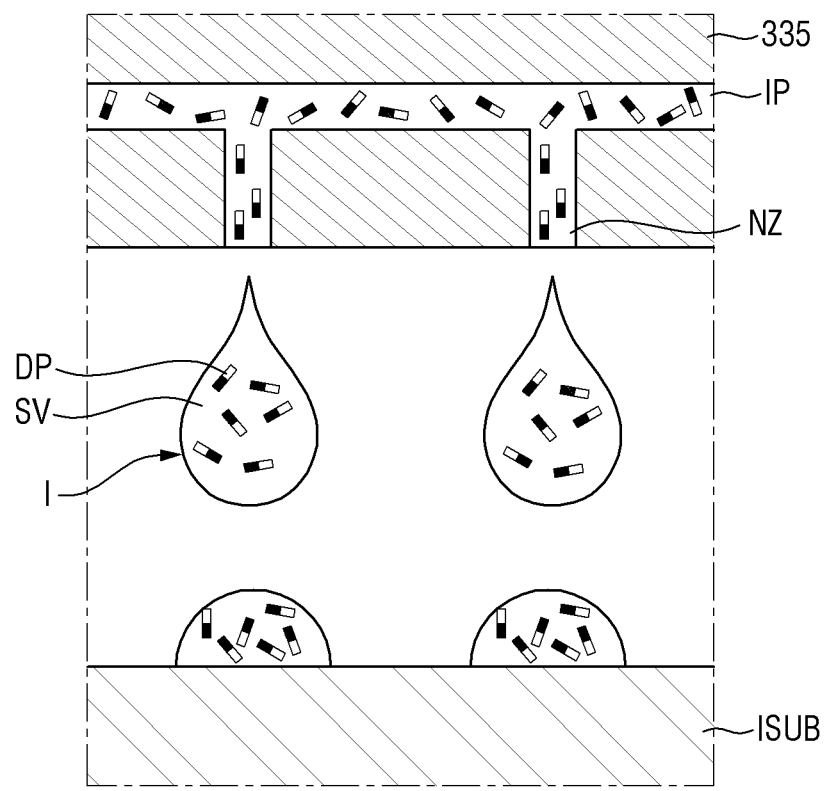
FIGS. 23 to 29 are schematic views illustrating the dipole aligning method of FIG. 22.
Figure 24:
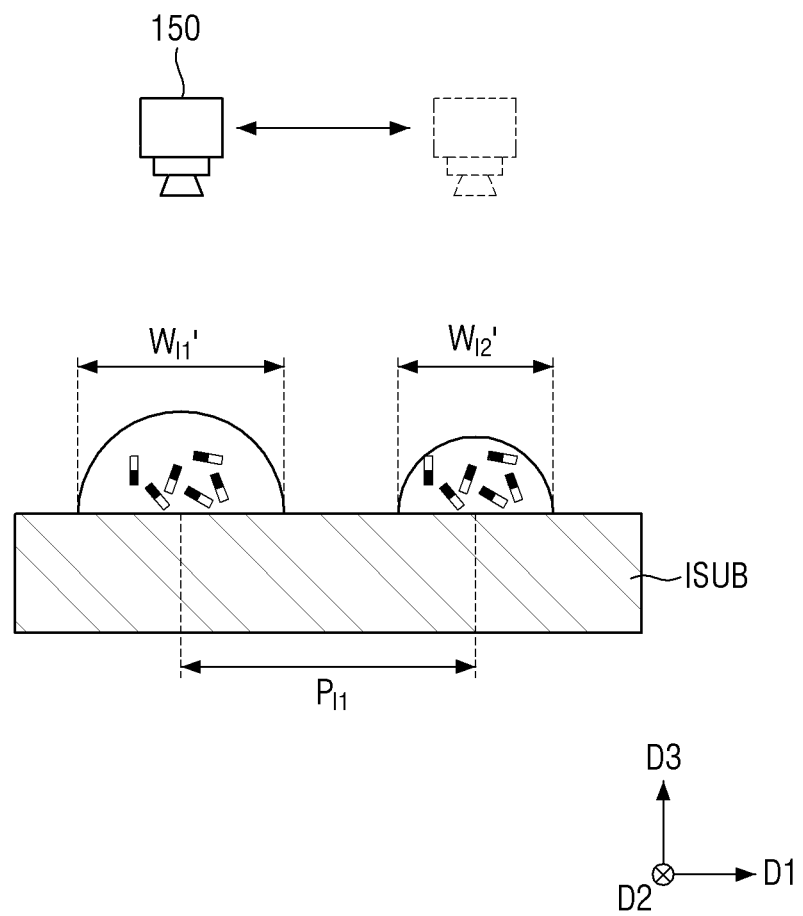

As shown in FIGS. 23 and 24, the ink I may be sprayed onto the upper surface of the inspection substrate ISUB, and a droplet size, a droplet amount, a position, or the like may be measured for each ink I by the first sensing part 150. In case that droplet sizes WI1' and WI2' or droplet amount of the ink I sprayed onto the inspection substrate ISUB, and a separation distance PI1 between the droplets of the link I are different from the reference value, the position or voltage of the inkjet head 335 may be adjusted so that the ink I corresponding the reference value may be sprayed. A method of adjusting the position of the inkjet head 335 may be the same as described above with reference to FIG. 10. The inspection method may be repeated several times until each inkjet head 335 sprays the ink I to satisfy the droplet amount or position corresponding to the reference value. However, the setting of the inkjet printing device 1000 may be omitted.

Figure 25:
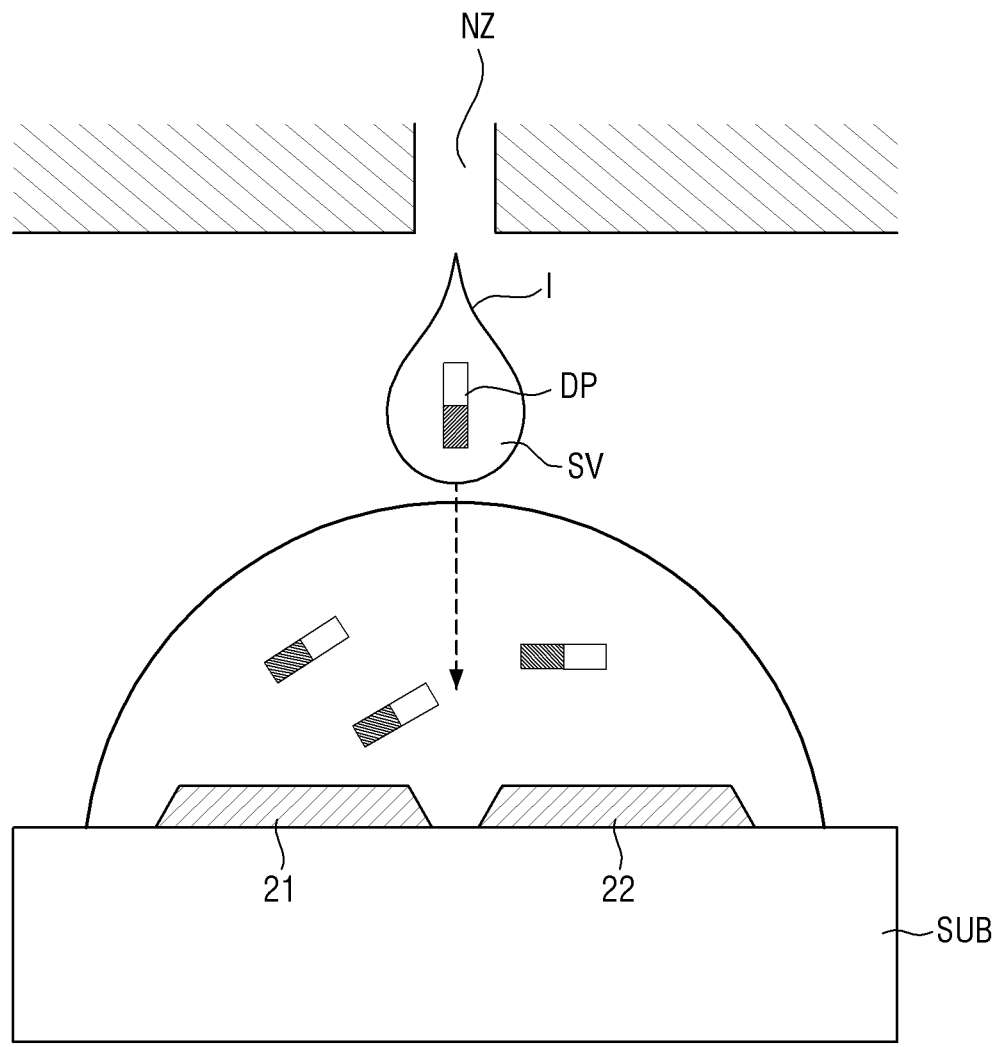

In case that the setting of the inkjet printing device 1000 is completed, as shown in FIG. 25, the ink I including the dipoles DP may be sprayed onto the target substrate SUB (S100). Here, the target substrate SUB may be prepared on a stage part 500 and moved to an inkjet head device 300 so that the ink I may be sprayed onto the target substrate SUB. As an example, the stage part 500 may be located at the heat treatment device 900 of FIG. 2 in the second direction D2, and at the position, the target substrate SUB may be prepared. However, embodiments are not limited thereto.

Further, in an embodiment, a first electrode 21 and a second electrode 22 may be formed on the target substrate SUB, and the ink I may be sprayed onto an upper portion of each of the first electrode 21 and the second electrode 22. It is illustrated in the drawing that the ink I may be sprayed onto one pair of electrodes as an example, but a larger number of electrode pairs may be formed on the target substrate SUB, and multiple inkjet heads 335 may spray the ink I onto each electrode pair in the same manner.

Although not shown in the drawing, the second sensing part 350 may continuously monitor the amount of the ink I discharged from the inkjet head 335 and the state of the inkjet head 335 during the process of the inkjet printing device 1000. The information measured by the second sensing part 350 may be provided to the inkjet head device 300 and an ink supply device 400, which will be controlled in case that there is a deviation between the reference value and the measured information. For example, in case that the amount of the ink discharged from the inkjet head 335 decreases as the process time passes, the voltage applied to the inkjet head 335 may be adjusted, and in case that the ink I in a nozzle NZ of the inkjet head 335 is dried and thus spots may be generated, a process of cleaning the inkjet head 335 may be performed. However, embodiments are not limited thereto.

Figure 26:
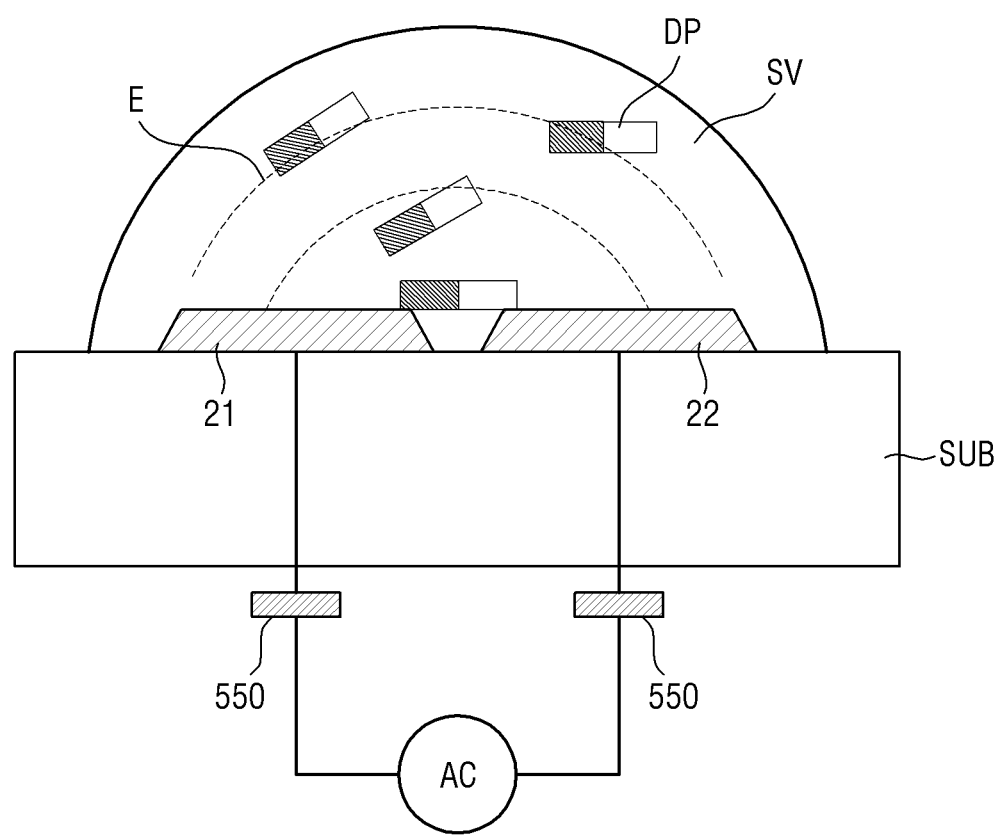

As shown in FIG. 26, an operation of forming an electric field E on the target substrate SUB and disposing the dipoles DP by the electric field E may be performed (S200). The dipoles DP may be disposed by a dielectrophoresis method. Specifically, an electrical signal may be applied to the first electrode 21 and the second electrode 22 from probe parts 550. The probe parts 550 may be connected to pads (not shown) provided on the target substrate SUB, and the electrical signal may be applied to the first electrode 21 and the second electrode 22 connected to the pads. In an embodiment, the electrical signal may have an AC voltage, and the AC voltage may have a voltage of ± about 10 to about 50 V and a frequency of about 10 kHz to about 1 MHz. In case that the AC voltage is applied to the first electrode 21 and the second electrode 22, the electric field E may be formed therebetween, and a dielectrophoretic force may be applied to the dipoles DP by the electric field E. The dipole DP may be disposed on the first electrode 21 and the second electrode 22 while the orientation direction and the position may be changed by the di electrophoretic force.

Figure 27:
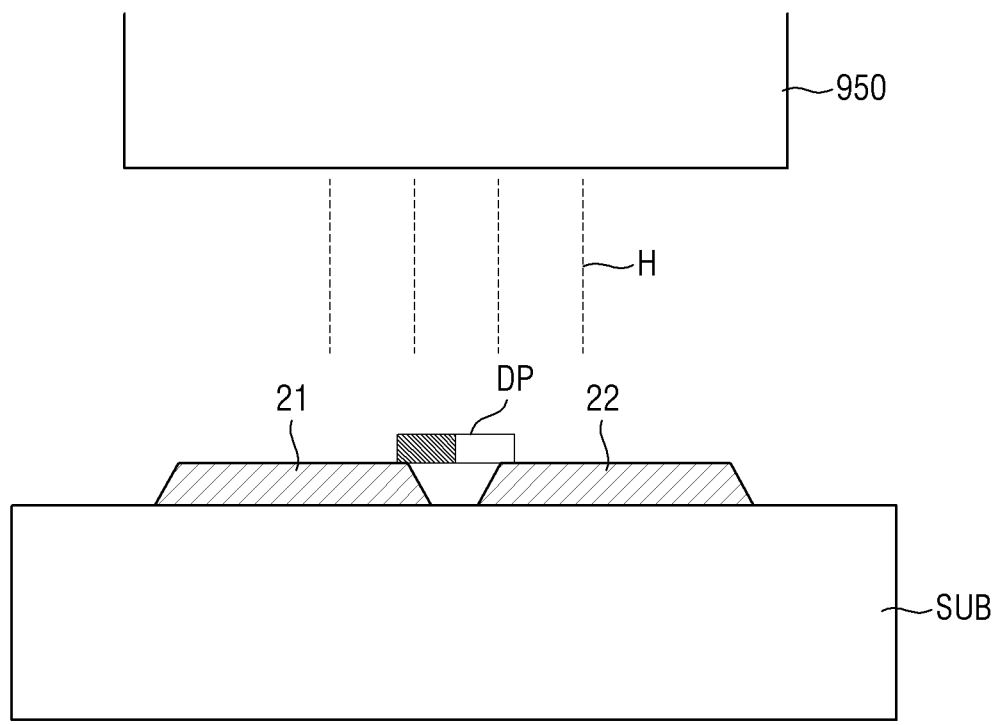

As shown in FIG. 27, the solvent SV of the ink I sprayed onto the target substrate SUB may be removed (S300). The operation of removing the solvent SV may be performed through the heat treatment device 900, and here, the stage part 500 may move from the inkjet head device 300 in the second direction D2 to be located at the heat treatment device 900. As an example, the heat treatment device 900 may emit heat H or infrared light onto the target substrate SUB, and the solvent SV may be volatilized or vaporized. A method of emitting the heat H or infrared light by the heat treatment device 900 may be the same as described above with reference to FIG. 16.

Since the solvent SV may be removed from the ink I sprayed onto the target substrate SUB, a flow of the dipole DP may be prevented and a coupling force between the dipole DP and the electrodes 21 and 22 may be increased. Accordingly, the dipole DP may be aligned on the first electrode 21 and the second electrode 22.

Figure 28:
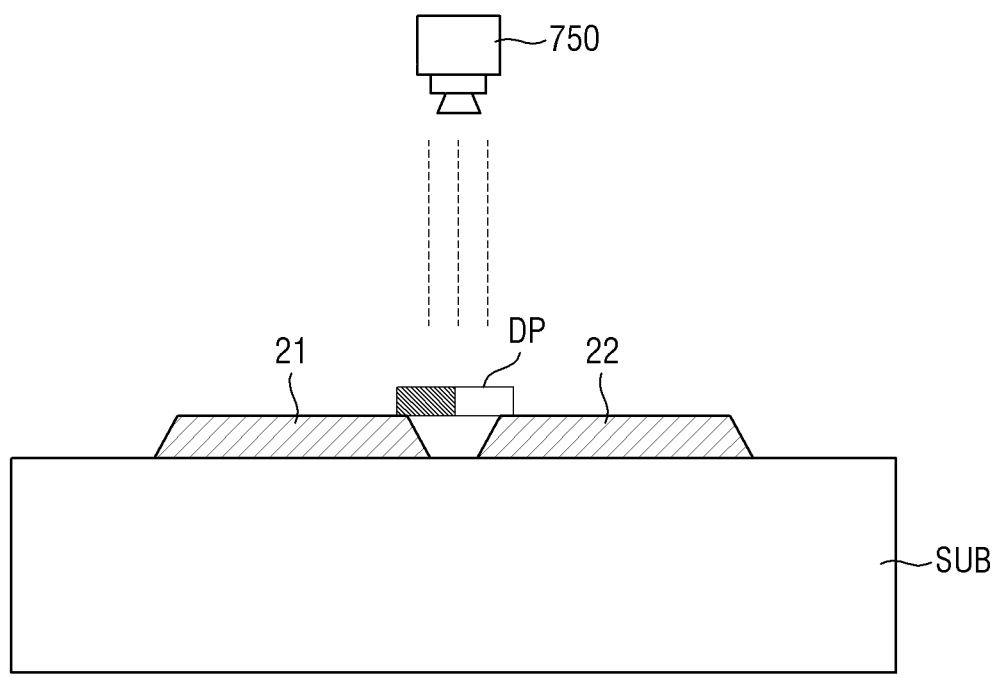
Figure 29:
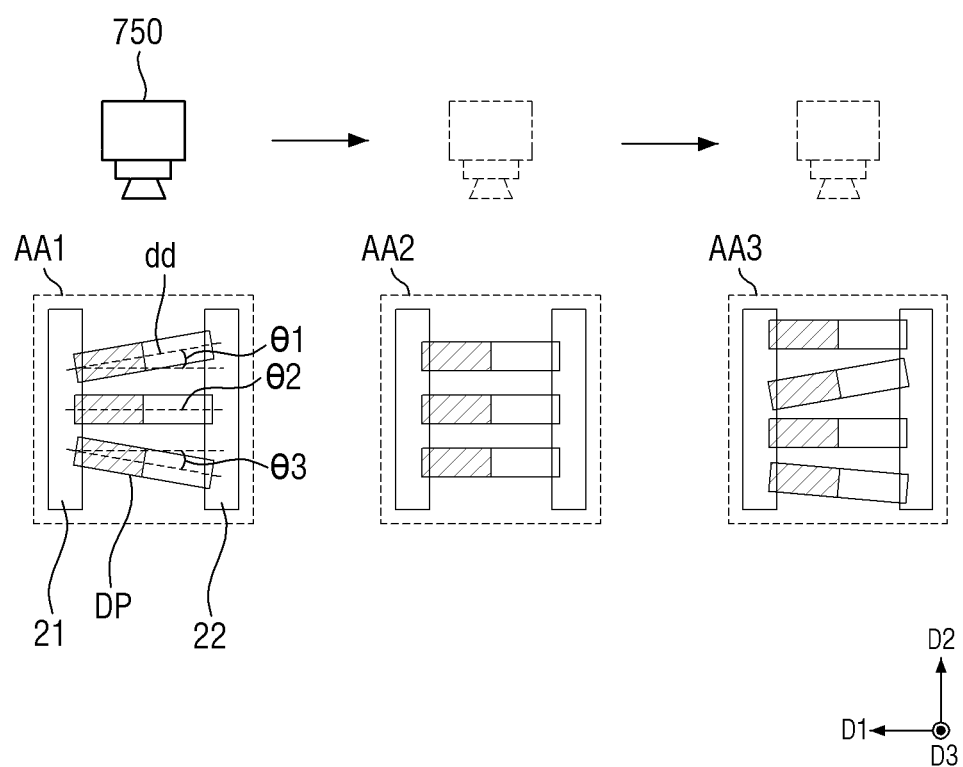

As shown in FIGS. 28 and 29, the position of the dipole DP disposed on the target substrate SUB may be measured using the third sensing part 750 (S300). A method of measuring the position of the dipole DP by the third sensing part 750 may be the same as described above with reference to FIGS. 18 and 19. In the measuring of the position of the dipole DP, the alignment of the dipoles DP may be measured, or the number of dipoles DP per unit area may be measured.

Specifically, as shown in FIG. 29, the third sensing part 750 measures the position of the dipole DP while moving in one direction, for example, the first direction D1 or the second direction D2. The alignment of the dipole DP may be performed by measuring acute angle Θ1, Θ2, and Θ3 each formed between one direction dd in which the dipole DP extends and a direction perpendicular to a direction in which the first and second electrodes 21 and 22 extend. As shown in the drawing, the third sensing part 750 may measure the acute angle formed by the direction in which the first and second electrodes 21 and 22 extend, for example, the second direction D2 and the direction in which the dipole DP extends, and may compare the measured acute angle with the reference value. For example, the reference value of the alignment of the dipole DP may have an acute angle, which may be formed by a direction dd in which the dipole DP extends and the direction perpendicular to the direction in which the electrodes 21 and 22 extend, in a range of about 0° to about 5°. However, embodiments are not limited thereto.

The third sensing part 750 may measure the number of dipoles DP per unit area AA. In the drawing, a first region AA1, a second region AA2, and a third region AA3, which may be defined as arbitrary regions, are illustrated. The third sensing part 750 may measure the number of dipole DP disposed in each of the regions AA1, AA2, and AA3 and compare the measured number to the reference value.

According to an embodiment, each of the first sensing part 150, the second sensing part 350, and the third sensing part 750 may perform comparison of the measured information with the reference value, thereby controlling the members of the inkjet printing device 1000. For example, the discharge amount of the ink I measured by the second sensing part 350, the alignment of the dipole DP measured by the third sensing part 750, and the information on the number of dipoles DP per unit area may each be transmitted to the inkjet head device 300. The inkjet head device 300 may receive the information to control an aligned state of the inkjet head 335 spraying the ink I, wash the nozzle NZ, and adjust the degree of dispersion of the dipoles DP in the provided ink I.

Accordingly, the inkjet printing device 1000 according to an embodiment may detect errors that may occur during the process of the inkjet printing device 1000 in real time by including at least one sensing part 150, 350, and 750. Each of the sensing parts 150, 350, and 750 may detect errors and defects generated during the process, and simultaneously compensate for the errors and defects while performing the process. Accordingly, the inkjet printing device 1000 may maintain the quality of the target substrate SUB including the finally manufactured dipoles DP even in case that the process is repeated several times.

The inkjet printing device 1000 according to an embodiment includes the inkjet head device 300, the heat treatment device 900, and an alignment inspection device 700, which may be sequentially arranged along one direction. The inkjet printing device 1000 may minimize the movement of the target substrate SUB during the process of spraying the ink I onto the target substrate SUB, removing the solvent SV of the ink I, and inspecting the alignment of the dipole DP. Accordingly, a process time of the inkjet printing device 1000 may be reduced, and in particular, after the ink I may be sprayed onto the target substrate SUB, the target substrate SUB may be consecutively passed through the heat treatment device 900 to volatilize the solvent SV, thereby preventing the problem of misalignment of the dipole DP.

The inkjet printing device 1000 may include one or more inkjet head devices 300. In the case of repeating a process of manufacturing a display device 1 (See FIG. 33), the process may be performed using another inkjet head device 300 while cleaning or re-aligning the inkjet head 335.

Figure 30:
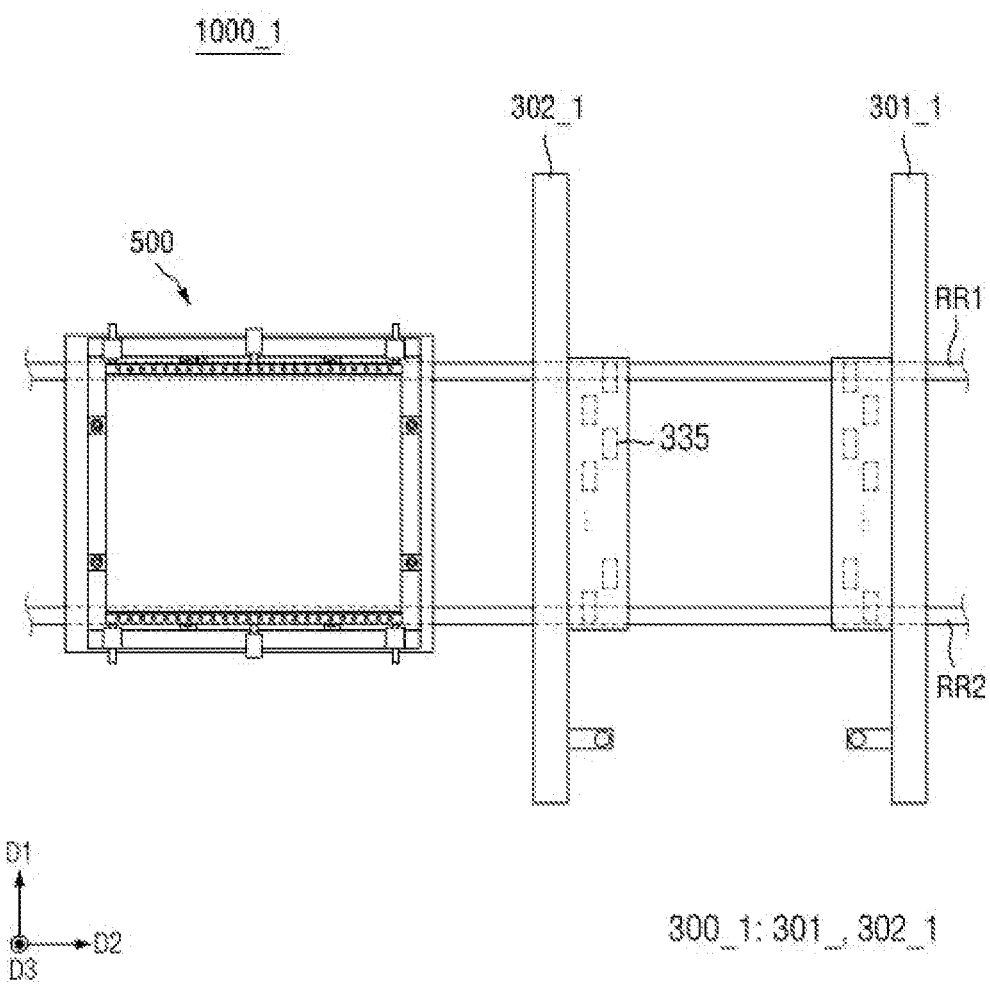
FIG. 30 is a schematic view illustrating an inkjet head device of an inkjet printing device according to another embodiment.

FIG. 30 is a schematic view illustrating an inkjet head device of an inkjet printing device according to another embodiment.

Referring to FIG. 30, an inkjet printing device 1000_1 according to another embodiment may include one or more inkjet head devices 300_1. The inkjet head devices 300_1 may include a first inkjet head device 301_1 and a second inkjet head device 302_1 which may be disposed to face each other and may have substantially the same structure. For example, the first inkjet head device 301_1 and the second inkjet head device 302_1 may each include multiple inkjet heads 335 to spray an ink I onto a target substrate SUB, and include a second sensing part 350 to inspect a state of the inkjet head 335.

In case that a problem occurs in the state of the inkjet head 335 measured by the second sensing part 350 during a manufacturing process of the display device 1, the spraying of the ink I may be stopped, and adjusting an initial setting value may be performed. For example, in case that the amount of the ink I discharged from the inkjet head 335 is not constant or a nozzle NZ is clogged, cleaning the inkjet heads 335 and readjusting positions of the inkjet heads 335 or a discharge amount of the ink I may be required. In case that any inkjet head device 300_1 stops the process of spraying the ink I, the inkjet printing device 1000_1 of FIG. 30 may operate another inkjet head device 300_1 to perform the manufacturing process of the display device 1. For example, initially, the inkjet printing device 1000_1 of FIG. 30 may drive the first inkjet head device 301_1 and may not drive the second inkjet head device 302_1, and in case that the first inkjet head device 301_1 is stopped, the inkjet printing device 1000_1 may drive the second inkjet head device 302_1.

Information measured by the second sensing part 350 and the third sensing part 750 may be provided to the first inkjet head device 301_1 and the second inkjet head device 302_1, and according to the information, alignment of the inkjet head 335 may be reflected in real time. For example, in case that the position of the dipole DP measured by the third sensing part 750 is different from a reference value as the first inkjet head device 301_1 may be driven, feedback on this may be provided to the second inkjet head device 302_1 to be reflected in real time during a printing process.

The inkjet printing device 1000 according to an embodiment may improve productivity and yield of the display device 1 or a target product by including one or more inkjet head devices 300 and reflecting information measured by the sensing parts 150, 350, and 750 in real time.

The above-described dipoles DP may be light-emitting elements including a conductive semiconductor, and according to an embodiment, a display device including the light-emitting elements may be manufactured using the inkjet printing device 1000.

Figure 31:
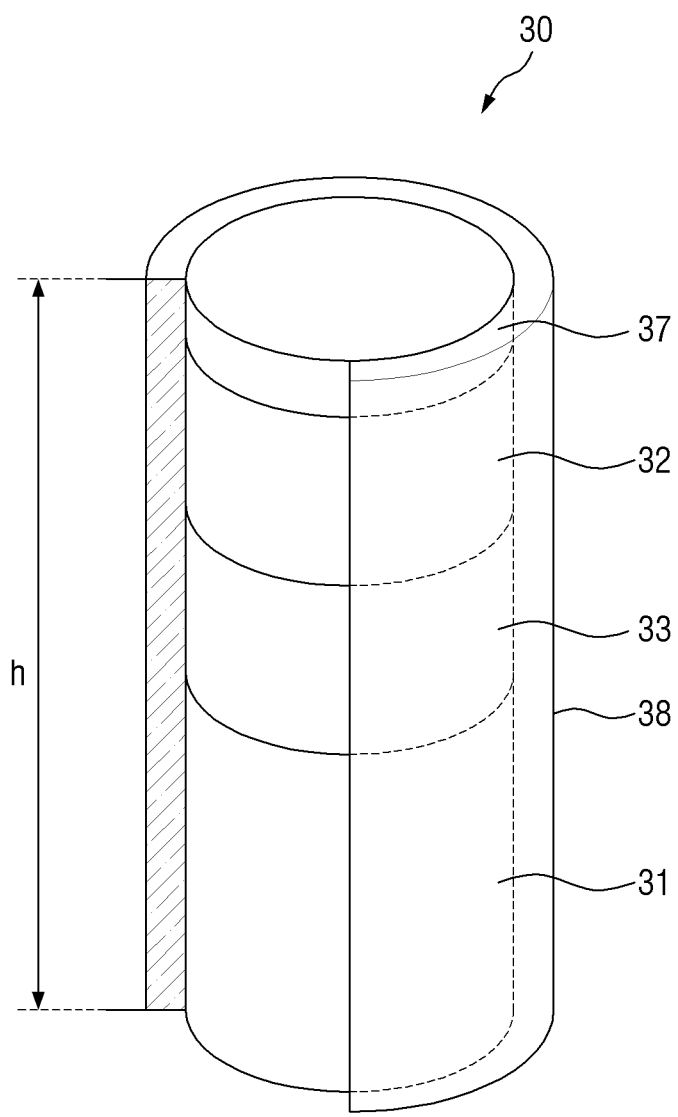
FIG. 31 is a schematic view of a light-emitting element according to an embodiment.

FIG. 31 is a schematic view of the light-emitting element according to an embodiment.

A light-emitting element 30 may include a semiconductor crystal doped with impurities (for example, p-type or n-type impurities). The semiconductor crystal may receive an electrical signal applied from an external power source and emit the received electrical signal as light in a specific wavelength band.

The light-emitting element 30 may be a light-emitting diode (LED), and specifically, may be an inorganic LED having a size of a micrometer or nanometer unit and made of an inorganic material. In a case in which the light-emitting element 30 may be an inorganic LED, in case that an electric field is formed in a specific direction between two electrodes, the inorganic LED may be aligned between the two electrodes having polarities. The light-emitting element 30 may receive an electrical signal from the electrodes and emit light in a specific wavelength band.

Referring to FIG. 31, the light-emitting element 30 according to an embodiment may include semiconductor layers 31 and 32, an active layer 33, an electrode material layer 37, and an insulating film 38. The semiconductor layers 31 and 32 may transmit an electrical signal, which may be transmitted to the light-emitting element 30, to the active layer 33, and the active layer 33 may emit light in a specific wavelength band.

Specifically, the light-emitting element 30 may include a first semiconductor layer 31, a second semiconductor layer 32, the active layer 33 disposed between the first semiconductor layer 31 and the second semiconductor layer 32, the electrode material layer 37 disposed on the second semiconductor layer 32, and the insulating film 38 disposed to surround outer surfaces of the first semiconductor layer 31, the second semiconductor layer 32, the active layer 33, and the electrode material layer 37. In FIG. 31, the light-emitting element 30 is illustrated as having a structure in which the first semiconductor layer 31, the active layer 33, the second semiconductor layer 32, and the electrode material layer 37 may be sequentially formed in a length direction thereof, but embodiments are not limited thereto.

The electrode material layer 37 may be omitted, and in some embodiments, may be disposed on at least one of both side surfaces of the first semiconductor layer 31 and the second semiconductor layer 32. For example, in the light-emitting element 30, the electrode material layer 37 may be further disposed on a lower surface of the first semiconductor layer 31. The following description of the light-emitting element 30 may identically apply even in case that the light-emitting element 30 further includes another structure.

The first semiconductor layer 31 may be a semiconductor layer doped with n-type impurities. As an example, in case that the light-emitting element 30 emits light having a blue wavelength band, the first semiconductor layer 31 may be made of a semiconductor material having a chemical formula of $In_xAl_yGa_{1-x-y}N(0<=x<=1, 0<=y<=1, $ and $0<=x+y<=1)$. For example, the first semiconductor layer 31 may be one or more of InAlGaN, GaN, AlGaN, InGaN, AlN, and InN that may be doped with n-type impurities. The first semiconductor layer 31 may be doped with a first dopant, and as an example, the first dopant may include Si, Ge, Sn, or the like. A length of the first semiconductor layer 31 may be greater than a length of the second semiconductor layer 32, which will be described later, and may have a range of about 1.5 μm to about 5 μm, but embodiments are not limited thereto.

The second semiconductor layer 32 may be a semiconductor layer doped with p-type impurities. As an example, in case that the light-emitting element 30 emits light having a blue wavelength band, the second semiconductor layer 32 may be made of a semiconductor material having a chemical formula of $In_xAl_yGa_{1-x-y}N(0<=x<=1, 0<=y<=1, $ and $0<=x+y<=1)$. For example, the second semiconductor layer 32 may be one or more of InAlGaN, GaN, AlGaN, InGaN, AlN, and InN that may be doped with p-type impurities. The second semiconductor layer 32 may be doped with a second dopant, and as an example, the second dopant may include Mg, Zn, Ca, Se, Ba, or the like. The second semiconductor layer 32 may have a length ranging from about 0.08 μm to about 0.25 μm, but embodiments are not limited thereto.

In the drawing, the first semiconductor layer 31 and the second semiconductor layer 32 are illustrated as being formed as one layer, but embodiments are not limited thereto. In some cases, according to a material of the active layer 33 to be described below, the first semiconductor layer 31 and the second semiconductor layer 32 may also include more layers.

The active layer 33 may be disposed between the first semiconductor layer 31 and the second semiconductor layer 32 and may include a material of a single quantum well structure or a multiple quantum well structure. In a case in which the active layer 33 includes a material having the multiple quantum well structure, the active layer 33 may have a structure in which multiple quantum layers and well layers may be alternately stacked. The active layer 33 may emit light due to a combination of electron-hole pairs in response to electrical signals applied through the first semiconductor layer 31 and the second semiconductor layer 32. For example, in a case in which the active layer 33 emits light in a blue wavelength band, the active layer 33 may include materials such as AlGaN and AlInGaN. In particular, in a case in which the active layer 33 has the multiple quantum well structure in which the quantum layers and well layers may be alternately stacked, the quantum layer may include materials such as AlGaN or AlInGaN, and the well layer may include materials such as GaN or AlGaN.

However, embodiments are not limited thereto, and the active layer 33 may have a structure in which semiconductor materials with large band-gap energy and semiconductor materials with small band-gap energy may be alternately stacked, or the active layer 33 may include different Group III or Group V semiconductor materials according to a wavelength band of light being emitted. The light emitted by the active layer 33 is not limited to light in the blue wavelength band, and in some cases, the active layer 33 may emit light in a red or green wavelength band. The active layer 33 may have a length ranging from about 0.05 μm to about 0.25 μm, but embodiments are not limited thereto.

The light emitted from the active layer 33 may be emitted not only to an outer surface of the light-emitting element 30 in the length direction, but also to side surfaces of the light-emitting element 30. The directionality of the light emitted from the active layer 33 may not be limited to one direction.

The electrode material layer 37 may be an ohmic contact electrode. However, embodiments are not limited thereto, and the electrode material layer 37 may also be a Schottky contact electrode. The electrode material layer 37 may include a conductive metal. For example, the electrode material layer 37 may include at least one selected from among aluminum (Al), titanium (Ti), indium (In), gold (Au), silver (Ag), indium tin oxide (ITO), indium zinc oxide (IZO), and indium tin zinc oxide (ITZO). The electrode material layer 37 may include the same material or include different materials, but embodiments are not limited thereto.

The insulating film 38 may be in contact with the first semiconductor layer 31, the second semiconductor layer 32, the active layer 33, and the electrode material layer 37, and may be formed to surround the outer surfaces of the first semiconductor layer 31, the second semiconductor layer 32, the active layer 33, and the electrode material layer 37. The insulating film 38 may serve to protect the above members. As an example, the insulating film 38 may be formed to surround side surfaces of the members and may be formed to expose both end portions of the light-emitting element 30 in the length direction thereof. However, embodiments are not limited thereto.

The insulating film 38 may include an insulating material such as silicon oxide ($SiO_x$), silicon nitride ($SiN_x$), silicon oxynitride ($SiO_xN_y$), aluminum nitride (AlN), aluminum oxide ($Al_2O_3$), or the like, or a combination thereof. Accordingly, it may be possible to prevent an electrical short circuit which may occur in case that the active layer 33 is in direct contact with an electrode through which an electrical signal may be transmitted to the light-emitting element 30. Further, since the insulating film 38 protects the outer surface of the light-emitting element 30 including the active layer 33, it may be possible to prevent a decrease in light emission efficiency.

In FIG. 31, the insulating film 38 may be illustrated as being formed to extend in the length direction of the light-emitting element 30 and to cover the first semiconductor layer 31 to the electrode material layer 37, but embodiments are not limited thereto. The insulating film 38 may cover only the first semiconductor layer 31, the active layer 33, and the second semiconductor layer 32, or may cover only a portion of the outer surface of the electrode material layer 37 to expose a portion of the outer surface of the electrode material layer 37. In some embodiments, the insulating film 38 may cover only the outer surfaces of the first semiconductor layer 31, the active layer 33, and the second semiconductor layer 32, and the outer surface of the electrode material layer 37 disposed on a lower surface of the first semiconductor layer 31 and an upper surface of the second semiconductor layer 32 may be exposed.

The insulating film 38 may have a thickness ranging from about 0.5 μm to about 1.5 μm, but embodiments are not limited thereto.

Also, in some embodiments, an outer surface of the insulating film 38 may be surface-treated. In case that the display device 1 is manufactured, the light-emitting elements 30 may be aligned by being sprayed on electrodes in a state of being dispersed in an ink. Here, in order to maintain a state in which the light-emitting elements 30 may be dispersed in the ink without aggregating with other adjacent light-emitting elements 30, the surface of the insulating film 38 may be treated to be hydrophobic or hydrophilic.

The light-emitting element 30 may have a shape extending in a direction. The light-emitting element 30 may have a shape of a nano-rod, a nano-wire, a nano-tube, or the like. In an embodiment, the light-emitting element 30 may have a cylindrical shape or a rod shape. However, the shape of the light-emitting element 30 is not limited thereto and may be various other shapes such as a cubic shape, a rectangular parallelepiped shape, or a hexagonal prism shape.

Figure 32:
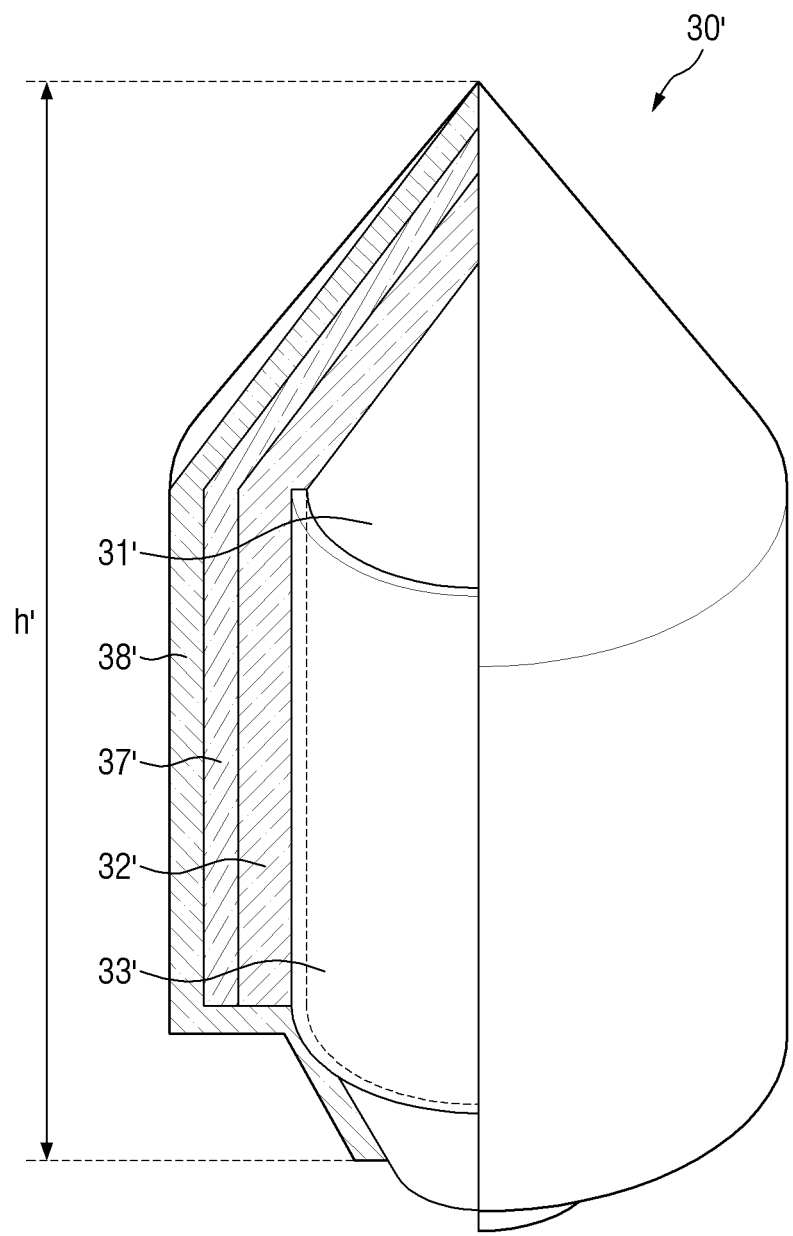
FIG. 32 is a schematic view of a light-emitting element according to another embodiment.

FIG. 32 is a schematic view of a light-emitting element according to another embodiment.

Referring to FIG. 32, a light-emitting element 30' may be formed so that layers may surround outer surfaces of other layers without being stacked in a direction. The light-emitting element 30' of FIG. 32 may be identical to the light-emitting element 30 of FIG. 31 except that shapes of the layers may be partially different. Hereinafter, redundant description will be omitted, and differences will be described.

According to an embodiment, a first semiconductor layer 31' may extend in a direction and have end portions formed to be inclined toward a center portion. The first semiconductor layer 31' of FIG. 32 may include a body portion with a rod-like shape or a cylindrical shape and upper and lower end portions with a conical shape formed on and below the body portion. The upper end portion on the body portion may have a steeper inclination than the lower end portion.

An active layer 33' may be disposed to surround an outer surface of the body portion of the first semiconductor layer 31'. The active layer 33' may have an annular shape extending in a direction. The active layer 33' may not be formed on an upper end portion and a lower end portion of the first semiconductor layer 31'. For example, the active layer 33' may be in contact with only a parallel side surface of the first semiconductor layer 31'.

A second semiconductor layer 32' may be disposed to surround an outer surface of the active layer 33' and the upper end portion of the first semiconductor layer 31'. The second semiconductor layer 32' may include an annular body portion extending in a direction and an upper end portion having a side surface formed to be inclined. For example, the second semiconductor layer 32' may be in direct contact with a parallel side surface of the active layer 33' and the inclined upper end portion of the first semiconductor layer 31'. However, the second semiconductor layer 32' may not be formed in the lower end portion of the first semiconductor layer 31'.

An electrode material layer 37' may be disposed to surround an outer surface of the second semiconductor layer 32'. For example, a shape of the electrode material layer 37' may be substantially the same as a shape of the second semiconductor layer 32'. For example, the electrode material layer 37' may be in full contact with the outer surface of the second semiconductor layer 32'.

An insulating film 38' may be disposed to surround outer surfaces of the electrode material layer 37' and the first semiconductor layer 31'. The insulating film 38' may be in direct contact with the lower end portion of the first semiconductor layer 31' and exposed lower end portions of the active layer 33' and the second semiconductor layer 32', including electrode material layer 37'.

A length h (or h') of a light-emitting element 30 (or 30') may be in a range of about 1 μm to about 10 μm or in a range of about 2 μm to about 5 μm, and may be, e.g., about 4 μm. Also, a diameter of a light-emitting element 30 may be in a range of about 30 nm to about 700 nm, and the light-emitting elements 30 included in the display device 1 may have different diameters according to a difference in composition of the active layer 33. For example, each of the light-emitting elements 30 may have a diameter of about 500 nm.

According to an embodiment, the inkjet printing device 1000 may disperse the light-emitting elements 30 of FIG. 31 or the light-emitting elements 30' of FIG. 32 in the ink I to spray or discharge onto the target substrate SUB, and in this way, the display device 1 including the light-emitting elements 30 may be manufactured.

Figure 33:
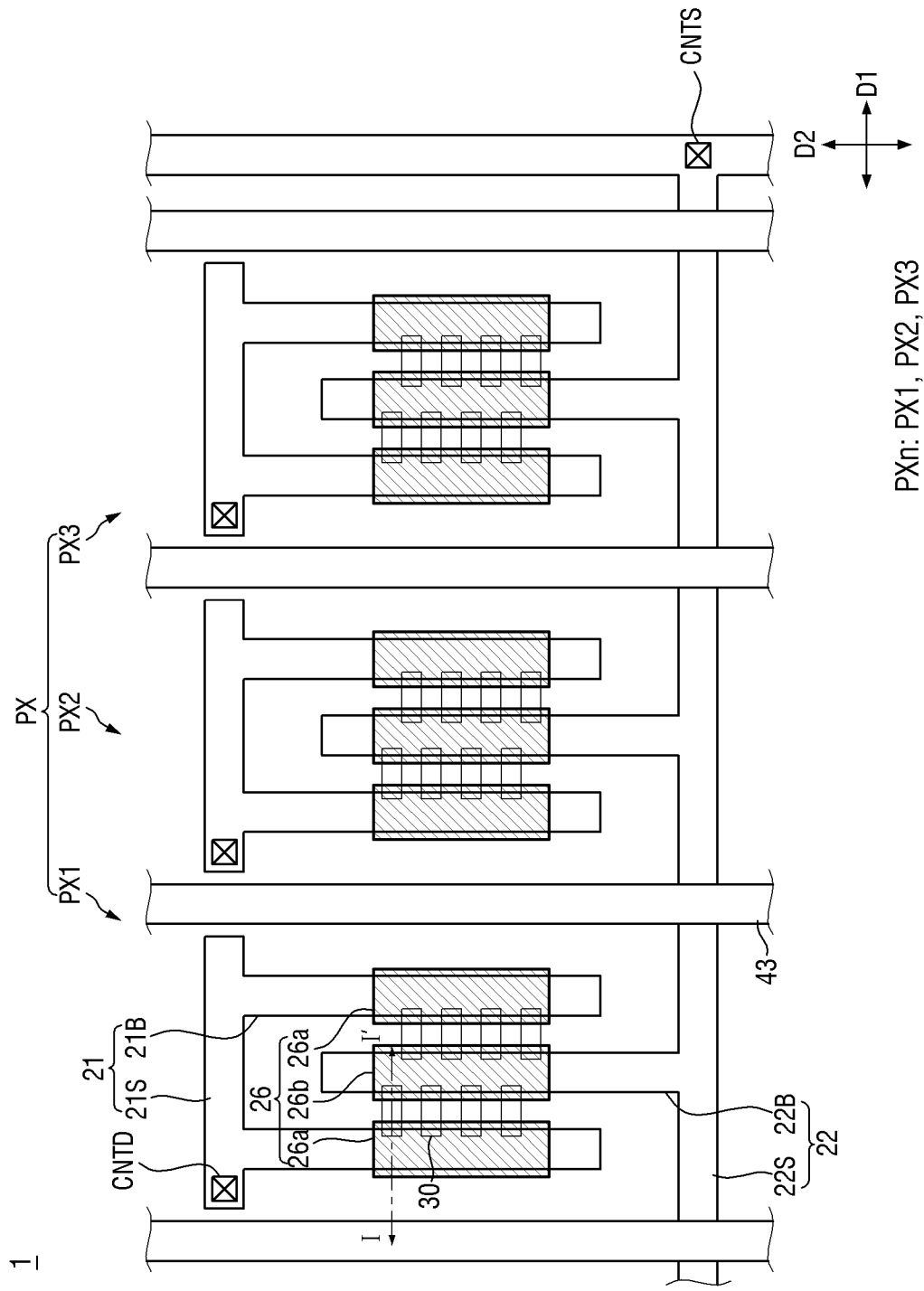
FIG. 33 is a schematic plan view of a display device manufactured using the method according to an embodiment.

FIG. 33 is a schematic plan view of a display device manufactured using the method according to an embodiment.

Referring to FIG. 33, the display device 1 may include pixels PX. The pixels PX may each include one or more light-emitting elements 30, which may emit light in a specific wavelength band, to display a specific color.

In an embodiment, each of the pixels PX may include sub-pixels PXn in which the light-emitting element 30 may be disposed to emit light in an arbitrary wavelength band. The sub-pixels PXn may be distinguished from each other based on banks, for example, third banks 43 disposed between neighboring sub-pixels PXn.

As shown in FIG. 33, a pixel PX may include a first sub-pixel PX1, a second sub-pixel PX2, and a third sub-pixel PX3. The first sub-pixel PX1, the second sub-pixel PX2, and the third sub-pixel PX3 may be distinguished from each other with respect to the third banks 43 extending in a second direction D2. However, embodiments are not limited thereto, and it may be understood that a third bank 43 may be further disposed to extend in a first direction D1 above and below one sub-pixel PXn, and each of the sub-pixels PXn may be a region surrounded by the third bank 43.

The first sub-pixel PX1 may emit light of a first color, the second sub-pixel PX2 may emit light of a second color, and the third sub-pixel PX3 may emit light of a third color. The first color may be a red color, the second color may be a green color, and the third color may be a blue color, but embodiments are not limited thereto, and each sub-pixel PXn may emit light of the same color.

However, embodiments are not limited thereto, and it may be understood that each of the pixels PX includes a larger number of sub-pixels or each of the pixels PX may include, e.g., only one sub-pixel PXn and thus one sub-pixel PXn may be a unit corresponding to one pixel PX. For example, the first sub-pixel PX1, the second sub-pixel PX2, and the third sub-pixel PX3, which are described above, are for illustrating that one pixel PX includes three sub-pixels PX1, PX2, and PX3, each of which may emit light of a different color, and a pixel PX is not necessarily limited to including the sub-pixels PXn. In this case, it may be understood that each of the pixels PX may be configured as one sub-pixel PXn and may emit light of a different color from those of the different pixels PX, and the regions surrounded by the third banks 43 may constitute one pixel PX.

Each pixel PX or sub-pixels PXn of the display device 1 may include regions defined as a light-emitting region and a non-light emitting region. The light-emitting region may be defined as a region in which the light-emitting elements 30 included in the display device 1 may be disposed and from which light in a specific wavelength band may be emitted. The non-light emitting region may be a region other than the light-emitting region and may be defined as a region in which the light-emitting elements 30 may not be disposed and from which light may not be emitted.

The sub-pixels PXn of the display device 1 may include banks 41, 42, and 43, electrodes 21 and 22, and the light-emitting elements 30.

The electrodes 21 and 22 may be electrically connected to the light-emitting elements 30 and may receive a voltage so that the light-emitting elements 30 emit light. At least a portion of each of the electrodes 21 and 22 may be used to form an electric field in the sub-pixel PXn in order to align the light-emitting elements 30. However, embodiments are not limited thereto, and in some cases, the electric field may also be formed by a separate alignment signal application device.

The electrodes 21 and 22 are described in detail with reference to FIG. 33. The electrodes 21 and 22 may include a first electrode 21 and a second electrode 22. In an embodiment, the first electrode 21 may be a pixel electrode separated for each sub-pixel PXn, and the second electrode 22 may be a common electrode connected in common along each sub-pixel PXn. One of the first electrode 21 and the second electrode 22 may be an anode of the light-emitting element 30, and the other thereof may be a cathode of the light-emitting element 30. However, embodiments are not limited thereto and the reverse of the above description may be possible.

The first electrode 21 and the second electrode 22 may respectively include electrode stem portions 21S and 22S disposed to extend in the first direction D1 and one or more electrode branch portions 21B and 22B that extend and branch from the electrode stem portions 21S and 22S in the second direction D2 that may be perpendicular to the first direction D1.

Specifically, the first electrode 21 may include a first electrode stem portion 21S disposed to extend in the first direction D1 and one or more first electrode branch portions 21B that branch from the first electrode stem portion 21S and extend in the second direction (Y-axis direction).

The first electrode stem portion 21S of a pixel may have ends that may be spaced apart and terminated between the sub-pixels PXn and may be substantially collinear with the first electrode stem portion 21S of a neighboring sub-pixel that belongs to the same row (e.g., may be adjacent in the first direction D1). Accordingly, the first electrode stem portion 21S disposed in each sub-pixel PXn may apply different electrical signals to each first electrode branch portion 21B, and the first electrode branch portions 21B may be driven separately.

The first electrode branch portion 21B may branch from at least a portion of the first electrode stem portion 21S, may extend in the second direction D2, and may be terminated while being spaced apart from a second electrode stem portion 22S that may be disposed opposite to the first electrode stem portion 21S.

The second electrode 22 may include the second electrode stem portion 22S that extends in the first direction D1 and may be spaced apart from and opposite to the first electrode stem portion 21S, and a second electrode branch portion 22B that may be disposed to branch from the second electrode stem portion 22S and extend in the second direction D2. However, the other end portion of the second electrode stem portion 22S may extend to the sub-pixels PXn that may be adjacent thereto in the first direction D1. Accordingly, the second electrode stem portion 22S of pixel may have ends that may be connected to the second electrode stem portion 22S of a neighboring pixel between the pixels PX.

The second electrode branch portion 22B may be spaced apart from and opposite to the first electrode branch portion 21B and may be terminated while being spaced apart from the first electrode stem portion 21S. For example, the second electrode branch portion 22B may be disposed in the sub-pixel PXn while one end portion may be connected to the second electrode stem portion 22S and the other end portion may be spaced apart from the first electrode stem portion 21S.

It is illustrated in the drawing that two first electrode branch portions 21B are disposed and the second electrode branch portion 22B is disposed therebetween, but embodiments are not limited thereto.

The banks 41, 42, and 43 may include the third bank 43 disposed at a boundary between the sub-pixels PXn and a first bank 41 and a second bank 42 that may be respectively disposed at lower portions of the electrodes 21 and 22. Although the first bank 41 and the second bank 42 are not illustrated in the drawing, the first bank 41 and the second bank 42 may be disposed at lower portions of the first electrode branch portion 21B and the second electrode branch portion 22B, respectively.

The third bank 43 may be disposed at the boundary between the sub-pixels PXn. Electrode stem portions 21S may have end portions that may be spaced apart from each other and terminated based on the third bank 43. The third bank 43 may extend in the second direction D2 and may be disposed at the boundary between the sub-pixels PXn arranged in the first direction D1. However, embodiments are not limited thereto, and the third bank 43 may extend in the first direction D1 and may be disposed at the boundary between the sub-pixels PXn arranged in the second direction D2. The sub-pixels PXn may be differentiated based on the third bank 43. The third bank 43 may include the same material as the first and second banks 41 and 42 and thus may be formed in substantially the same process as the first and second banks 41 and 42.

Although not shown in the drawing, a first insulating layer 51 may be disposed in each sub-pixel PXn to entirely cover the sub-pixel PXn including the first electrode branch portion 21B and the second electrode branch portion 22B. The first insulating layer 51 may simultaneously protect the electrodes 21 and 22 and insulate the electrodes 21 and 22 from each other so that the electrodes 21 and 22 may not come in direct contact.

The light-emitting elements 30 may be aligned between the first electrode branch portion 21B and the second electrode branch portion 22B. At least some of the light-emitting elements 30 may have one end portion electrically connected to the first electrode branch portion 21B and the other end portion electrically connected to the second electrode branch portion 22B.

The light-emitting elements 30 may be spaced apart from each other in the second direction D2 and aligned so as to be substantially parallel to each other. A separation distance between the light-emitting elements 30 is not particularly limited. In some cases, light-emitting elements 30 may be disposed adjacent to each other to form a group, and the other light-emitting elements 30 may form a group in a state of being spaced apart therefrom at an interval, may have a non-uniform density, and may be oriented and aligned in a direction.

Contact electrodes 26 may be disposed on the first electrode branch portion 21B and the second electrode branch portion 22B. However, the contact electrode 26 may be disposed substantially on the first insulating layer 51, and at least some of the contact electrodes 26 may come into contact with or may be electrically connected to the first electrode branch portion 21B and the second electrode branch portion 22B.

The contact electrodes 26 may be disposed to extend in the second direction D2 and disposed to be spaced apart from each other in the first direction D1. Each of the contact electrodes 26 may come into contact with at least one end portion of the light-emitting element 30, and the contact electrode 26 may come into contact with the first electrode 21 or the second electrode 22 to receive an electrical signal. Accordingly, the contact electrode 26 may transmit an electrical signal, which may be transmitted from each of the electrodes 21 and 22, to the light-emitting element 30.

The contact electrodes 26 may include a first contact electrode 26a and a second contact electrode 26b. The first contact electrode 26a may be disposed on the first electrode branch portion 21B and may come into contact with one end portion of the light-emitting element 30, and the second contact electrode 26b may be disposed on the second electrode branch portion 22B and may come into contact with the other end portion of the light-emitting element 30.

The first electrode stem portion 21S and the second electrode stem portion 22S may be electrically connected to a circuit element layer of the display device 1 through contact holes, e.g., a first electrode contact hole CNTD and a second electrode contact hole CNTS, respectively. It is illustrated in the drawing that one second electrode contact hole CNTS is formed in the second electrode stem portion 22S of the sub-pixels PXn. However, embodiments are not limited thereto, and in some cases, the second electrode contact hole CNTS may be formed in each sub-pixel PXn.

Figure 34:
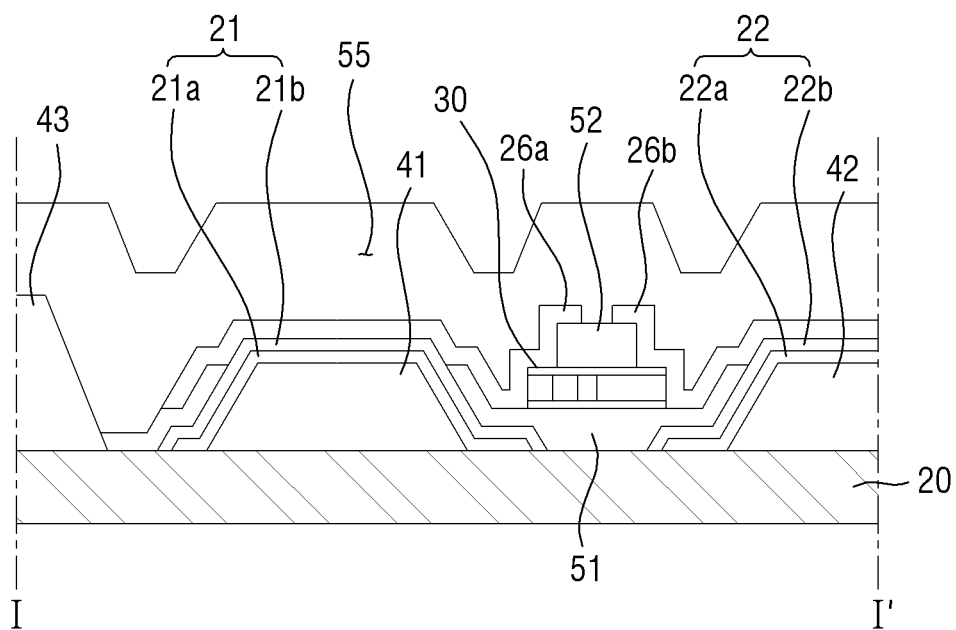
FIG. 34 is a partial schematic cross-sectional view of the display device taken along line I-I' of FIG. 33.

Although not shown in the drawing, the display device 1 may include a second insulating layer 52 (shown in FIG. 34) which may be disposed to at least partially cover each of the electrodes 21 and 22 and the light-emitting element 30 and a passivation layer 55 (shown in FIG. 34). The arrangement and structure therebetween will be described below with reference to FIG. 34.

FIG. 34 is a partial schematic cross-sectional view of the display device taken along line I-I' of FIG. 33.

FIG. 34 only illustrates a cross-sectional view of the first sub-pixel PX1, but the cross-sectional view may be identically applied to other pixels PX or sub-pixels PXn. FIG. 34 illustrates a cross section traversing an end portion and another end portion of an arbitrary light-emitting element 30.

Although not illustrated in FIG. 34, the display device 1 may further include the circuit element layer disposed at the lower portion of each of the electrodes 21 and 22. The circuit element layer may include semiconductor layers and conductive patterns and may include at least one transistor and a power line. However, hereinafter, detailed description of aspects may be omitted in the interest of brevity.

Referring to FIG. 34, the display device 1 may include a via layer 20, the electrodes 21 and 22 and the light-emitting element 30 disposed on the via layer 20, and the like. A circuit element layer (not shown) may be further disposed at a lower portion of the via layer 20. The via layer 20 may include an organic insulating material and perform a surface planarization function.

The banks 41, 42, and 43 may be disposed on the via layer 20. The banks 41, 42, and 43 may be disposed to be spaced apart from each other in each sub-pixel PXn. The banks 41, 42, and 43 may include the first and second banks 41 and 42 that may be disposed to be adjacent to a center portion of the sub-pixel PXn and the third bank 43 disposed at the boundary between the sub-pixels PXn.

In case that the ink I is sprayed using the above-described inkjet printing device 1000 of FIGS. 1 and 2 during manufacture of the display device 1, the third bank 43 may serve to prevent the ink I from flowing over the boundary between the sub-pixels PXn. In other embodiments, in a case in which the display device 1 further includes another member, the member may be disposed on the third bank 43, and the third bank 43 may serve to support the member. However, embodiments are not limited thereto.

The first bank 41 and the second bank 42 may be disposed to be spaced apart from and opposite to each other. The first electrode 21 may be disposed on the first bank 41, and the second electrode 22 may be disposed on the second bank 42. It may be understood that, in FIGS. 33 and 34, the first electrode branch portion 21B may be disposed on the first bank 41 and the second electrode branch portion 22B may be disposed on the second bank 42.

As described above, the first bank 41, the second bank 42, and the third bank 43 may be formed in substantially the same process. Accordingly, the banks 41, 42, and 43 may also form a grid pattern. The banks 41, 42, and 43 may include polyimide (PI).

The banks 41, 42, and 43 may have a structure of which at least a portion protrudes based on the via layer 20. The banks 41, 42, and 43 may protrude upward based on a plane on which the light-emitting elements 30 may be disposed, and at least a portion of the protruding portion may have a slope. The shape of the banks 41, 42, and 43 having the protruding structure is not particularly limited. As illustrated in the drawing, the first bank 41 and the second bank 42 may protrude to the same height while the third bank 43 may protrude to a higher position.

Reflective layers 21a and 22a may be disposed on the first bank 41 and the second bank 42, respectively, and electrode layers 21b and 22b may be disposed on the reflective layers 21a and 22a, respectively. The reflective layers 21a and 22a and the electrode layers 21b and 22b may respectively constitute the electrodes 21 and 22.

The reflective layers 21a and 22a may include a first reflective layer 21a and a second reflective layer 22a. The first reflective layer 21a may cover the first bank 41, and the second reflective layer 22a may cover the second bank 42. Portions of the reflective layers 21a and 22a may be electrically connected to the circuit element layer through contact holes that may pass through the via layer 20.

The reflective layers 21a and 22a may include a material having high reflectivity and reflect light emitted from the light-emitting element 30. As an example, the reflective layers 21a and 22a may include materials such as silver (Ag), copper (Cu), indium tin oxide (ITO), indium zinc oxide (IZO), and indium tin-zinc oxide (ITZO), or a combination thereof, but embodiments are not limited thereto.

The electrode layers 21b and 22b may include a first electrode layer 21b and a second electrode layer 22b. The electrode layers 21b and 22b may have substantially the same pattern as the reflective layers 21a and 22a. The first reflective layer 21a and the first electrode layer 21b may be disposed to be spaced apart from the second reflective layer 22a and the second electrode layer 22b.

The electrode layers 21b and 22b may include a transparent conductive material, and emitted light that may be emitted from the light-emitting element 30 may be incident on the reflective layers 21a and 22a. For example, the electrode layers 21b and 22b may include materials such as indium tin oxide (ITO), indium zinc oxide (IZO), indium tin zinc oxide (ITZO), or a combination thereof, but embodiments are not limited thereto.

In some embodiments, the reflective layers 21a and 22a and the electrode layers 21b and 22b may have a structure in which one or more transparent conductive layers made of ITO, IZO, ITZO, or the like and one or more metal layers made of copper or the like may be stacked. For example, the reflective layers 21a and 22a and the electrode layers 21b and 22b may also have a stacked structure of ITO/Ag/ITO/IZO.

In some embodiments, the first electrode 21 and the second electrode 22 may be formed as one layer. For example, the reflective layers 21a and 22a and the electrode layers 21b and 22b may be formed as one layer, and the layer may simultaneously transmit an electrical signal to the light-emitting element 30 and reflect light. In an embodiment, the first electrode 21 and the second electrode 22 may include a conductive material having high reflectivity. For example, the first electrode 21 and the second electrode 22 may be made of an alloy including aluminum (Al), nickel (Ni), lanthanum (La), and the like. However, embodiments are not limited thereto.

The first insulating layer 51 may be disposed to partially cover the first electrode 21 and the second electrode 22. The first insulating layer 51 may be disposed to cover most of the upper surface of each of the first electrode 21 and the second electrode 22 and may allow portions of the first electrode 21 and the second electrode 22 to be exposed. The first insulating layer 51 may be disposed to also partially cover a region in which the first electrode 21 and the second electrode 22 may be spaced apart and the sides of the first electrode 21 and the second electrode 22 that may be opposite to the region.

The first insulating layer 51 may be disposed so that a relatively planar upper surface of each of the first electrode 21 and the second electrode 22 may be exposed and may be disposed so that the electrodes 21 and 22 overlap inclined side surfaces of the first bank 41 and the second bank 42. The first insulating layer 51 may have a planar upper surface so that the light-emitting element 30 may be disposed thereon, and the upper surface may extend in one direction toward the first electrode 21 and the second electrode 22. The extending portion of the first insulating layer 51 may be terminated at the inclined side surfaces of the first electrode 21 and the second electrode 22. Accordingly, the contact electrode 26 may be in contact with the exposed portions of the first electrode 21 and the second electrode 22 and may smoothly come into contact with the light-emitting element 30 on the planar upper surface of the first insulating layer 51.

The first insulating layer 51 may protect the first electrode 21 and the second electrode 22 and simultaneously, insulate the first electrode 21 and the second electrode 22 from each other. The first insulating layer 51 may prevent the light-emitting element 30, which may be disposed on the first insulating layer 51, from coming in direct contact with other members and causing damage thereto.

The light-emitting element 30 may be disposed on the first insulating layer 51. At least one light-emitting element 30 may be disposed on the first insulating layer 51 between the first electrode 21 and the second electrode 22. In the light-emitting element 30, layers may be disposed in a direction horizontal to the via layer 20. In the light-emitting element 30 of the display device 1 according to an embodiment, the first semiconductor layer 31, the active layer 33, the second semiconductor layer 32, and the electrode material layer 37 may be sequentially disposed in a direction horizontal to the via layer 20. However, embodiments are not limited thereto. The order in which the layers of the light-emitting element 30 may be disposed may be reversed, and in some cases, in case that the light-emitting element 30 has a different structure, the layers may be disposed in a direction perpendicular to the via layer 20.

The second insulating layer 52 may be partially disposed on the light-emitting element 30. The second insulating layer 52 may simultaneously protect the light-emitting element 30 and fix the light-emitting element 30 in the process of manufacturing the display device 1. The second insulating layer 52 may be disposed to surround the outer surface of the light-emitting element 30. For example, a portion of the material of the second insulating layer 52 may be disposed between the lower surface of the light-emitting element 30 and the first insulating layer 51. In a plan view, the second insulating layer 52 may extend in the second direction D2 between the first electrode branch portion 21B and the second electrode branch portion 22B and have an island shape (e.g., isolated) or linear shape.

The contact electrodes 26 may be disposed on each of the electrodes 21 and 22 and the second insulating layer 52. The contact electrodes 26 may include the first contact electrode 26a disposed on the first electrode 21 and the second contact electrode 26b disposed on the second electrode 22. The first contact electrode 26a and the second contact electrode 26b may be disposed to be spaced apart from each other on the second insulating layer 52. Accordingly, the second insulating layer 52 may insulate the first contact electrode 26a and the second contact electrode 26b from each other.

The first contact electrode 26a may be in contact with at least the first electrode 21 and one end portion of the light-emitting element 30 that may be exposed due to the first insulating layer 51 being patterned. The second contact electrode 26b may be in contact with at least the second electrode 22 and the other end portion of the light-emitting element 30 that may be exposed due to the first insulating layer 51 being patterned. The first and second contact electrodes 26a and 26b may be in contact with side surfaces of both end portions of the light-emitting element 30, e.g., the first semiconductor layer 31, the second semiconductor layer 32, or the electrode material layer 37. As described above, the first insulating layer 51 may have a planar upper surface so that the contact electrodes 26 smoothly come into contact with the side surfaces of the light-emitting element 30.

Each of the contact electrodes 26 may include a conductive material. For example, the contact electrode 26 may include ITO, IZO, ITZO, aluminum (Al), or the like, or a combination thereof. However, embodiments are not limited thereto.

The passivation layer 55 may be formed at an upper portion of the second insulating layer 52 and the contact electrode 26 and serve to protect the members disposed on the via layer 20 from an external environment.

Each of the first insulating layer 51, the second insulating layer 52, and the passivation layer 55, which have been described above, may include an inorganic insulating material or an organic insulating material. In an embodiment, the first insulating layer 51 and the passivation layer 55 may include a material such as silicon oxide ($SiO_x$), silicon nitride ($SiN_x$), silicon oxynitride ($SiO_xN_y$), aluminum oxide ($Al_2O_3$), or aluminum nitride (AlN), or a combination thereof. The second insulating layer 52 may include a photoresist or the like as an organic insulating material. However, embodiments are not limited thereto.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. An inkjet printing device comprising:
   a stage part including a stage;
   an inkjet head part including at least one inkjet head that disposes an ink on the stage, the ink including dipoles and a solvent in which the dipoles are dispersed;
   a heat treatment device that removes the solvent disposed on the stage;
   a first sensing part that measures a position of the ink disposed on the stage;
   a second sensing part that measures a position of the inkjet head; and
   a third sensing part that measures a position of each of the dipoles disposed on the stage.

2. The inkjet printing device of claim 1, wherein
   the inkjet head includes a first inkjet head and a second inkjet head that are spaced apart from each other, and
   the inkjet head part includes at least one head driving part that moves the first inkjet head and the second inkjet head.

3. The inkjet printing device of claim 2, wherein the at least one head driving part includes:
   a first head driving part that moves the inkjet head in a first direction; and
   a second head driving part that moves the inkjet head in a second direction perpendicular to the first direction.

4. The inkjet printing device of claim 3, wherein the third sensing part measures an angle between a direction in which the dipole extends and the first direction.

5. The inkjet printing device of claim 4, wherein the third sensing part measures a number of dipoles which are disposed in a unit area of the stage.

6. The inkjet printing device of claim 2, wherein the first sensing part measures a position of a first ink disposed on the stage from the first inkjet head and a position of a second ink disposed on the stage from the second inkjet head.

7. The inkjet printing device of claim 6, wherein the first sensing part measures a diameter of each of the first ink and the second ink.

8. The inkjet printing device of claim 1, wherein
   the inkjet head part, the third sensing part, and the heat treatment device are arranged in a third direction, and
   the stage part moves in the third direction.

9. The inkjet printing device of claim 8, wherein
   the inkjet heads are spaced apart from each other in a fourth direction that is perpendicular to the third direction,
   the first sensing part includes a first moving part that moves in the fourth direction, and
   the second sensing part includes a second moving part that moves in the fourth direction.

10. The inkjet printing device of claim 9, wherein the third sensing part includes:
    at least one third moving part that moves in the third direction; and at least one fourth moving part moves in the fourth direction.

11. The inkjet printing device of claim 8, wherein the stage part further includes a probe part that generates an electric field on the stage.

12. A dipole aligning method, comprising:
disposing an ink on a target substrate, the ink including dipoles and a solvent in which the dipoles are dispersed;
generating an electric field on the target substrate and disposing the dipoles on the target substrate by the electric field;
removing the solvent; and
measuring a position of each of the dipoles disposed on the target substrate.

13. The method of claim 12, wherein
the ink is disposed from an inkjet head, and
the method further comprises aligning a position of the ink disposed on the target substrate before disposing the ink.

14. The method of claim 13, wherein
the inkjet head includes a first head and a second head, and
the aligning of the position of the disposed ink includes:
measuring a position of each of the ink disposed from the first head and the ink disposed from the second head; and
aligning a position of each of the first head and the second head using the measured positions of the ink.

15. The method of claim 14, wherein
the target substrate includes a first electrode and a second electrode that extend in a first direction, and
the measuring of the position of each of the dipoles includes:
measuring an orientation direction of dipole; and
measuring an angle between the orientation direction of the dipole and the first direction.

16. The method of claim 15, wherein the measuring of the position of each of the dipoles further includes measuring a number of dipoles which are disposed in a unit area of the target substrate.

17. The method of claim 16, further comprising:
setting a reference value for the position of each of the dipoles disposed on the target substrate; and
comparing the angle and the number of dipoles per unit area measured in the measuring of the position of each of the dipoles, with the reference value.

18. A method of manufacturing a display device, the method comprising:
disposing an ink, which includes a light-emitting elements and a solvent in which the light-emitting elements are dispersed, on a target substrate on which a first electrode and a second electrode are formed;
disposing the light-emitting elements on the first electrode and the second electrode;
removing the solvent disposed on the target substrate; and
measuring a position of each of the light-emitting elements disposed on the first electrode and the second electrode.

19. The method of claim 18, wherein
the first electrode and the second electrode extend in a first direction, and
the measuring of the position of each of the light-emitting elements includes measuring an angle between a direction in which a light-emitting element extends and the first direction.

20. The method of claim 19, wherein
the target substrate includes a plurality of pixels,
the first electrode and the second electrode are provided for each of the plurality of pixels, and
the measuring of the position of each of the light-emitting elements includes measuring a number of light-emitting elements disposed in each of the plurality of pixels.

* * * * *